US008883571B2

(12) United States Patent
Morosawa et al.

(10) Patent No.: US 8,883,571 B2
(45) Date of Patent: Nov. 11, 2014

(54) TRANSISTOR, METHOD OF MANUFACTURING THE TRANSISTOR, SEMICONDUCTOR UNIT, METHOD OF MANUFACTURING THE SEMICONDUCTOR UNIT, DISPLAY, AND ELECTRONIC APPARATUS

(71) Applicant: Sony Corporation, Tokyo (JP)

(72) Inventors: Narihiro Morosawa, Kanagawa (JP); Motohiro Toyota, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/770,201

(22) Filed: Feb. 19, 2013

(65) Prior Publication Data

US 2013/0221358 A1 Aug. 29, 2013

(30) Foreign Application Priority Data

Feb. 28, 2012 (JP) .................................. 2012-041561
Mar. 5, 2012 (JP) .................................. 2012-047586

(51) Int. Cl.
 *H01L 21/00* (2006.01)
 *H01L 21/84* (2006.01)
 *H01L 29/786* (2006.01)
 *H01L 27/12* (2006.01)
 *H01L 29/66* (2006.01)

(52) U.S. Cl.
 CPC ...... *H01L 29/66742* (2013.01); *H01L 29/7869* (2013.01); *H01L 29/786* (2013.01); *H01L 27/1255* (2013.01); *H01L 27/1225* (2013.01)
 USPC ........... 438/149; 438/680; 438/700; 438/706; 438/745; 438/514; 257/E21.006; 257/E21.007; 257/E21.149; 257/E21.17; 257/E21.229; 257/E21.267; 257/E21.278; 257/E21.293; 257/E21.303; 257/E21.324; 257/E21.319; 257/E21.411

(58) Field of Classification Search
 USPC ......... 438/149, 700, 680, 514, 706, 745, 235, 438/509, 608, 609, 474, 667, 687, 688; 257/E21.006, E21.077, E21.17, 257/E21.149, E21.229, E21.267, E21.278, 257/E21.293, E21.303, E21.324, E21.319, 257/E21.411

See application file for complete search history.

(56) References Cited

U.S. PATENT DOCUMENTS

| | | | | |
|---|---|---|---|---|
| 6,091,121 A | * | 7/2000 | Oda | 257/408 |
| 6,503,826 B1 | * | 1/2003 | Oda | 438/624 |
| 8,237,165 B2 | * | 8/2012 | Kim et al. | 257/59 |
| 8,426,851 B2 | * | 4/2013 | Morosawa et al. | 257/43 |
| 8,698,134 B2 | * | 4/2014 | Kim et al. | 257/40 |

FOREIGN PATENT DOCUMENTS

| | | |
|---|---|---|
| JP | 2007-220817 | 8/2007 |
| JP | 2011-228622 | 11/2011 |
| JP | 2012-015436 | 1/2012 |

OTHER PUBLICATIONS

Hayashi et al., 42.1: Invited Paper: Improved Amorphous In—Ga—Zn—O TFTs, SID Symposium Digest of Technical Papers, vol. 39, Issue 1, pp. 621-624, May 2008. (4 pages).

Park et al., Self-aligned top-gate amorphous gallium indium zinc oxide thin film transistors, Applied Physics Letters 93, 053501, 2008. (3 pages).

* cited by examiner

*Primary Examiner* — David Nhu
(74) *Attorney, Agent, or Firm* — K&L Gates LLP

(57) ABSTRACT

A method of manufacturing a transistor includes: forming an oxide semiconductor film and a gate electrode on a substrate, the oxide semiconductor film having a channel region, and the gate electrode facing the channel region; and forming an insulating film covering the gate electrode and the oxide semiconductor film. Infiltration of moisture from the insulating film into the oxide semiconductor film is suppressed by the substrate.

11 Claims, 34 Drawing Sheets

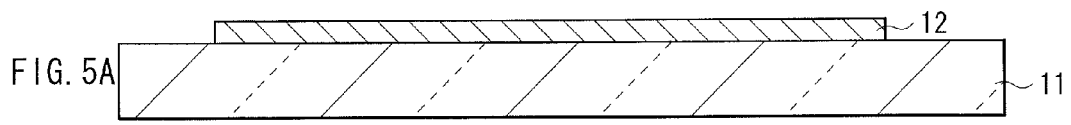
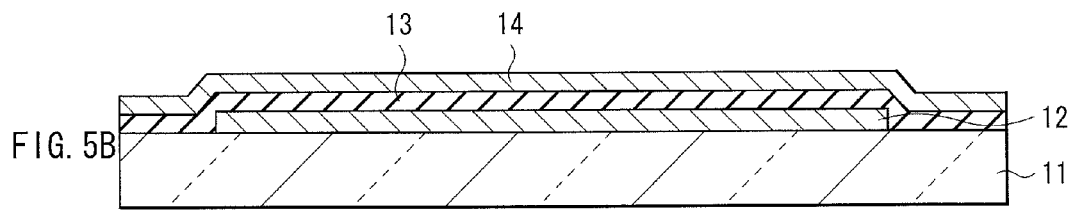
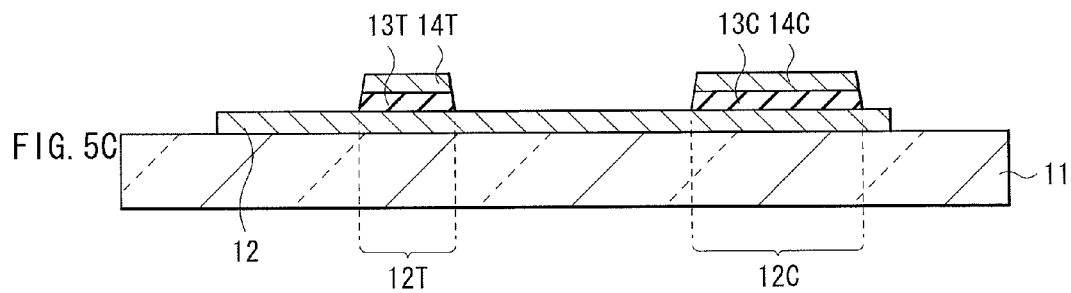
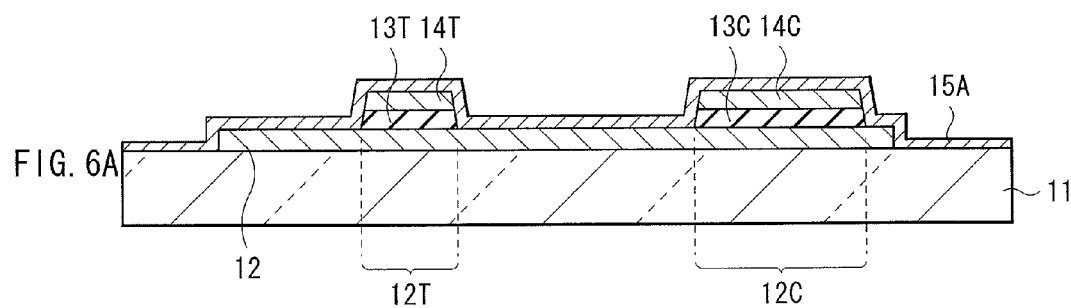
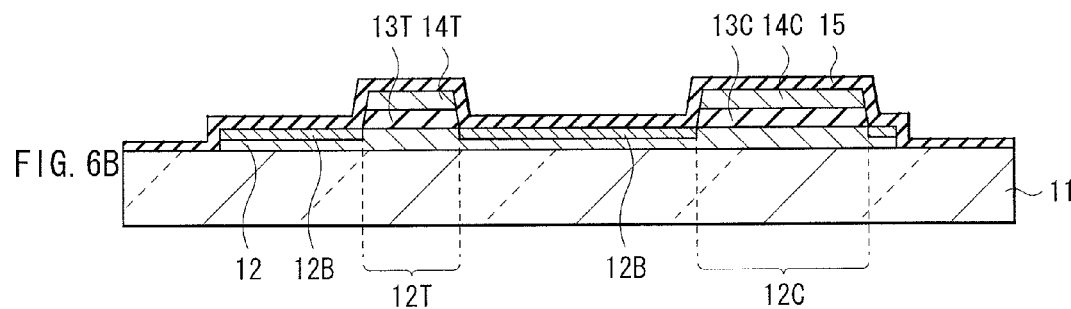

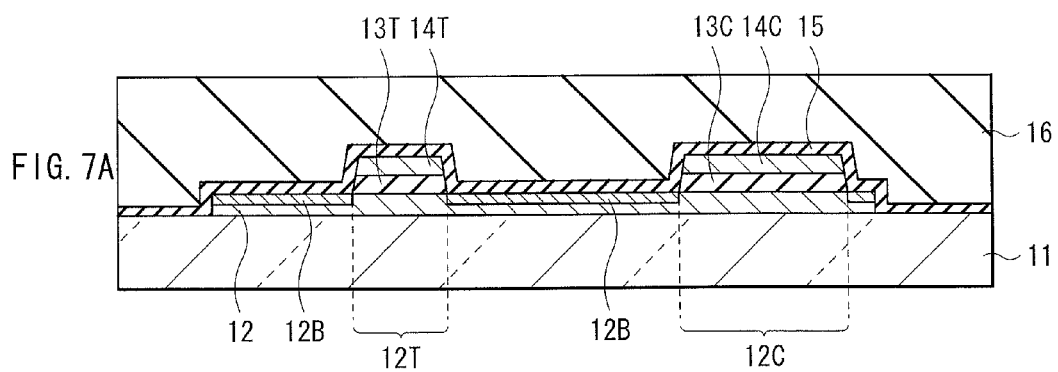
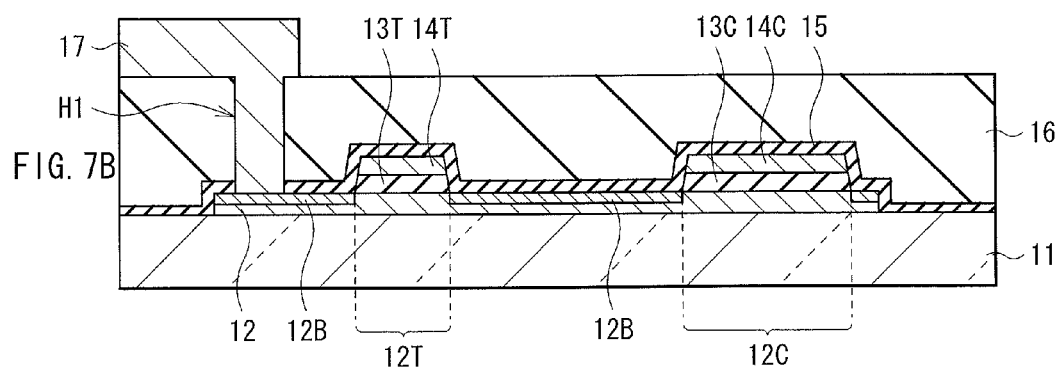
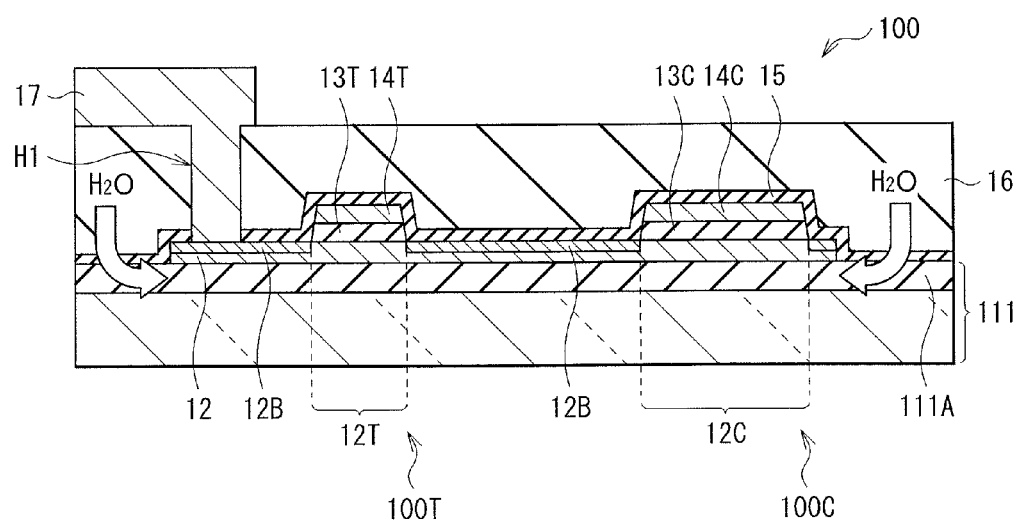
FIG. 8

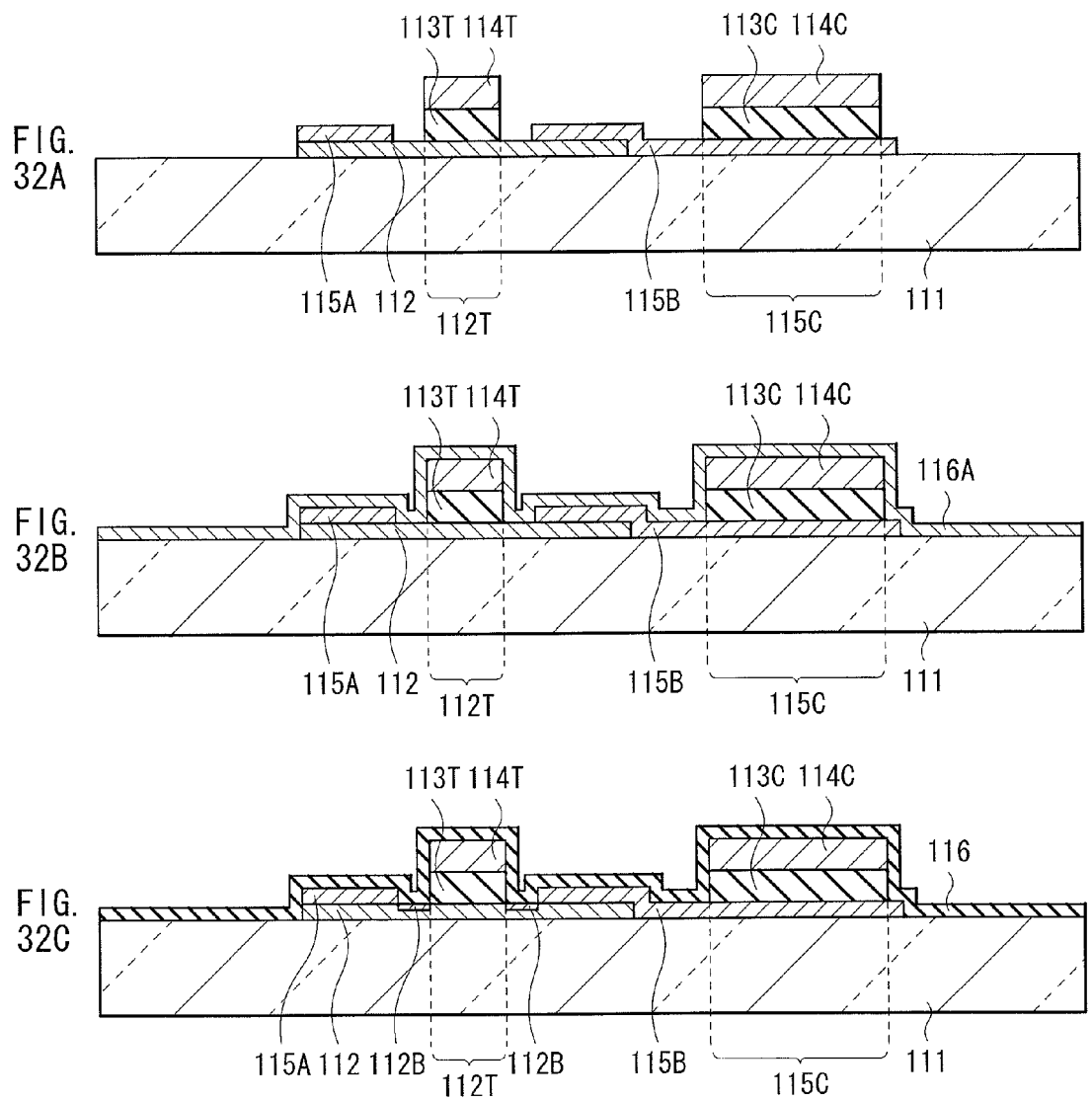

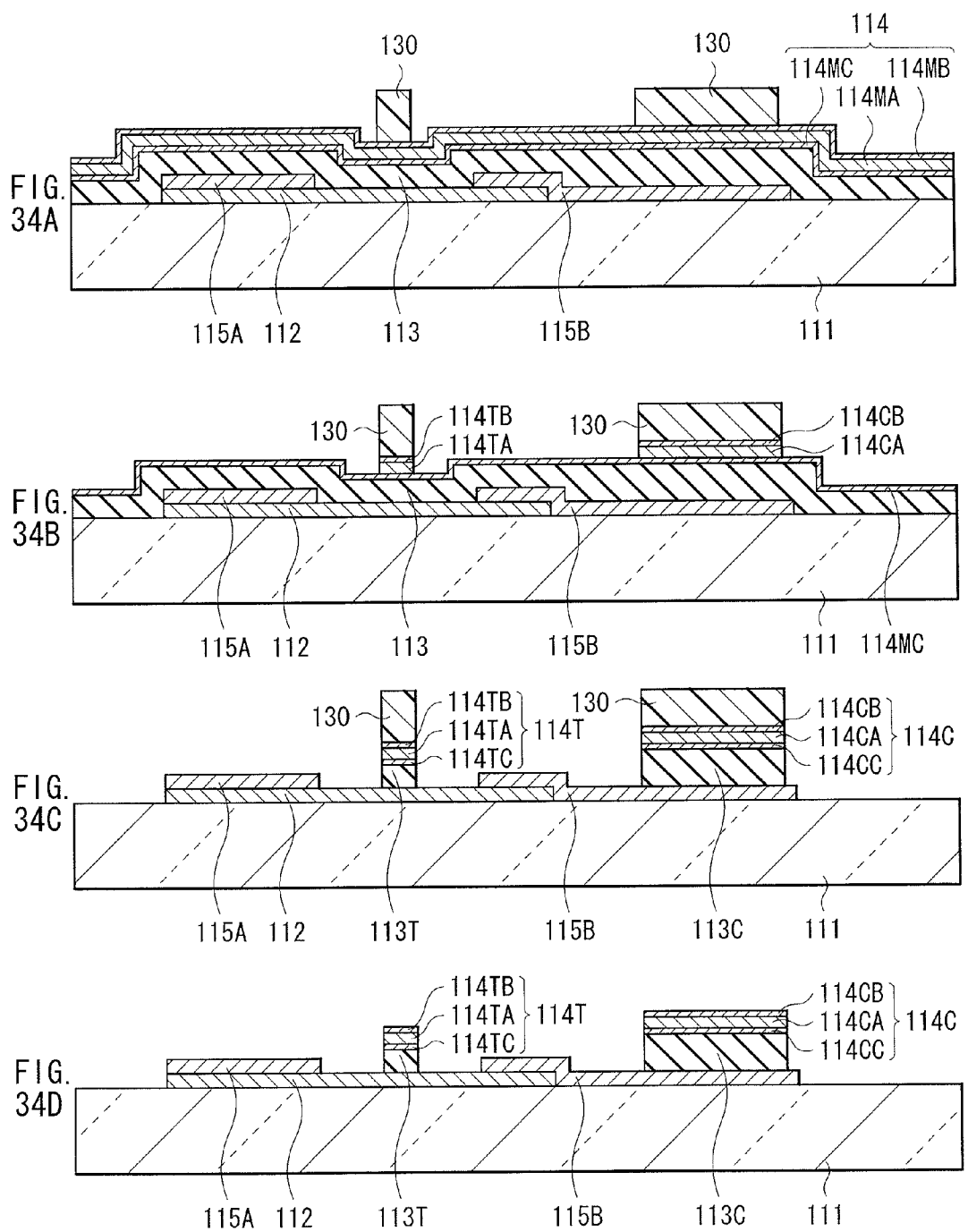

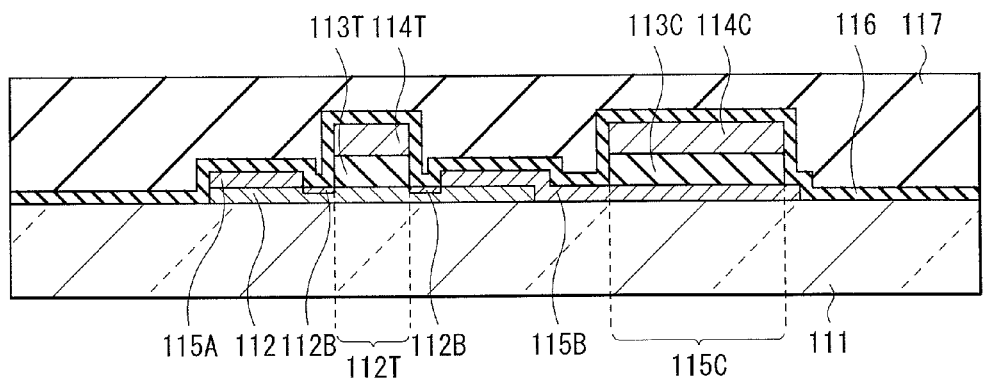
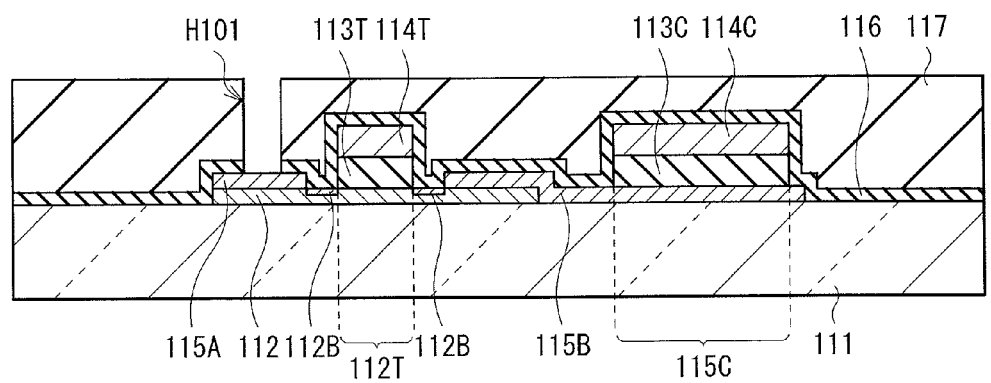
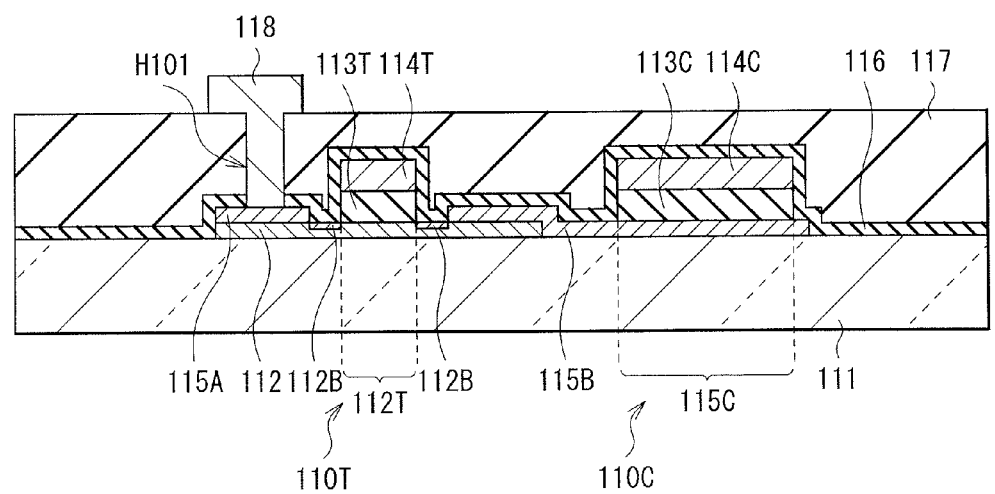

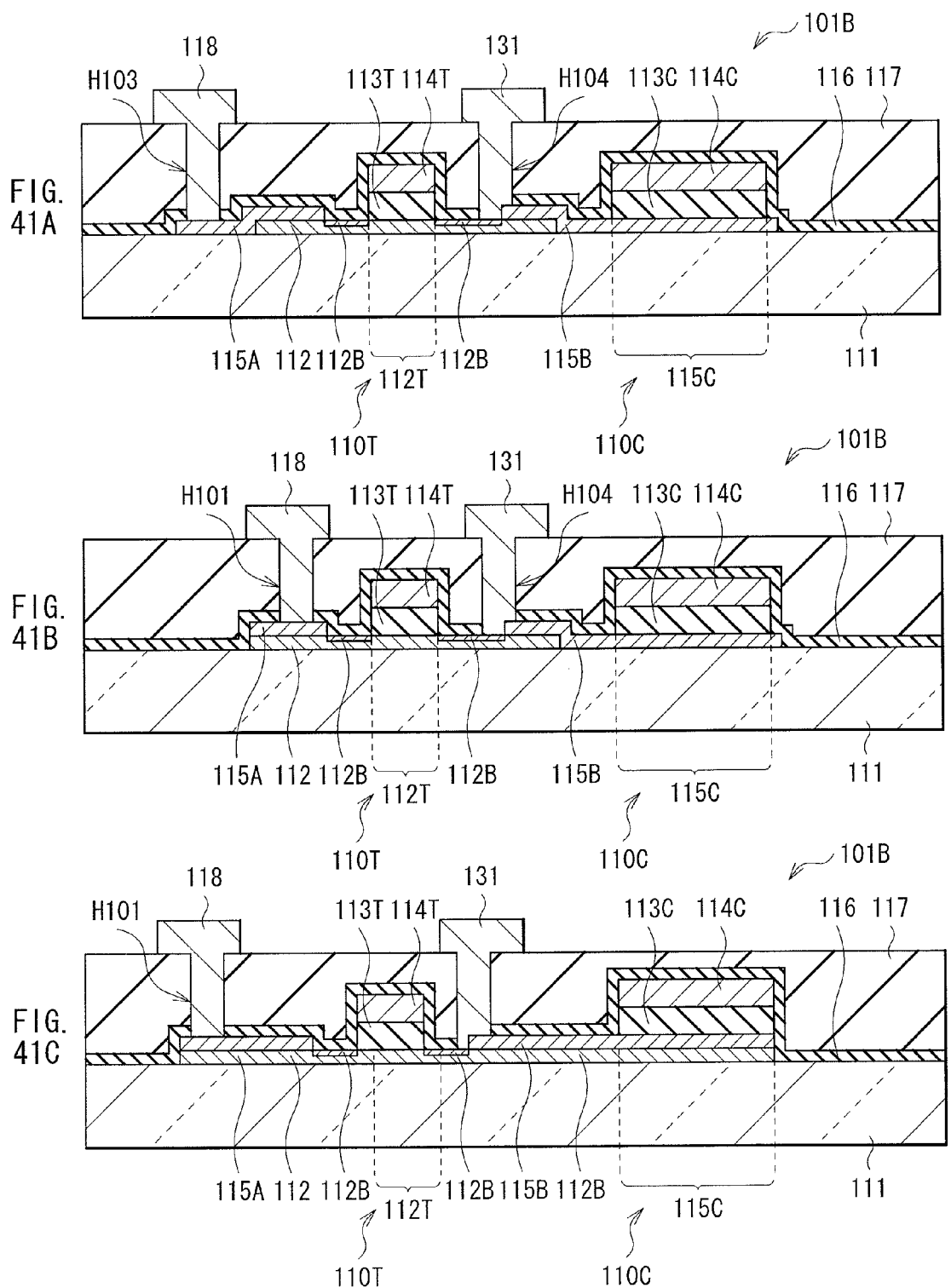

TRANSISTOR, METHOD OF MANUFACTURING THE TRANSISTOR, SEMICONDUCTOR UNIT, METHOD OF MANUFACTURING THE SEMICONDUCTOR UNIT, DISPLAY, AND ELECTRONIC APPARATUS

CROSS REFERENCES TO RELATED APPLICATIONS

The present application claims priority to Japanese Priority Patent Application JP 2012-041561 filed in the Japan Patent Office on Feb. 28, 2012, and 2012-047586 filed in the Japan Patent Office on Mar. 5, 2012, the entire content of which is hereby incorporated by reference.

BACKGROUND

The present application relates to a transistor using an oxide semiconductor, a method of manufacturing the transistor, a semiconductor unit, a method of manufacturing the semiconductor unit, and to a display and an electronic apparatus which are provided with the transistor.

In recent years, along with increase in size and definition of a display, a thin film transistor (TFT) of a drive device is also demanded to have a high mobility, and a TFT using an oxide semiconductor such as oxide of zinc (Zn), indium (In), gallium (Ga), tin (Sn), aluminum (Al), or titanium (Ti), or an oxide of a mixture thereof has been developed. In particular, a TFT using a composite oxide of Zn, In, and Ga has a high electron mobility and exhibits excellent electrical characteristics as compared with a TFT using amorphous silicon (a-Si: H) typically used in a liquid crystal display and the like.

In the above-described active drive liquid crystal display or organic electroluminescence (EL) display, the TFT is used as a drive device, and charge corresponding to a signal voltage for writing image is retained by a retention capacity. However, if a parasitic capacity generated in a cross region between the gate electrode and the source-drain electrode of the TFT is increased, variation of the signal voltage occurs, which may result in deterioration of image quality.

In the organic EL display in particular, there is a possibility that manufacturing yield is lowered in association with the issue in the parasitic capacity. Therefore, some attempts for decreasing the parasitic capacity has been made (for example, Japanese Unexamined Patent Application Publication Nos. 2011-228622, 2012-015436, and 2007-220817, "Self-aligned top-gate amorphous gallium indium zinc oxide thin film transistors", J. Park, et al., Applied Physics Letters, American Institute of Physics, 2008, Vol. 93, 053501, and "Improved Amorphous In—Ga—Zn—O TFTs", R. Hayashi, et al., SID 08 DIGEST, 2008, 42.1, pp. 621-624). In Japanese Unexamined Patent Application Publication Nos. 2011-228622, 2012-015436, and 2007-220817, and "Self-aligned top-gate amorphous gallium indium zinc oxide thin film transistors", J. Park, et al., Applied Physics Letters, American Institute of Physics, 2008, Vol. 93, 053501, there is described a top gate TFT formed by a method in which a gate electrode and a gate insulating film are provided on the same position of a channel region of an oxide semiconductor film in a planar view, and then a region exposed from the gate electrode and the gate insulating film of the oxide semiconductor film is decreased in resistance to form source-drain regions, namely, a so-called self alignment. On the other hand, in "Improved Amorphous In—Ga—Zn—O TFTs", R. Hayashi, et al., SID 08 DIGEST, 2008, 42.1, pp. 621-624, a bottom gate TFT having self alignment structure is disclosed.

SUMMARY

In the above-described transistor using the oxide semiconductor film, desirably, the oxide semiconductor film is prevented from being damaged in manufacturing and the electrical characteristics are accordingly improved.

Further, desirably, diffusion of impurity such as moisture into a channel region is prevented, and the electrical characteristics are further improved.

It is desirable to provide a transistor in which infiltration of moisture into an oxide semiconductor film is suppressed and the electrical characteristics are accordingly improved, and a method of manufacturing the transistor, as well as a display and an electronic apparatus.

It is also desirable to provide a transistor, a semiconductor unit, a display, and an electronic apparatus in which an oxide semiconductor film is protected to improve the electrical characteristics. It is still desirable to provide a method of manufacturing a semiconductor unit in which an oxide semiconductor film is protected to improve the electronic characteristics.

According to an embodiment of the application, there is provided a method of manufacturing a transistor. The method includes: forming an oxide semiconductor film and a gate electrode on a substrate, the oxide semiconductor film having a channel region, and the gate electrode facing the channel region; and forming an insulating film covering the gate electrode and the oxide semiconductor film. Infiltration of moisture from the insulating film into the oxide semiconductor film is suppressed by the substrate.

According to an embodiment of the application, there is provided a first transistor including: an oxide semiconductor film and a gate electrode on a substrate, the oxide semiconductor film having a channel region, and the gate electrode facing the channel region; and an insulating film covering the gate electrode and the oxide semiconductor film. Infiltration of moisture from the insulating film into the oxide semiconductor film is suppressed by the substrate.

According to an embodiment of the application, there is provided a first display provided with a display device and a transistor driving the display device. The transistor includes: an oxide semiconductor film and a gate electrode on a substrate, the oxide semiconductor film having a channel region, and the gate electrode facing the channel region; and an insulating film covering the gate electrode and the oxide semiconductor film. Infiltration of moisture from the insulating film into the oxide semiconductor film is suppressed by the substrate.

According to an embodiment of the application, there is provided a first electronic apparatus with a display. The display is provided with a display device and a transistor driving the display device. The transistor includes: an oxide semiconductor film and a gate electrode on a substrate, the oxide semiconductor film having a channel region, and the gate electrode facing the channel region; and an insulating film covering the gate electrode and the oxide semiconductor film. Infiltration of moisture from the insulating film into the oxide semiconductor film is suppressed by the substrate.

In the first transistor and the method of manufacturing the same according to the embodiments of the application, for example, infiltration of moisture from the insulating film into the oxide semiconductor film through the substrate, which occurs due to heat treatment in manufacturing, is suppressed.

According to an embodiment of the application, there is provided a second transistor including: a gate electrode; an oxide semiconductor film having a channel region that faces the gate electrode; an etching protection film, at least a part of the etching protection film being in contact with the oxide semiconductor film; an oxide film covering the gate electrode and the etching protection film, the oxide film being in contact with the oxide semiconductor film between the gate electrode and the etching protection film; and source-drain electrodes electrically connected to the etching protection film through a through-hole of the oxide film.

According to an embodiment of the application, there is provided a semiconductor unit including: a gate electrode; an oxide semiconductor film having a channel region that faces the gate electrode; an etching protection film, at least a part of the etching protection film being in contact with the oxide semiconductor film; an oxide film covering the gate electrode and the etching protection film, the oxide film being in contact with the oxide semiconductor film between the gate electrode and the etching protection film; and source-drain electrodes electrically connected to the etching protection film through a through-hole of the oxide film.

According to an embodiment of the application, there is provided a second display provided with a display device and a transistor driving the display device. The transistor includes: a gate electrode; an oxide semiconductor film having a channel region that faces the gate electrode; an etching protection film, at least a part of the etching protection film being in contact with the oxide semiconductor film; an oxide film covering the gate electrode and the etching protection film, the oxide film being in contact with the oxide semiconductor film between the gate electrode and the etching protection film; and source-drain electrodes electrically connected to the etching protection film through a through-hole of the oxide film.

According to an embodiment of the application, there is provided a second electronic apparatus with a display. The display is provided with a display device and a transistor driving the display device. The transistor includes: a gate electrode; an oxide semiconductor film having a channel region that faces the gate electrode; an etching protection film, at least a part of the etching protection film being in contact with the oxide semiconductor film; an oxide film covering the gate electrode and the etching protection film, the oxide film being in contact with the oxide semiconductor film between the gate electrode and the etching protection film; and source-drain electrodes electrically connected to the etching protection film through a through-hole of the oxide film.

In the second transistor, the semiconductor unit, the second display, and the second electronic apparatus according to the embodiments of the application, the source-drain electrodes and the oxide semiconductor film are electrically connected to each other through the etching protection film. When the through-hole is provided in the oxide film, the oxide semiconductor film is protected by the etching protection film.

According to an embodiment of the application, there is provided a method of manufacturing a semiconductor unit. The method includes forming a transistor. The forming the transistor includes: forming an oxide semiconductor film having a channel region; forming an etching protection film in contact with the oxide semiconductor film; forming a gate electrode facing the channel region of the oxide semiconductor film; forming an oxide film covering the gate electrode and the etching protection film, the oxide film being in contact with the oxide semiconductor film between the gate electrode and the etching protection film; and providing a through-hole in the oxide film and electrically connecting source-drain electrodes to the etching protection film through the through-hole.

In the method of manufacturing the semiconductor unit according to the embodiment of the application, the oxide semiconductor film is protected by the etching protection film in manufacturing, in particular, at the time of providing the through-hole in the oxide film.

In the first transistor, the method of manufacturing the same, the first display, and the first electronic apparatus according to the embodiments of the application, an insulating film and an oxide semiconductor film are provided on a substrate suppressing infiltration of moisture. Therefore, permeation of moisture from the insulating film into the oxide semiconductor film through the substrate is prevented. Consequently, high electrical characteristics are obtainable.

In the second transistor, the semiconductor unit and the method of manufacturing the same, as well as the second display and the second electronic apparatus according to the embodiments of the application, an etching protection film is provided between an oxide semiconductor film and an oxide film. Therefore, the oxide semiconductor film is prevented from being damaged in manufacturing. Consequently, the electronic characteristics are improved.

It is to be understood that both the foregoing general description and the following detailed description are exemplary, and are intended to provide further explanation of the application as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the application.

FIGS. 5A to 5C are sectional diagrams illustrating a method of manufacturing the display illustrated in FIG. 1 in a process order.

FIGS. 6A and 6B are sectional diagrams illustrating processes following the process of FIG. 5C.

FIGS. 7A and 7B are sectional diagrams illustrating processes following the process of FIG. 6B.

FIG. 8 is a sectional diagram illustrating a structure of a main part of a display according to a comparative example 1.

FIG. 17 is a plan view illustrating a schematic configuration of a module including the display of any of the above-described embodiments and the like.

FIGS. 18A and 18B are perspective views each illustrating an appearance of an application example 1 of the display of any of the above-described embodiments and the like.

FIGS. 32A to 32C are sectional diagrams illustrating processes following the process of FIG. 31C.

FIGS. 34A to 34D are sectional diagrams illustrating another method of manufacturing the gate electrode illustrated in FIG. 26B in a process order.

FIGS. 35A to 35C are sectional diagrams illustrating processes following the process of FIG. 32C.

FIGS. 41A to 41C are sectional diagrams each illustrating a structure of a display according to a modification 4.

DETAILED DESCRIPTION

Figure 1:
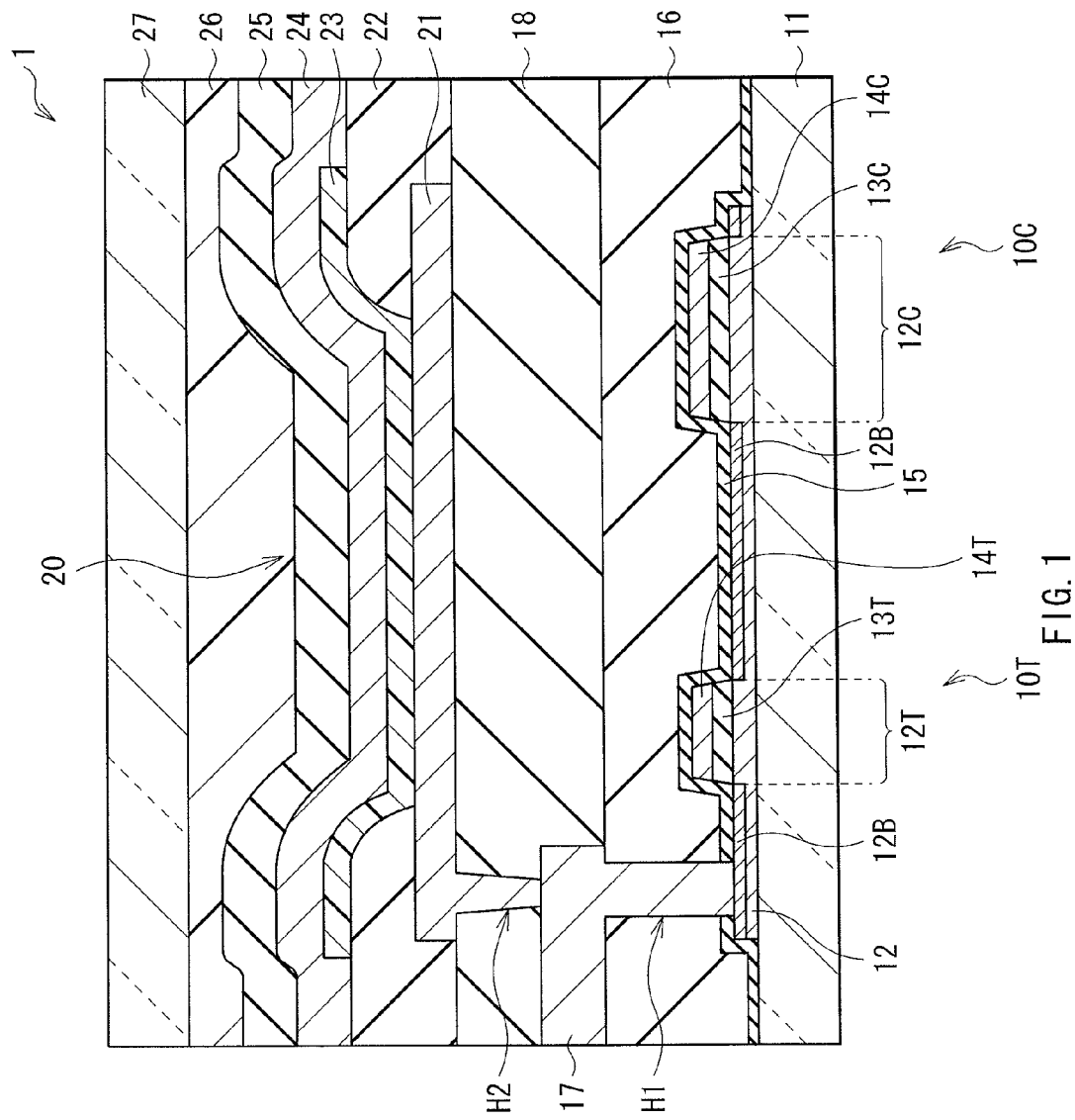
FIG. 1 is a sectional diagram illustrating a structure of a display according to a first embodiment of the application.

Hereinafter, preferred embodiments of the application will be described in detail with reference to drawings. Note that descriptions will be given in the following order.
1. First Embodiment (an example of an organic EL display in which a substrate is formed of only a plate-like member)
2. Modification 1 (an example of a liquid crystal display)
3. Modification 2 (an example of an electronic paper)
4. Second Embodiment (an example in which a substrate having a diffusion preventing film)
5. Third Embodiment (an organic EL display: an example in which a channel protection film is provided between an oxide semiconductor film and an oxide film)
6. Modification 3 (an example in which a side surface of an oxide semiconductor film and a side surface of a channel protection film are aligned)
7. Modification 4 (an example in which a wiring connecting an oxide semiconductor film and one of electrodes of a retention capacitor is provided)
8. Fourth Embodiment (a liquid crystal display)
9. Fifth Embodiment (an electronic paper)
10. Application Examples First Embodiment FIG. 1 illustrates a cross-sectional structure of a display (a display 1) according to a first embodiment of the application. The display 1 is an active matrix organic electroluminescence (EL) display, and includes a plurality of transistors 10T and a plurality of organic EL devices 20 driven by the respective transistors 10T. FIG. 1 illustrates a region (a sub-pixel) corresponding to one of the transistors 10T and one of the organic EL devices 20.

The display 1 includes a retention capacitor 10C sharing an oxide semiconductor film 12 with the transistor 10T, and the organic EL device 20 is provided on the transistor 10T and the retention capacitor 10C with a planarizing layer 18 in between. The transistor 10T is a staggered structure (top gate type) TFT including a substrate 11, the oxide semiconductor film 12, a gate insulating film 13T, and a gate electrode 14T in this order. The oxide semiconductor film 12 and the gate electrode 14T are covered with an interlayer insulating film 16 (an insulating film). A source-drain electrode 17 is electrically connected to the oxide semiconductor film 12 through a contact hole H1 of the interlayer insulating film 16.

[Transistor 10T]

The substrate 11 is formed of, for example, a plate-like member such as quartz, glass, silicon, and a plastic film. In this case, since the oxide semiconductor film 12 is in contact with the substrate 11, a material with relatively low moisture permeability such as glass is used for the substrate 11.

In the display 1, the transistor 10T (the oxide semiconductor film 12) is provided so as to be in contact with the substrate 11. Therefore, moisture diffusion from the interlayer insulating film 16 to the oxide semiconductor film 12 of the transistor 10T is allowed to be suppressed.

The oxide semiconductor film 12 is provided in a selective region on the substrate 11, and has a function as an active layer of the transistor 10T. The oxide semiconductor film 12 contains an oxide of one or more elements of indium (In), gallium (Ga), zinc (Zn), and tin (Sn), as a main component. Specifically, examples of amorphous oxide semiconductor include indium tin zinc oxide (ITZO) and indium gallium zinc oxide (IGZO, InGaZnO). Examples of crystalline oxide semiconductor include zinc oxide (ZnO), indium zinc oxide (IZO (registered trademark)), indium gallium oxide (IGO), indium tin oxide (ITO), and indium oxide (InO). The oxide semiconductor film 12 has a thickness (a thickness in a stack direction, hereinafter simply referred to as a thickness) of, for example, about 50 nm.

The oxide semiconductor film 12 has a channel region 12T facing the gate electrode 14T in an upper layer, and has a pair of low resistance regions 12B (source-drain regions) that is adjacent to the channel region 12T and has an electric resistivity lower than that of the channel region 12T. Each of the low resistance regions 12B is provided in a part of the thickness direction from the surface (the top surface) of the oxide semiconductor film 12, and for example, is formed by allowing a metal such as aluminum (Al) to react with an oxide semiconductor material and diffusing the metal (dopant). The source-drain electrode 17 is electrically connected to the low resistance region 12B, for example. A self alignment structure of the transistor 10T is realized by the low resistance regions 12B. In addition, the low resistance regions 12B have a function of stabilizing the characteristics of the transistor 10T.

The gate electrode 14T is provided on the channel region 12T with the gate insulating film 13T in between. The gate electrode 14T and the gate insulating film 13T have the same shape in a planar view. The gate insulating film 13T has a thickness of, for example, about 300 nm, and is formed of a single-layer film made of one of a silicon oxide film (SiO), a silicon nitride film (SiN), a silicon oxynitride film (SiON), and an aluminum oxide film (AlO), or a stacked film made of two or more thereof. A material that is less likely to reduce the oxide semiconductor film 12, for example, a silicon oxide film or an aluminum oxide film is preferably used for the gate insulating film 13T.

The gate electrode 14T controls carrier density in the oxide semiconductor film 12 (the channel region 12T) with use of a gate voltage (Vg) applied to the transistor 10T, and has a function as a wiring supplying potential. The gate electrode 14T is formed of a simple substance of one of, for example, molybdenum (Mo), titanium (Ti), aluminum (Al), silver (Ag), neodymium (Nd), and copper (Cu), or an alloy thereof. The gate electrode 14T may have a stacked structure using a plurality of simple substances or a plurality of alloys. The gate electrode 14T is preferably formed of a low-resistance metal such as aluminum and copper. The gate electrode 14T may be configured by stacking a layer (a barrier layer) formed of titanium or molybdenum on a layer (a low resistance layer) formed of a low resistance metal, or may be configured by using an alloy containing a low resistance metal, for example, an allow of aluminum and neodymium (Al—Nd). The gate electrode 14T may be formed of a transparent conductive film such as ITO. The gate electrode 14T has a thickness of, for example, 10 nm to 500 nm both inclusive.

A high resistance film 15 is provided between the gate electrode 14T and the interlayer insulating film 16 and between the oxide semiconductor film 12 (the low resistance region 12B) and the interlayer insulating film 16. The high resistance film 15 also covers the retention capacitor 10C. A metal film that is a supply source of a metal to be diffused into the low resistance regions 12B of the oxide semiconductor film 12 in manufacturing process described later is remained as an oxide film, and the oxide film is the high resistance film 15. The high resistance film 15 has a thickness of, for example, 20 nm or less, and is formed of titanium oxide, aluminum oxide, indium oxide, tin oxide, or the like. Such a high resistance film 15 has a function of reducing influence of oxygen and moisture that causes change of the electrical characteristics of the oxide semiconductor film 12 in the transistor 10T, namely, a barrier function, in addition to the above-described role in process. Therefore, providing the high resistance film 15 stabilizes the electrical characteristics of the transistor 10T and the retention capacitor 10C, and enhances effects of the interlayer insulating film 16.

The interlayer insulating film 16 is provided on the high resistance film 15, and similarly to the high resistance film 15, extends to the outside of the oxide semiconductor film 12 to cover the oxide semiconductor film 12, together with the gate electrode 14T. The interlayer insulating film 16 is formed of, for example, an organic material such as acrylic resin, polyimide, and siloxane, or an inorganic material such as a silicon oxide film, a silicon nitride film, a silicon oxynitride film, and aluminum oxide. Such an organic material and such an inorganic material may be stacked. The interlayer insulating film 16 containing the organic material is allowed to be increased in thickness easily to about 2 μm), for example. The interlayer insulating film 16 increased in thickness in this way sufficiently covers level difference between the gate insulating film 13T and the gate electrode 14T and the like, to ensure insulating property. In addition, the interlayer insulating film 16 containing the organic material reduces wiring capacity formed of a metal wiring to increase the size and the frame rate of the display 1. Accordingly, in the transistor 10T having the self alignment structure, the interlayer insulating film 16 containing an organic insulating material is preferably used.

The source-drain electrode 17 is patterned and provided on the interlayer insulating film 16, and is connected to, for example, the low resistance region 12B of the oxide semiconductor film 12 through the contact hole H1 that penetrates the interlayer insulating film 16 and the high resistance film 15. The source-drain electrode 17 is desirably provided so as to avoid a region right above the gate electrode 14T, in order to prevent a parasitic capacity from being formed in a cross region between the gate electrode 14T and the source-drain electrode 17. The source-drain electrode 17 has a thickness of, for example, about 500 nm, and is formed of the metal described for the gate electrode 14T or a material similar to that of the transparent conductive film. The source-drain electrode 17 is also preferably formed of a low resistance metal material such as aluminum and copper, and more preferably, is formed of a stacked film of the low resistance layer and the barrier layer. This is because configuring the source-drain electrode 17 using such a stacked film enables drive with a little wiring delay.

[Retention Capacitor 10C]

Figure 2A:
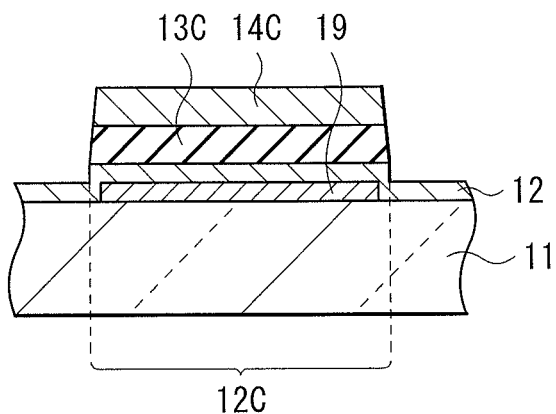
FIGS. 2A and 2B are diagrams each illustrating a modification of a retention capacitor illustrated in FIG. 1.
Figure 2B:
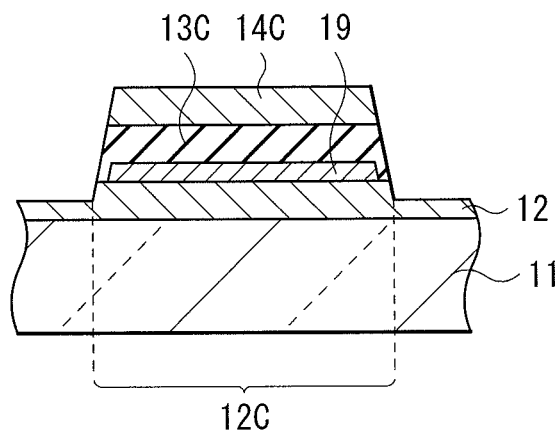

The retention capacitor 10C is a capacitor provided, together with the transistor 10T, on the substrate 11, and holding charge in a pixel circuit 50A described later, for example. The retention capacitor 10C has the oxide semiconductor film 12 that is shared with the transistor 10T, a capacity insulating film 13C, and a capacity electrode 14C in this order from the substrate 11 side. The high resistance film 15 and the interlayer insulating film 16 are provided in this order on the retention capacitor 10C. In the oxide semiconductor film 12, a region (a capacity region 12C) facing the capacity electrode 14C is not provided with the low resistance region 12B similarly to the channel region 12T, and has a constant electric resistance in a thickness direction. In other words, the low resistance regions 12B are provided in the oxide semiconductor film 12 except for in the channel region 12T and the capacity region 12C. In the capacity region 12C, a conductive film (a conductive film 19) formed of, for example, a metal material may be provided between the substrate 11 and the oxide semiconductor film 12 (FIG. 2A) or between the oxide semiconductor film 12 and the capacity insulating film 13C (FIG. 2B). Accordingly, application voltage dependency of a capacitance value is allowed to be eliminated, and sufficient capacity is ensured and display characteristics are maintained irrespective of the magnitude of the gate voltage. Configuring the capacity insulating film 13C using an inorganic insulating material allows a retention capacitor 10C with higher capacity to be obtained. For example, the capacity insulating film 13C is formed in the same process as that of the gate insulating film 13T, and is formed of the same material with the same thickness as those of the gate insulating film 13T. In addition, for example, the capacity electrode 14C is formed in the same process as that of the gate electrode 14T, and is formed of the same material with the same thickness as those of the gate electrode 14T. The capacity insulating film 13C and the gate insulating film 13T may be formed in the different processes, and may be formed of different materials with different thicknesses. The capacity electrode 14C and the gate electrode 14T may be formed in different processes, and may be formed of different materials with different thicknesses.

The organic EL device 20 is provided on the planarizing layer 18. The organic EL device 20 has a first electrode 21, a pixel separation film 22, an organic layer 23, and a second electrode 24 in this order from the planarizing layer 18 side, and is sealed by a protection layer 25. A sealing substrate 27 is bonded to the protection layer 25 with an adhesive layer 26 that is formed of a thermosetting resin or an ultraviolet curable resin in between. The display 1 may be of a bottom emission type (a bottom surface emission type) extracting light generated in the organic layer 23 from the substrate 11 side, or may be of a top emission type (a top surface emission type) extracting the light from the sealing substrate 27 side.

The planarizing layer 18 is provided over the entire display region (a display region 50 in FIG. 3 described later) of the substrate 11 on the source-drain electrode 17 and the interlayer insulating film 16, and has a contact hole H2. The contact hole H2 is intended to connect the source-drain electrode 17 of the transistor 10T to the first electrode 21 of the organic EL device 20. The planarizing layer 18 is formed of, for example, polyimide or an acrylic resin.

The first electrode 21 is provided on the planarizing layer 18 so as to fill the contact hole H2. The first electrode 21 functions as an anode, for example, and is provided for each device. When the display 1 is of the bottom emission type, the first electrode 21 is formed of a transparent conductive film, for example, a single-layer film formed of one of indium tin oxide (ITO) and indium zinc oxide (IZO, InZnO) or a stacked-layer film formed of both thereof. On the other hand, when the display 1 is of the top emission type, the first electrode 21 is formed of a reflective metal, for example, a simple metal of one or more of aluminum, magnesium (Mg), calcium (Ca), and sodium (Na), a single-layer film formed of an alloy containing one or more thereof, or a multi-layer film formed of stacked simple metals or stacked alloys.

The pixel separation film 22 is intended to ensure insulating property between the first electrode 21 and the second electrode 24 as well as define and separate an emission region of each device, and has an opening facing the emission region of each device. The pixel separation film 22 is formed of, for example, a photosensitive resin such as polyimide, acrylic resin, and novolak resin.

The organic layer 23 is provided so as to cover the opening of the pixel separation film 22. The organic layer 23 includes an organic electroluminescence layer (an organic EL layer), and emits light in response to application of a drive current. The organic layer 23 has a hole injection layer, a hole transport layer, the organic EL layer, and an electron transport layer in this order from the substrate 11 (the first electrode 21) side, and emits light by recombination of electrons and holes in the organic EL layer. The material of the organic EL layer is a typical organic material of low molecular or high molecular, and is not particularly limited. For example, organic EL layers emitting red, green, and blue are selectively coated by different colors for each device, or an organic EL layer emitting white light (for example, a layer obtained by stacking the organic EL layers of red, green, and blue) may be provided over the entire surface of the substrate 11. The hole injection layer enhances hole injection efficiency and prevents leakage. The hole transport layer enhances hole transport efficiency to the organic EL layer. The layers other than the organic EL layer, such as the hole injection layer, the hole transport layer, and the electron transport layer may be provided as necessary.

The second electrode 24 functions as, for example, a cathode, and is formed of a metal conductive film. When the display 1 is of the bottom emission type, the second electrode 24 is formed of a reflective metal, for example, a simple metal of one or more of aluminum, magnesium (Mg), calcium (Ca), and sodium (Na), a single-layer film formed of an alloy containing one or more thereof, or a multi-layer film formed of stacked simple metals or stacked alloys. On the other hand, the display 1 is of the top emission type, the second electrode 24 is formed of a transparent conductive film made of ITO, IZO, or the like. The second electrode 24 is provided, for example, in common to the devices in a state insulated from the first electrode 21.

The protection layer 25 may be formed of an insulating material or a conductive material. Examples of the insulating material include amorphous silicon (a-Si), amorphous silicon carbide (a-SiC), amorphous silicon nitride (a-$Si_{(1-X)}N_X$), and amorphous carbon (a-C).

The sealing substrate 27 is provided so as to face the substrate 11 with the transistor 10T, the retention capacitor 10C, and the organic EL device 20 in between. The sealing substrate 27 may be formed of a material similar to that of the substrate 1. When the display 1 is of the top emission type, a transparent material is used for the sealing substrate 27, and a color filter or a light shielding film may be provided on the sealing substrate 27 side. When the display 1 is of the bottom emission type, the substrate 11 is formed of a transparent material, and for example, a color filter or a light shielding film is provided on the substrate 11 side.

[Configuration of Peripheral Circuits and Pixel Circuit]

Figure 3:
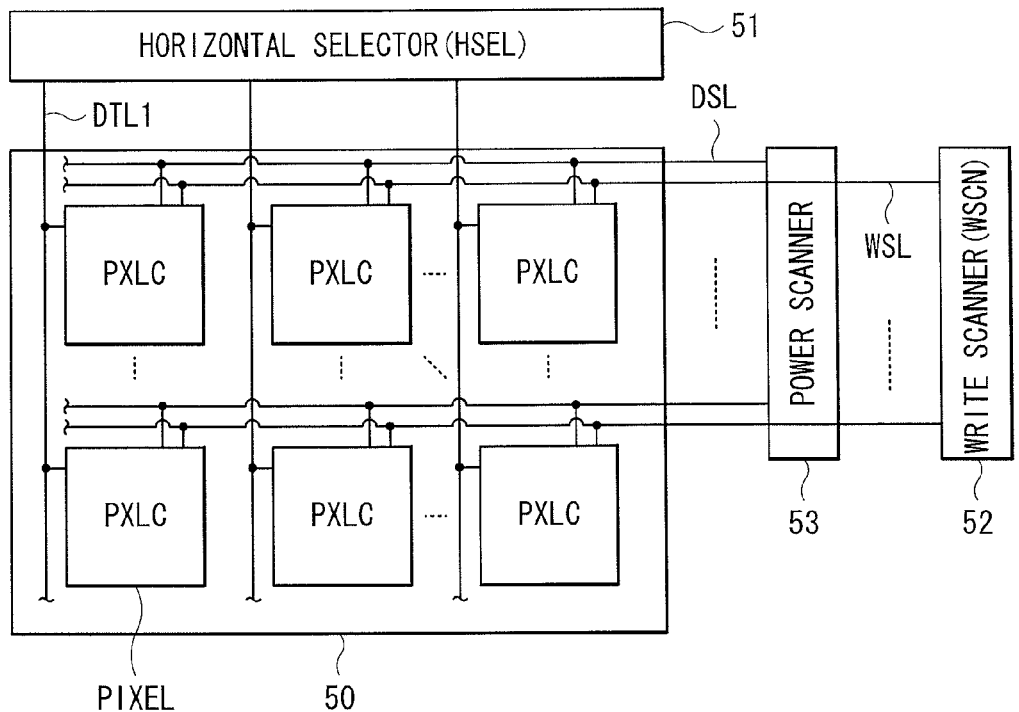
FIG. 3 is a diagram illustrating an overall configuration including peripheral circuits of the display illustrated in FIG. 1.

As illustrated in FIG. 3, the display 1 has a plurality of pixels PXLC each including such an organic EL device 20, and the pixels PXLC are arranged, for example, in a matrix in the display region 50 on the substrate 11. A horizontal selector (HSEL) 51 as a signal line drive circuit, a write scanner (WSCN) 52 as a scan line drive circuit, and a power scanner 53 as a power line drive circuit are provided in the periphery of the display region 50.

In the display region 50, a plurality of (the integer n-number of) signal lines DTL1 to DTLn is arranged in a column direction, and a plurality of (the integer m-number of) scan lines WSL1 to WSLm is arranged in a row direction. Each of the pixels PXLC (one of the pixels corresponding to R, G, and B) is provided at an intersection of each of the signal lines DTL and each of the scan lines WSL. Each of the signal lines DTL is electrically connected to the horizontal selector 51, and an image signal is supplied from the horizontal selector 51 to each of the pixels PXLC through each of the signal lines DTL. On the other hand, each of the scan lines WSL is electrically connected to the write scanner 52, and a scan signal (a selection pulse) is supplied from the write scanner 52 to each of the pixels PXLC through each of the scan lines WSL. Each of power lines DSL is connected to the power scanner 53, and a power signal (a control pulse) is supplied from the power scanner 53 to each of the pixels PXLC through each of the power lines DSL.

Figure 4:
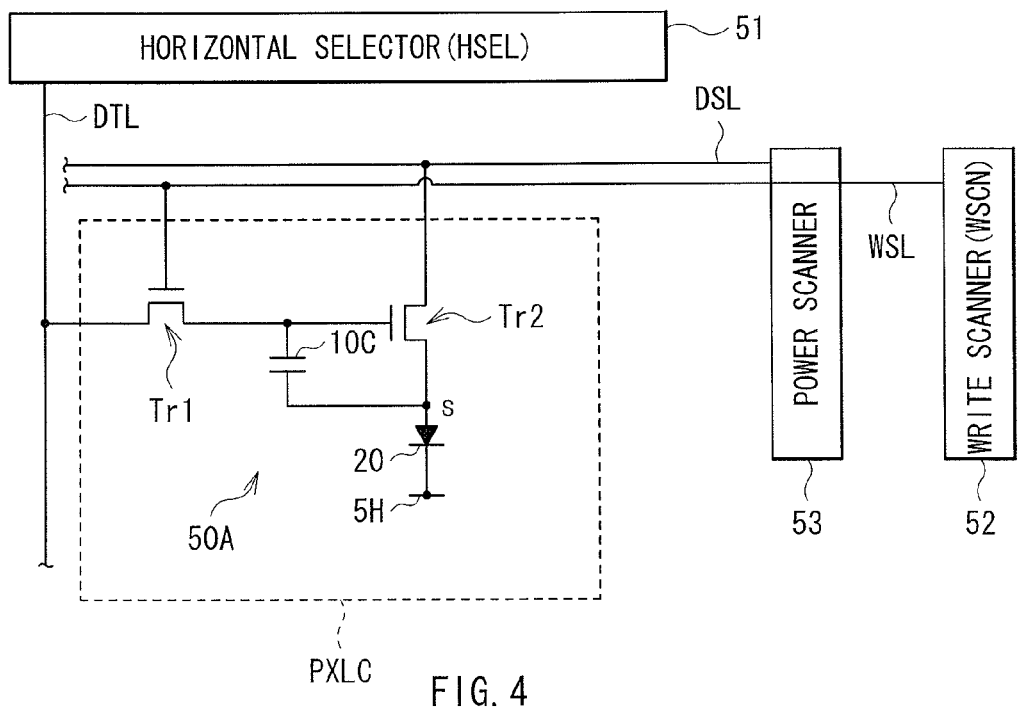
FIG. 4 is a diagram illustrating a circuit configuration of a pixel illustrated in FIG. 3.

FIG. 4 illustrates a specific example of a circuit configuration in the pixel PXLC. Each of the pixels PXLC has the pixel circuit 50A including the organic EL device 20. The pixel circuit 50A is an active drive circuit including a sampling transistor Tr1, a drive transistor Tr2, the retention capacitor 10C, and the organic EL device 20. One or both of the sampling transistor Tr1 and the drive transistor Tr2 correspond to the transistor 10T of the first embodiment.

A gate of the sampling transistor Tr1 is connected to a corresponding scan line WSL. One of a source and a drain of the sampling transistor Tr1 is connected to a corresponding signal line DTL, and the other is connected to a gate of the drive transistor Tr2. A drain of the drive transistor Tr2 is connected to a corresponding power line DSL, and a source thereof is connected to an anode of the organic EL device 20. In addition, a cathode of the organic EL device 20 is connected to a ground wiring 5H. Incidentally, the ground wiring 5H is wired commonly to all of the pixels PXLC. The retention capacitor 10C is disposed between the source and the gate of the drive transistor Tr2.

The sampling transistor Tr1 becomes conductive in response to the scan signal (the selection pulse) supplied from the scan line WSL to sample a signal potential of an image signal supplied from the signal line DTL, thereby retaining the sampled signal potential in the retention capacitor 10C. The drive transistor Tr2 is supplied with a current from the power line DSL set at predetermined first potential (not illustrated), and supplies a drive current to the organic EL device 20 based on the signal potential retained in the retention capacitor 10C. The organic EL device 20 emits light with luminance corresponding to the signal potential of the image signal, by the drive current supplied from the drive transistor Tr2.

In such a circuit configuration, the sampling transistor Tr1 becomes conductive in response to the scan signal (the selection pulse) supplied from the scan line WSL to sample the signal potential of the image signal supplied from the signal line DTL, thereby retaining the sampled signal potential in the retention capacitor 10C. Moreover, the current is supplied from the power line DSL set at the above-described first potential to the drive transistor Tr2, and the drive current is supplied to the organic EL device 20 (each of the organic EL devices of red, green, and blue) based on the signal potential retained in the retention capacitor 10C. Then, each of the organic EL devices 20 emits light with luminance corresponding to the signal potential of the image signal by the supplied drive current. As a result, image display based on the image signal is performed on the display 1.

The display 1 is allowed to be manufactured in the following way, for example.

[Process of Forming Transistor 10T and Retention Capacitor 10C]

First, as illustrated in FIG. 5A, the oxide semiconductor film 12 made of the above-described material is formed to be in contact with the substrate 11 made of a plate-like member. Specifically, an oxide semiconductor material film (not illustrated) with a thickness of about 50 nm is formed over the entire surface of the substrate 11 by, for example, sputtering. At this time, ceramic having the same composition as that of an oxide semiconductor to be formed is used as a target. In addition, since carrier density in the oxide semiconductor depends on oxygen partial pressure at the time of sputtering, the oxygen partial pressure is controlled to provide desired transistor characteristics. When the oxide semiconductor film 12 is formed of a crystalline material such as ZnO, IZO, and IGO, etching selectivity is easily improved in the etching process of the gate insulating film 13T (or the capacity insulating film 13C) described later. Subsequently, the formed oxide semiconductor material film is patterned into a desired shape by, for example, photolithography and etching. At this time, the process is desirably performed by wet etching with use of a liquid mixture of phosphoric acid, nitric acid, and acetic acid. The liquid mixture of phosphoric acid, nitric acid, and acetic acid sufficiently increases a selective ratio to the base, and thus process is relatively easily performed.

Subsequently, as illustrated in FIG. 5B, the insulating film 13 that is made of a silicon oxide film or an aluminum oxide film and has a thickness of, for example, 200 nm, and the conductive film 14 that is made of a metal material such as molybdenum, titanium, and aluminum and has a thickness of, for example, 500 nm are formed in this order over the entire surface of the substrate 11. The insulating film 13 may be formed by, for example, plasma chemical vapor deposition (CVD). The insulating film 13 made of a silicon oxide film may be formed by reactive sputtering, besides the plasma CVD. In addition, when the insulating film 13 is made of an aluminum oxide film, atomic layer deposition may be used, besides the reactive sputtering and the CVD. The conductive film 14 may be formed of, for example, sputtering.

After formation of the conductive film 14, the conductive film 14 is patterned by, for example, photolithography and etching to form the gate electrode 14T and the capacity electrode 14C in selective regions on the oxide semiconductor film 12. Then, the insulating film 13 is etched with use of the formed gate electrode 14T and the formed capacity electrode 14C as a mask. As a result, the gate insulating film 13T and the capacity insulating film 13C are patterned into substantially the same shape as that of the gate electrode 14T and that of the capacity electrode 14C, respectively, in a planar view (FIG. 5C). When the oxide semiconductor film 12 is made of the above-described crystalline material, the insulating film 13 is easily processed while the extremely-large etching selective ratio is maintained, by using a chemical solution such as hydrofluoric acid in the etching process. The capacity insulating film 13C and the capacity electrode 14C of the retention capacitor 10C may be formed with use of a material different from that of the insulating film 13 and that of the conductive film 14 after formation of the gate electrode 14T and the gate insulating film 13T.

Subsequently, as illustrated in FIG. 6A, the metal film 15A that is made of, for example, titanium, aluminum, tin, or indium and has a thickness of, for example, 5 nm or more and 10 nm or less is formed over the entire surface of the substrate 11 by, for example, sputtering. The metal film 15A is formed of a metal that reacts with oxygen at relatively low temperature so as to be in contact with a part of the oxide semiconductor film 12 other than a part formed with the gate electrode 14T and the capacity electrode 14C.

Then, as illustrated in FIG. 6B, heat treatment (first heat treatment) is carried out at a temperature of, for example, about 200° C. to oxidize the metal film 15A, and therefore the high resistance film 15 made of a metal oxide film is formed. At this time, in the region other than the channel region 12T and the capacity region 12C of the oxide semiconductor film 12, the low resistance regions 12B (including the source-drain regions) are formed in parts on the high resistance film 15 side in the thickness direction. Since part of oxygen contained in the oxide semiconductor film 12 is used in oxidation reaction of the metal film 15A, the oxygen concentration is lowered from a side of the surface (the top surface), which is in contact with the metal film 15A, of the oxide semiconductor film 12 along with progress of oxidation of the metal film 15A. On the other hand, a metal such as aluminum is diffused from the metal film 15A into the oxide semiconductor film 12. The metal elements function as dopant, and the region of the oxide semiconductor film 12 that is located on the top surface side and is in contact with the metal film 15A is decreased in resistance. Consequently, the low resistance regions 12B each having electric resistance lower than that of the channel region 12T and that of the capacity region 12C are formed.

As the heat treatment of the metal film 15A, annealing at the temperature of about 200° C. is preferable as described above. At that time, annealing is performed under oxidized gas atmosphere containing oxygen and the like so that excess lowering of the oxygen concentration of the low resistance regions 12B is suppressed, and sufficient amount of oxygen is supplied to the oxide semiconductor film 12. Consequently, it is possible to eliminate the annealing performed in the subsequent process to simplify the sequence.

The high resistance film 15 may be formed by setting the temperature of the substrate 11, at the time of forming the metal film 15A on the substrate 11, at relatively high, instead of the above-described annealing. For example, in the process of FIG. 6A, when the metal film 15A is formed while the temperature of the substrate 11 is maintained at about 200° C., a predetermined region of the oxide semiconductor film 12 is allowed to be decreased in resistance without carrying out the heat treatment. In this case, the carrier density of the oxide semiconductor film 12 is allowed to be reduced to a level necessary for a transistor.

The metal film 15A is preferably formed to have a thickness of 10 nm or less as described above. This is because when the thickness of the metal film 15A is equal to or less than 10 nm, the metal film 15A is sufficiently oxidized (the high resistance film 15 is formed) by heat treatment. If oxidation of the metal film 15A is insufficient, a process of removing unoxidized regions of the metal film 15A by etching is necessary. This is because if the insufficiently oxidized region of the metal film 15A is remained on the gate electrode 14T, the capacity electrode 14C, and the like, a leakage current may occur. When the metal film 15A is sufficiently oxidized and the high resistance film 15 is formed, such a removing process is unnecessary, and simplification of the manufacturing process becomes possible. In other words, occurrence of the leakage current is prevented without performing the removing process by etching. Note that when the metal film 15A is formed to have a thickness of 10 nm or less, the thickness of the high resistance film 15 that has been subjected to the heat treatment is about 20 nm or less.

As a method of oxidizing the metal film 15A, methods such as oxidation in water-vapor atmosphere and plasma oxidation may be used in addition to the above-described heat treatment. In particular, using the plasma oxidation provides the following advantage. The interlayer insulating film 16 is formed by plasma CVD (FIG. 7A described later) after formation of the high resistance layer 15. At this time, the insulating film 16 may be formed subsequently (continuously) after the metal film 15A is subjected to the plasma oxidation treatment. Therefore, advantageously, addition of the process is unnecessary. The plasma oxidation is desirably performed by setting the temperature of the substrate 11 to about 200° C. to about 400° C. both inclusive and generating plasma in a gas atmosphere containing oxygen such as gas mixture of oxygen and dinitrogen oxide. By such a process, the high resistance film 15 having a function of reducing influence of oxygen and moisture is allowed to be formed.

Moreover, as a method of reducing the resistance of the predetermined region of the oxide semiconductor film 12, a method in which the resistance is decreased by plasma treatment, a method in which a silicon nitride film is formed by the plasma CVD and the resistance is decreased by hydrogen diffusion from the silicon nitride film or the like, may be used in addition to the above-described method using reaction between the metal film 15A and the oxide semiconductor film 12.

As illustrated in FIG. 7A, after formation of the high resistance film 15, the interlayer insulating film 16 is formed over the entire surface of the high resistance film 15. When the interlayer insulating film 16 contains an inorganic insulating material, for example, the plasma CVD, sputtering, or the atomic layer deposition may be used. When the interlayer insulating film 16 contains an organic insulating material, for example, coating such as spin coating and slit coating may be used. The thick interlayer insulating film 16 may be easily formed by coating. Subsequently, exposure and development are performed to form the contact hole H1 in a predetermined position of the interlayer insulating film 16. When a photosensitive resin is used for the interlayer insulating film 16, the exposure and the development are performed using the photosensitive resin so that the contact hole H1 is allowed to be formed in the predetermined position.

Subsequently, a conductive film (not illustrated) that is to be the source-drain electrode 17 and is made of the above-described material or the like is formed on the interlayer insulating film 16 by, for example, sputtering, and the contact hole H1 is filled with the conductive film. After that, the conductive film is patterned into a predetermined shape by, for example, photolithography and etching. As a result, the source-drain electrode 17 is formed on the interlayer insulating film 16, and the source-drain electrode 17 is electrically connected to the low resistance region 12B of the oxide semiconductor film 12 through the contact hole H1 (FIG. 7B). Consequently, the transistor 10T and the retention capacitor 10C are formed on the substrate 11.

[Annealing Process of Transistor 10T and Retention Capacitor 10C]

After formation of the transistor 10T and the retention capacitor 10C, annealing (second heat treatment) is carried out. In the first embodiment, since the substrate 11 suppresses infiltration of moisture from the interlayer insulating film 16 into the oxide semiconductor film 12, the electrical characteristics of the transistor 10T is improved in this process. The description thereof will be given below.

FIG. 8 illustrates a cross-sectional structure of a transistor 100T and a retention capacitor 100C of a display (a display 100) according to a comparative example 1. A substrate 111 of the transistor 100T includes an insulating film 111A formed of, for example, a silicon oxide film, a silicon nitride film, or a silicon oxynitride film on a surface of a plate-like member formed of, for example, glass or a resin material. The oxide semiconductor film 12 is in contact with the insulating film 111A. The insulating film 111A is formed by the plasma CVD.

Figure 9A:
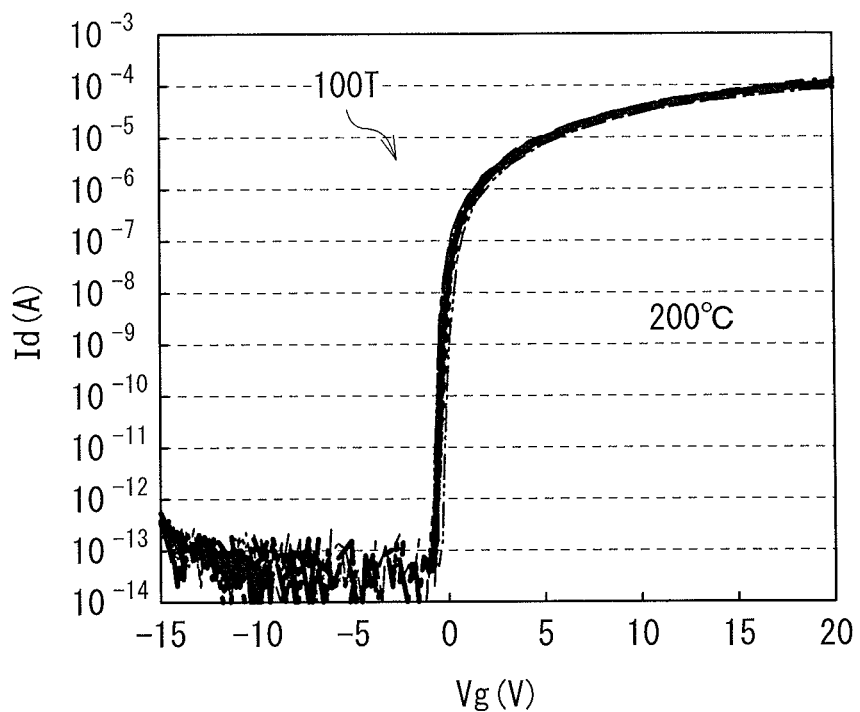
FIGS. 9A and 9B are diagrams illustrating transfer characteristics of a transistor illustrated in FIG. 8.
Figure 9B:
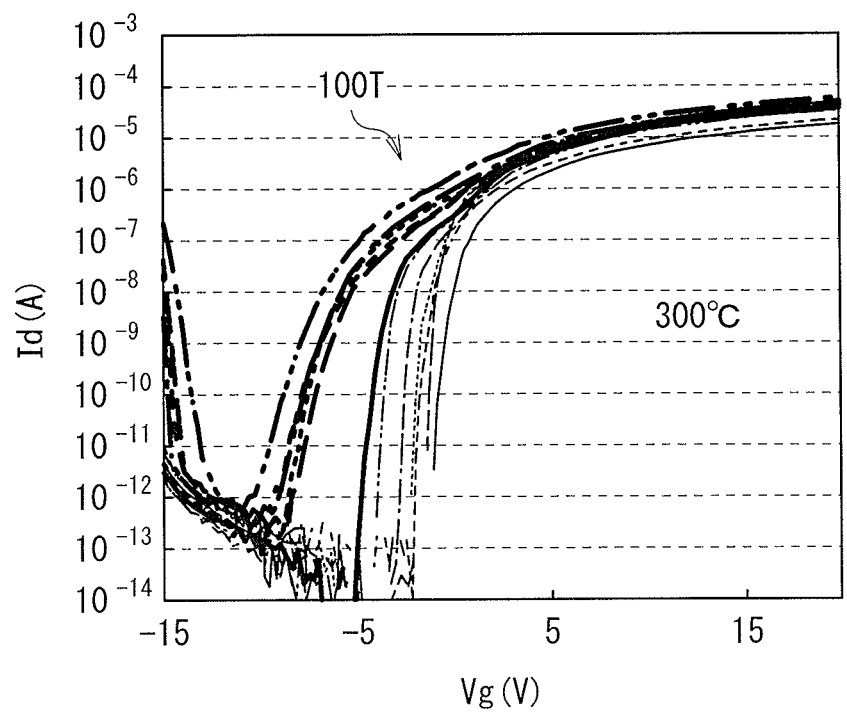

Transfer characteristics measured after annealing of such a transistor 100T in an oxygen atmosphere are illustrated in FIGS. 9A and 9B. FIGS. 9A and 9B illustrate the result of the annealing at the temperature of 200° C. and 300° C., respectively. The results are obtained from measurement performed for twelve points in plane of the substrate 111 at the drain voltage of 10 V. The vertical axis indicates a drain current (Id), and the horizontal axis indicates the gate voltage (Vg). The transistor 100T used for the measurement had a channel length of 4 μm and a channel width of 10 μm. A silicon oxide film that had a thickness of 300 nm and was formed by the plasma CVD was used for the insulating film 111A.

From the results, it is found that the in-plane TFT characteristics after annealing at 300° C. are varied (FIG. 9B) and has a tendency to change in a minus direction while the in-plane TFT characteristics after annealing at 200° C. are uniform (FIG. 9A). It is conceivable that the insulating film 111A formed by the plasma CVD has a high moisture permeability, and annealing at the relatively high temperature of 300° C. causes diffusion of moisture contained in the interlayer insulating film 16 from the outside of the oxide semiconductor film 12 into the oxide semiconductor film 12 through the insulating film 111A (FIG. 8). The moisture diffused into the oxide semiconductor film 12 causes reduction reaction to lower the TFT characteristics. In particular, the interlayer insulating film 16 formed of an organic insulating material is preferably used for the transistor 100T with a self alignment structure. However, an organic insulating material possibly contains more moisture than the inorganic insulating material.

Moreover, since material gas used for the plasma CVD contains hydrogen, the insulating film 111A formed by the plasma CVD contains a large amount of hydrogen. When the hydrogen diffuses from the insulating film 111A into the oxide semiconductor film 12, hydrogen acts as a donor and possibly increases the charier density of the channel region 12C to lower the TFT characteristics.

Figure 10:
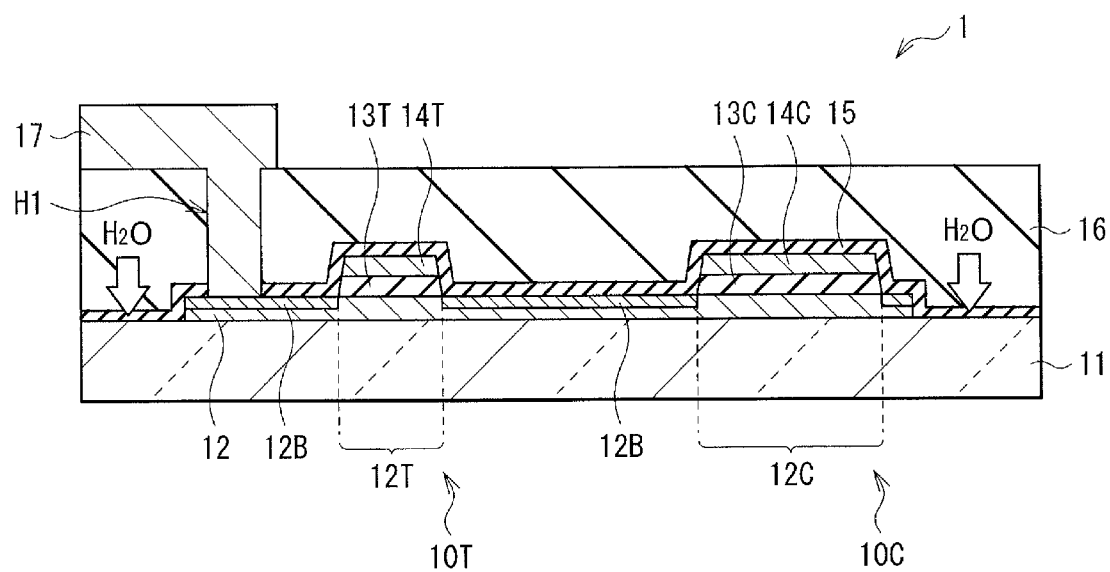
FIG. 10 is a sectional diagram for explaining effects of a substrate illustrated in FIG. 1.

In contrast, in the transistor 10T of the first embodiment, the oxide semiconductor film 12 is in contact with the substrate 11 formed of only a plate-like member such as glass having a low permeability. In other words, the substrate 11 does not include an insulating film formed by the plasma CVD. Therefore, the moisture of the interlayer insulating film 16 is blocked by the substrate 11 to prevent moisture from diffusing into the oxide semiconductor film 12 (FIG. 10).

Figure 11A:
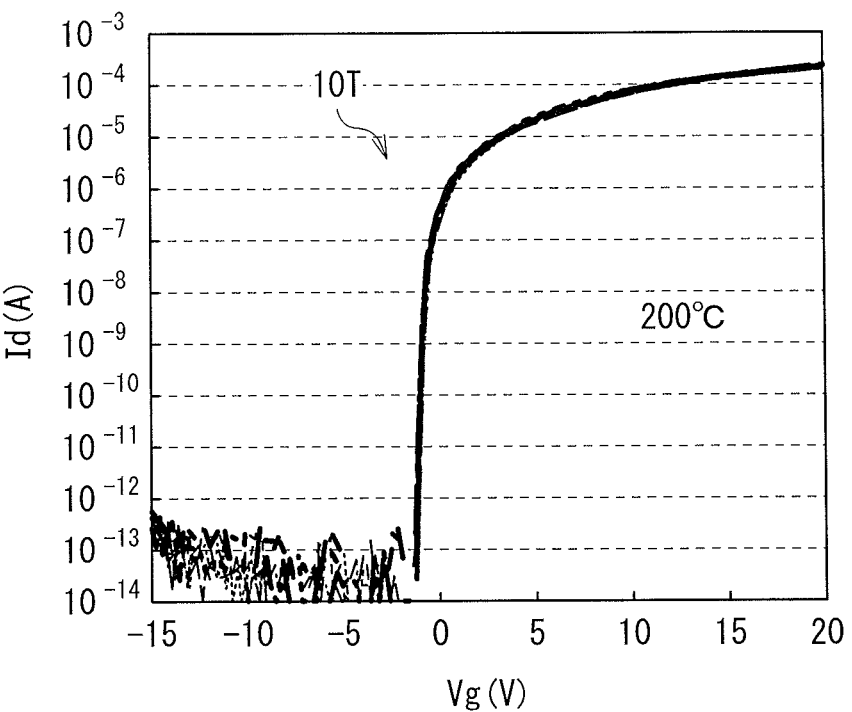
FIGS. 11A and 11B are diagrams illustrating transfer characteristics of a transistor illustrated in FIG. 1.
Figure 11B:
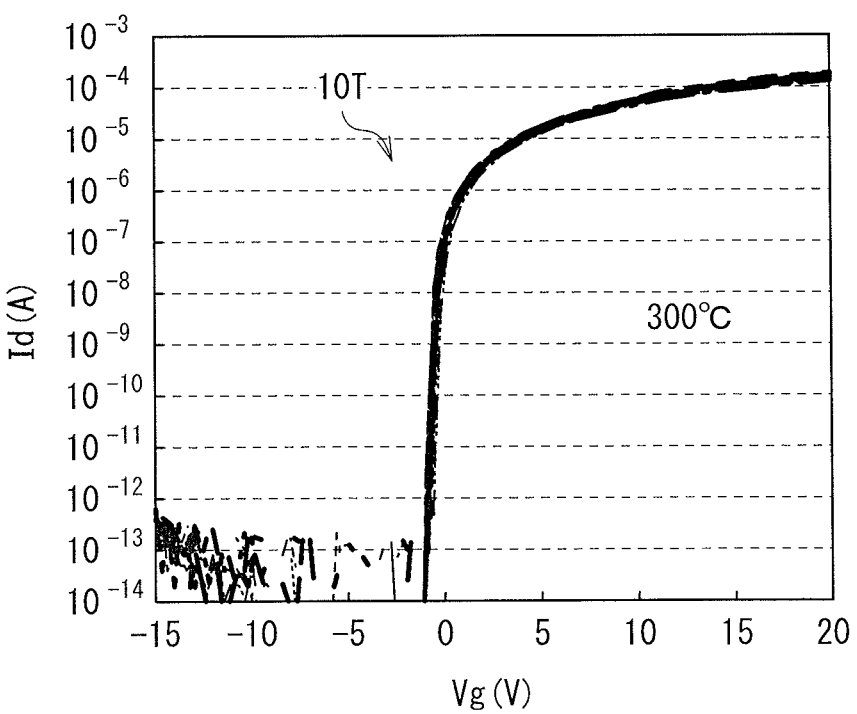

FIGS. 11A and 11B illustrate transfer characteristics of the transistor 10T measured under the condition similar to that of the transistor 100T. FIGS. 11A and 11B illustrate results of the annealing at the temperature of 200° C. and 300° C., respectively. From the results, it is found that, in the transistor 10T, the in-plane TFT characteristics are maintained uniform also after the annealing process at 300° C.

Figure 12:
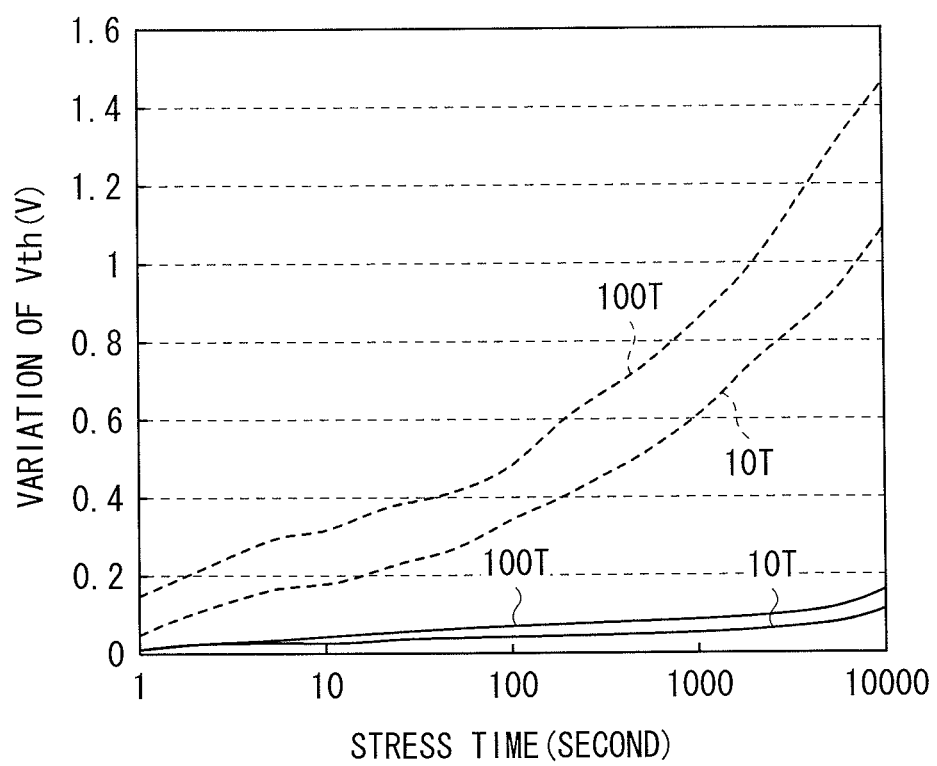
FIG. 12 is a diagram illustrating a result of a stress test of the transistor illustrated in FIG. 1.

In FIGS. 9A and 9B and FIGS. 11A and 11B, the transfer characteristics after annealing at the temperature of 200° C. and 300° C. are measured. The temperature of the annealing influences reliability of the transistor 10T. The description thereof is given below. FIG. 12 illustrates results of a stress test of the transistors 10T and 100T. The vertical axis indicates variation of a threshold voltage (Vth), and the horizontal axis indicates a stress time. The transistors 10T and 100T were annealed at the temperature of 200° C. or 300° C. in oxygen atmosphere, and then measurement was performed at a stress temperature of 50° C. and the bias voltage of the gate voltage 15 V. The dashed line indicates the case of annealing at 200° C., and the solid line indicates the case of annealing at 300° C. From the results, it is found that variation of Vth is reduced by annealing of the transistors 10T and 100T at higher temperature (300° C.). Therefore, in the transistor 10T, the in-plane TFT characteristics are maintained uniform, and higher reliability is obtained by annealing at a higher temperature. In addition, since the insulating film is unnecessary to be formed on the substrate 11, manufacturing process is allowed to be simplified.

[Process of Forming Planarizing Layer 18]

After annealing of the transistor 10T and the retention capacitor 10C, the planarizing layer 18 made of the above-described material is formed by, for example, spin coating or slit coating so as to cover the interlayer insulating film 16 and the source-drain electrode 17, and then the contact hole H2 is formed in a part of a region facing the source-drain electrode 17 of the planarizing layer 18.

[Process of Forming Organic EL device 20]

Subsequently, the organic EL device 20 is formed on the planarizing layer 18. Specifically, the first electrode 21 made of the above-described material is formed by, for example, sputtering so as to fill the contact hole H2 on the planarizing layer 18. Then, patterning is performed by photolithography and etching. After that, after formation of the pixel separation film 22 having an opening on the first electrode 21, the organic layer 23 is formed by, for example, vacuum deposition. Subsequently, the second electrode 24 made of the above-described material is formed on the organic layer 23 by, for example, sputtering. Then, after the protection layer 25 is formed on the second electrode 24 by, for example, CVD, the sealing substrate 27 is bonded to the protection layer 25 with use of the adhesive layer 26. As a result, the display 1 illustrated in FIG. 1 is completed.

In the display 1, for example, when each of the pixels PXLC corresponding to any of R, G, and B is supplied with a drive current corresponding to an image signal of each color, electrons and holes are injected into the organic layer 23 through the first electrode 21 and the second electrode 24. These electrons and holes are recombined in the organic EL layer included in the organic layer 23 to emit light. In this way, in the display 1, a full color image of, for example, R, G, and B is displayed. In addition, when potential corresponding to the image signal is applied to one end of the retention capacitor 10C at the time of image display operation, charge corresponding to the image signal is accumulated in the retention capacitor 10C.

In this case, since the substrate 11 is configured of only a plate-like member, diffusion of moisture from the interlayer insulating film 16 into the oxide semiconductor film 12 is suppressed.

As described above, in the first embodiment, since the substrate 11 suppresses diffusion of moisture from the interlayer insulating film 16 into the oxide semiconductor film 12, the electrical characteristics of the transistor 10T are allowed to be improved.

Moreover, even if the transistor 10T is annealed at higher temperature, the in-plane TFT characteristics of the substrate 11 is maintained uniform. Accordingly, it is possible to reduce variation of the threshold voltage to improve reliability of the transistor 10T.

Hereinafter, although modifications of the first embodiment and other embodiments will be described, like numerals are used, in the following description, to designate substantially like components of the first embodiment, and the description thereof will be appropriately omitted.

[Modification 1]

Figure 13:
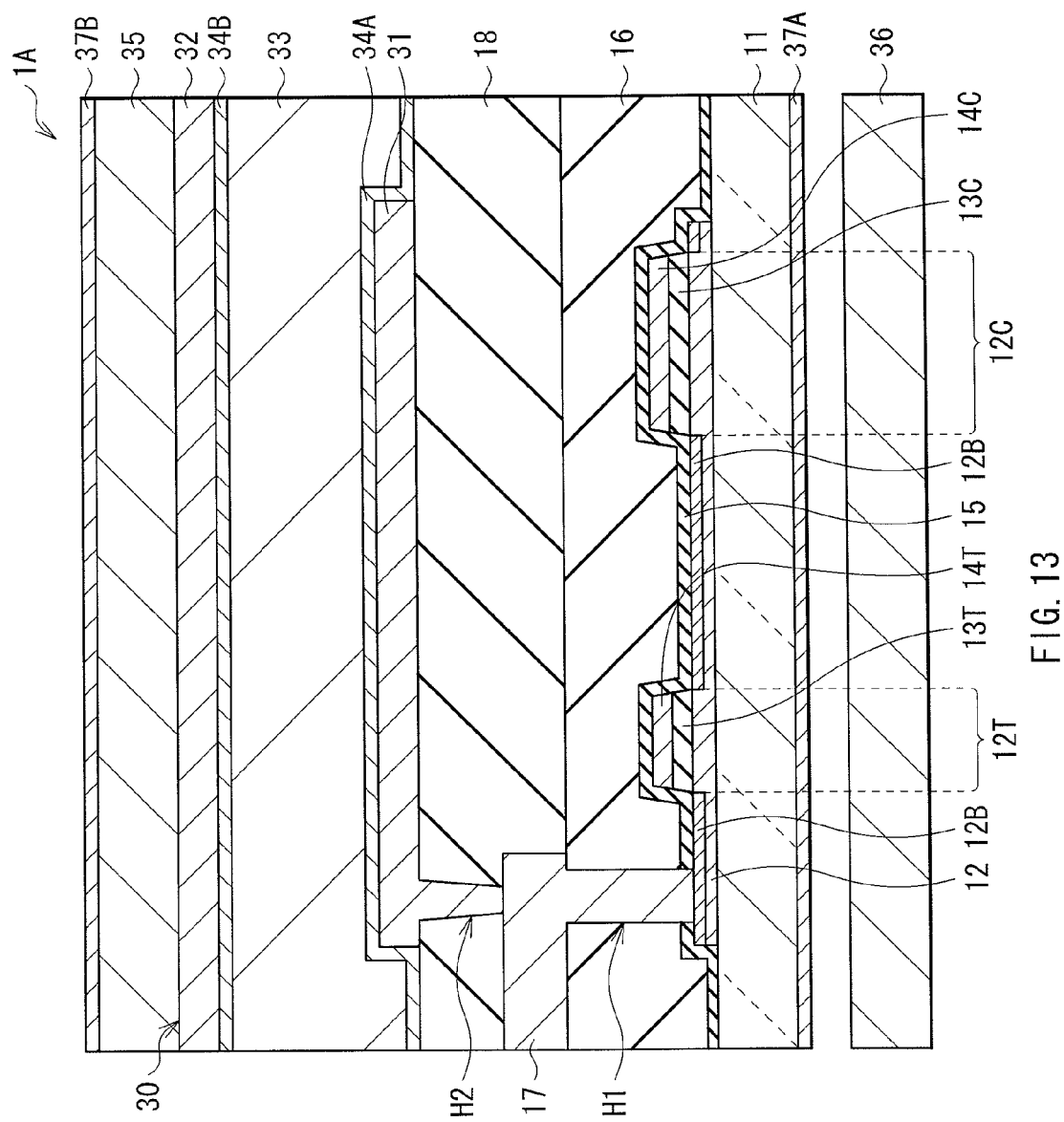
FIG. 13 is a sectional diagram illustrating a structure of a display according to a modification 1.

FIG. 13 illustrates a cross-sectional structure of a display (a display 1A) according to a modification 1 of the first embodiment. The display 1A has a liquid crystal display device 30 in place of the organic EL device 20 of the display 1. Except for this point, the display 1A has the similar structure to that of the display 1 of the first embodiment, and has similar function and effects.

The display 1A has the transistor 10T and the retention capacitor 10C similar to those of the display 1, and the liquid crystal display device 30 is provided in a layer above the transistor 10T and the retention capacitor 10C with the planarizing layer 18 in between.

The liquid crystal display device 30 is configured by, for example, sealing a liquid crystal layer 33 between a pixel electrode 31 and a counter electrode 32. An alignment film 34A is provided on a surface on the liquid crystal layer 33 side of the pixel electrode 31, and an alignment film 34B is provided on a surface on the liquid crystal layer 33 side of the counter electrode 32. The pixel electrode 31 is provided for each pixel, and is electrically connected to the source-drain electrode 17 of the transistor 10T, for example. The counter electrode 32 is provided on the counter substrate 35 as an electrode common to the plurality of pixels, and is maintained at, for example, common potential. The liquid crystal layer 33 is configured of a liquid crystal driven by, for example, vertical alignment (VA) mode, twisted nematic (TN) mode, in plane switching (IPS) mode, or the like.

Moreover, a backlight 36 is provided below the substrate 11, a polarization plate 37A is bonded to the backlight 36 side of the substrate 11, and a polarization plate 37B is bonded to the counter substrate 35.

The backlight 36 is a light source irradiating light toward the liquid crystal layer 33, and includes a plurality of light emitting diodes (LEDs), a plurality of cold cathode fluorescent lamps (CCFLs), or the like. Light emission state and light extinction state of the backlight 36 are controlled by a backlight drive section (not illustrated).

The polarization plates 37A and 37B (polarizer or analyzer) are disposed in crossed-Nicols with each other, and this allows illumination light from the backlight 36 to be blocked in a no-voltage applied state (off state), and to pass therethrough in a voltage applied state (on state).

In the display 1A, similarly to the display 1 of the first embodiment, the substrate 11 suppresses infiltration of moisture from the interlayer insulating film 16 into the oxide semiconductor film 12. Therefore, also in the modification 1, the electrical characteristics of the transistor 10T are allowed to be improved.

[Modification 2]

Figure 14:
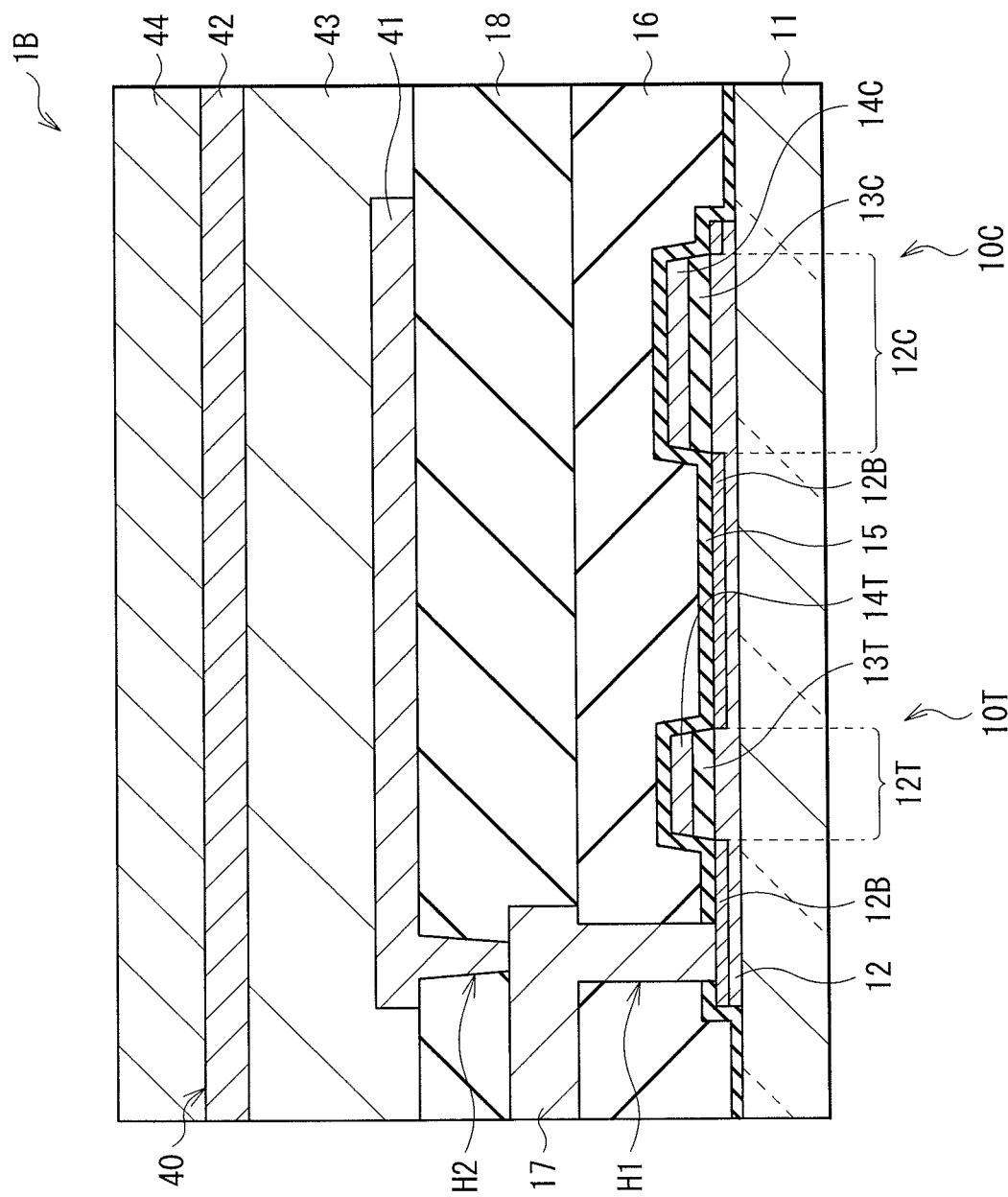
FIG. 14 is a sectional diagram illustrating a structure of a display according to a modification 2.

FIG. 14 illustrates a cross-sectional structure of a display (a display 1B) according to a modification 2 of the first embodiment. The display 1B is a so-called electronic paper, and has an electrophoretic display device 40 in place of the organic EL device 20 of the display 1. Except for this point, the display 1B has the similar structure to that of the display 1 of the first embodiment, and has similar function and effects.

The display 1B has the transistor 10T and the retention capacitor 10C similar to those of the display 1, and the electrophoretic display device 40 is provided in a layer above the transistor 10T and the retention capacitor 10C with the planarizing layer 18 in between.

The electrophoretic display device 40 is configured by, for example, sealing a display layer 43 formed of an electrophoretic display substance between a pixel electrode 41 and a common electrode 42. The pixel electrode 41 is provided for each pixel, and is electrically connected to the source-drain electrode 17 of the transistor 10T, for example. The common electrode 42 is provided on a counter substrate 44 as an electrode common to the plurality of pixels.

In the display 1B, similarly to the display 1 of the first embodiment, the substrate 11 suppresses infiltration of moisture from the interlayer insulating film 16 into the oxide semiconductor film 12. Therefore, also in the modification 2, the electrical characteristics of the transistor 10T are allowed to be improved.

Second Embodiment

Figure 15:
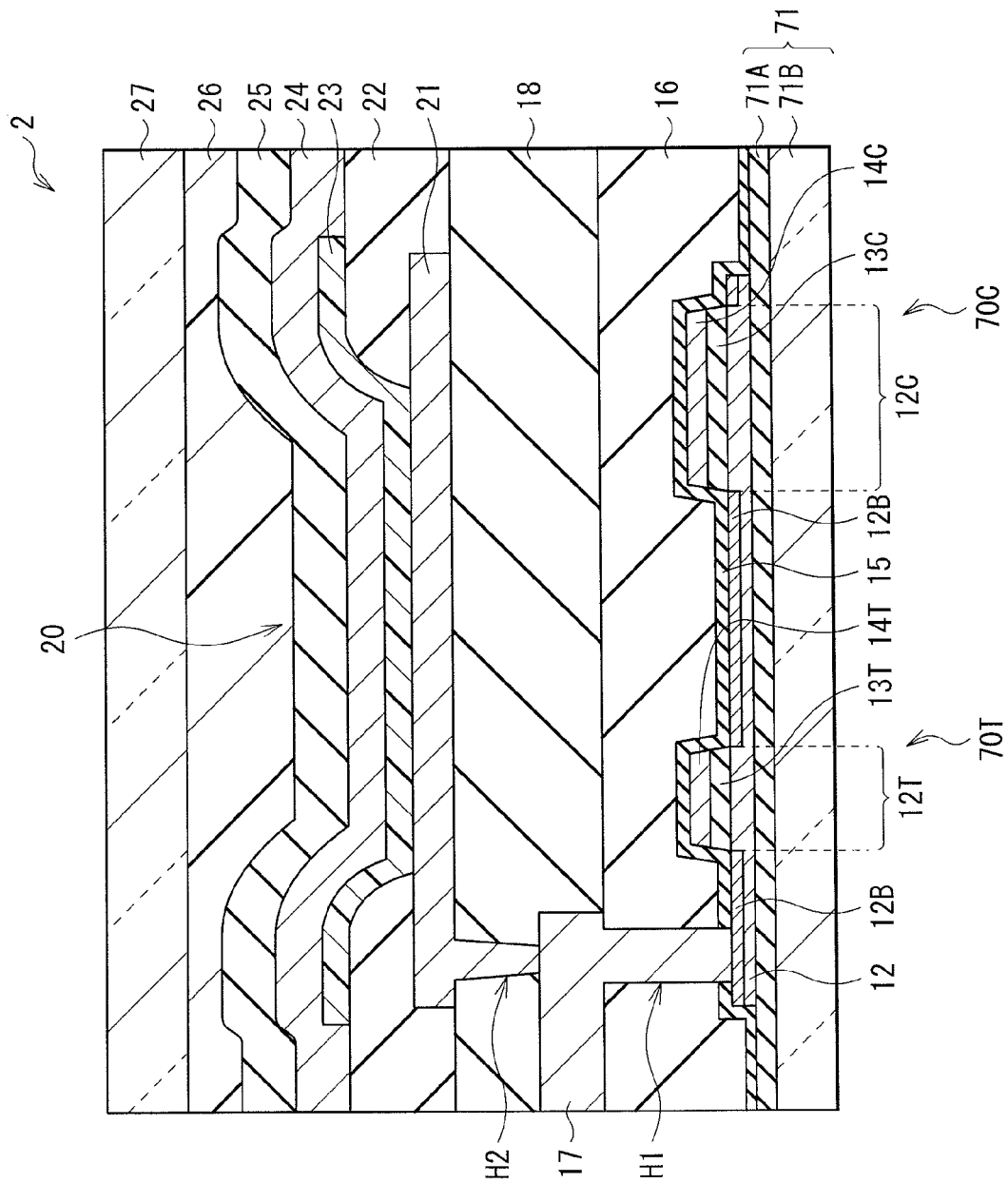
FIG. 15 is a sectional diagram illustrating a structure of a display according to a second embodiment of the application.

FIG. 15 illustrates a cross-sectional structure of a display (a display 2) according to a second embodiment of the application. In the display 2, a substrate (a substrate 71) has a diffusion preventing film 71A thereon. Except for this point, the display 2 has a similar structure to that of the display 1 of the first embodiment, and has similar function and effects.

A transistor (a transistor 70T) of the display 2 is a top-gate TFT including the oxide semiconductor film 12, the gate insulating film 13T, and the gate electrode 14T in this order on the substrate 71. The oxide semiconductor film 12 is in contact with the diffusion preventing film 71A of the substrate 71. The substrate 71 has the diffusion preventing film 71 on the surface of a plate-like member 71B. The diffusion preventing film 71A prevents moisture from diffusing from the interlayer insulating film 16 into the oxide semiconductor film 12 in annealing process, and is formed of a film having low moisture permeability. The plate-like member 71B is formed of, for example, quartz, glass, silicon, or a resin film. Since the oxide semiconductor film 12 is allowed to be formed by sputtering without heating the substrate 71 as described in the first embodiment, an inexpensive resin material is used for the plate-like member 71B. Examples of the resin material include polyethylene terephthalate (PET) and polyethylene naphthalate (PEN). The plate-like member 71B may be formed of a metal substrate made of stainless steel (SUS) or the like depending on the intended use. In this case, for example, a resin material having moisture permeability higher than that of glass may be used for the plate-like member 71B.

The diffusion preventing film 71A is formed of an inorganic insulating film such as a silicon oxide film, a silicon nitride film, and an aluminum oxide film that are formed by, for example, sputtering or ion beam sputtering. The organic EL device 20 is provided in a layer above the transistor 70T and the retention capacitor 70C that shares the oxide semiconductor film 12 with the transistor 70T, with the planarizing layer 18 in between. In place of the organic EL device 20, the liquid crystal display device 30 (FIG. 13) or the electrophoretic display device 40 (FIG. 14) may be provided.

Figure 16A:
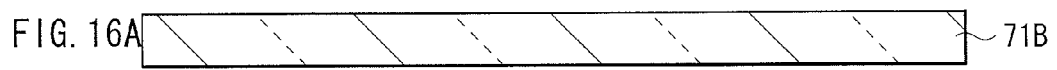
FIGS. 16A to 16C are sectional diagrams illustrating a method of manufacturing the display illustrated in FIG. 15 in a process order.
Figure 16B:
Figure 16C:
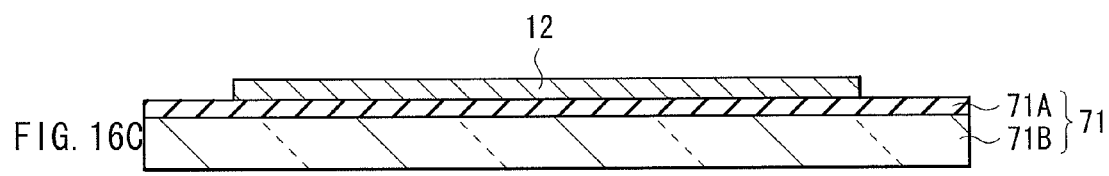

To manufacture the display 2, first, the plate-like member 71B is prepared (FIG. 16A), and the diffusion preventing film 71A is formed on the surface of the plate-like member 71B by physical film formation methods such as sputtering and ion beam sputtering (FIG. 16B). By using sputtering or ion beam sputtering, the amount of hydrogen contained in the diffusion preventing film 71A is reduced as compared with the case of using plasma CVD, and hydrogen is prevented from diffusing into the oxide semiconductor film 12, in addition to moisture. After formation of the diffusion preventing film 71A, the oxide semiconductor film 12 is formed on the diffusion preventing film 71A in a manner similar to that of the transistor 10T (FIG. 16C). Subsequently, the gate insulating film 13T, the gate electrode 14T, the high resistance film 15, the interlayer insulating film 16, and the source-drain electrode 17 are provided in a manner similar to that of the first embodiment, and thus the transistor 70T is formed. After formation of the transistor 70T and the retention capacitor 70C, the organic EL device 20 is formed to complete the display 2.

In the display 2, when the plate-like member 71B is formed of a material having relatively high moisture permeability such as a resin material, the diffusion of moisture from the interlayer insulating film 16 into the oxide semiconductor film 12 is allowed to be prevented by the diffusion preventing film 71A. Consequently, the electrical characteristics and the reliability of the transistor 70T are allowed to be improved in the second embodiment as well.

Third Embodiment

Figure 25:
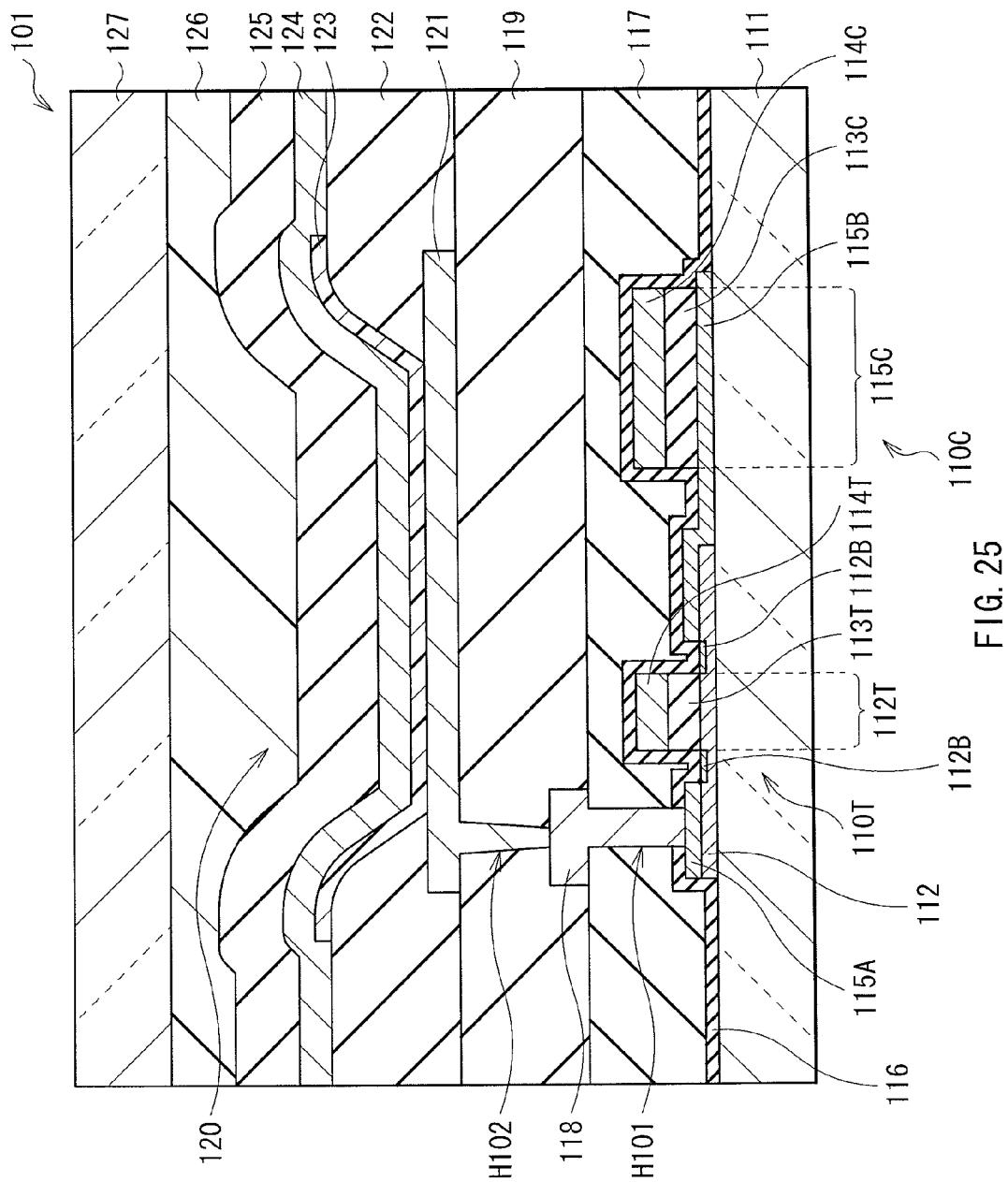
FIG. 25 is a sectional diagram illustrating a structure of a display according to a third embodiment of the application.

FIG. 25 illustrates a cross-sectional structure of a display (a display 101) according to a third embodiment of the application. The display 101 is an active matrix organic electroluminescence (EL) display, and includes a plurality of transistors 110T and a plurality of organic EL devices 120 that is driven by respective transistors 110T on a substrate 111. FIG. 25 illustrates a region (a sub-pixel) corresponding to one of the transistors 110T and one of the organic EL devices 120.

The transistor 110T is a staggered structure (top gate type) TFT including an oxide semiconductor film 112, a gate insulating film 113T, and a gate electrode 114T in this order on the substrate 111. Etching protection films 115A and 115B are provided together with the gate insulating film 113T on the oxide semiconductor film 112. The etching protection films 115A and 115B and the gate electrode 114T are covered with an oxide film 116, and an interlayer insulating film 117 is provided on the oxide film 116. One pair of source-drain electrodes 118 (one of them is not illustrated) is electrically connected to the oxide semiconductor film 112 through contact holes H101 (one of them is not illustrated) of the interlayer insulating film 117 and the oxide film 116.

The display 101 (a semiconductor unit) includes a retention capacitor 110C that shares one (the etching protection film 115B) of the pair of etching protection films 115A and 115B with the transistor 110T. The organic EL device 120 is provided above the transistor 110T and the retention capacitor 110C with a planarizing film 119 in between.

[Transistor 110T]

The substrate 111 is formed of a plate-like member such as quartz, glass, silicon, and a resin (plastic) film. Since the oxide semiconductor film 112 is formed by sputtering described later without heating the substrate 111, an inexpensive resin film may be used. Examples of the resin material include polyethylene terephthalate (PET) and polyethylene naphthalate (PEN). In addition thereto, a metal substrate made of stainless steel (SUS) or the like may be used depending on the intended use.

The oxide semiconductor film 112 is provided in a selective region on the substrate 111, and has a function as an active layer of the transistor 110T. The oxide semiconductor film 112 contains an oxide of one or more elements of indium (In), gallium (Ga), zinc (Zn), and tin (Sn), as a main component. Specifically, examples of amorphous oxide semiconductor include indium tin zinc oxide (ITZO) and indium gallium zinc oxide (IGZO, InGaZnO). Examples of crystalline oxide semiconductor include zinc oxide (ZnO), indium zinc oxide (IZO (registered trademark)), indium gallium oxide (IGO), indium tin oxide (ITO), and indium oxide (InO). Although any of the amorphous oxide semiconductor material and the crystalline oxide semiconductor material may be used, indium tin zinc oxide or a crystalline oxide semiconductor material is preferably used because etching selectivity with the etching protection films 115A and 115B is easily ensured.

The oxide semiconductor film 112 has a thickness (a thickness in a stack direction, hereinafter simply referred to as a thickness) of, for example, about 50 nm.

The oxide semiconductor film 112 has a channel region 112T facing the gate electrode 114T in an upper layer, and has a pair of low resistance regions 112B (source-drain regions) that is adjacent to the channel region 112T and has an electric resistivity lower than that of the channel region 112T. Each of the low resistance regions 112B is provided in a part of the thickness direction from the surface (the top surface) of the oxide semiconductor film 112, and for example, is formed by allowing a metal such as aluminum (Al) to react with an oxide semiconductor material and diffusing the metal (dopant). A self alignment structure of the transistor 110T is realized by the low resistance regions 112B. In addition, the low resistance regions 112B have a function of stabilizing the characteristics of the transistor 110T. The etching protection films 115A and 115B are provided so as to be in contact with parts of the oxide semiconductor film 112 outer than the low resistance regions 112B.

The gate electrode 114T is provided on the channel region 112T with the gate insulating film 113T in between. The gate electrode 114T and the gate insulating film 113T have the same shape in a planar view. The gate insulating film 113T has a thickness of, for example, about 300 nm, and is formed of a single-layer film made of one of a silicon oxide film (SiO), a silicon nitride film (SiN), a silicon oxynitride film (SiON), and an aluminum oxide film (AlO), or a stacked film made of two or more thereof. A material that is less likely to reduce the oxide semiconductor film 12, for example, a silicon oxide film or an aluminum oxide film is preferably used for the gate insulating film 113T.

Figure 26:
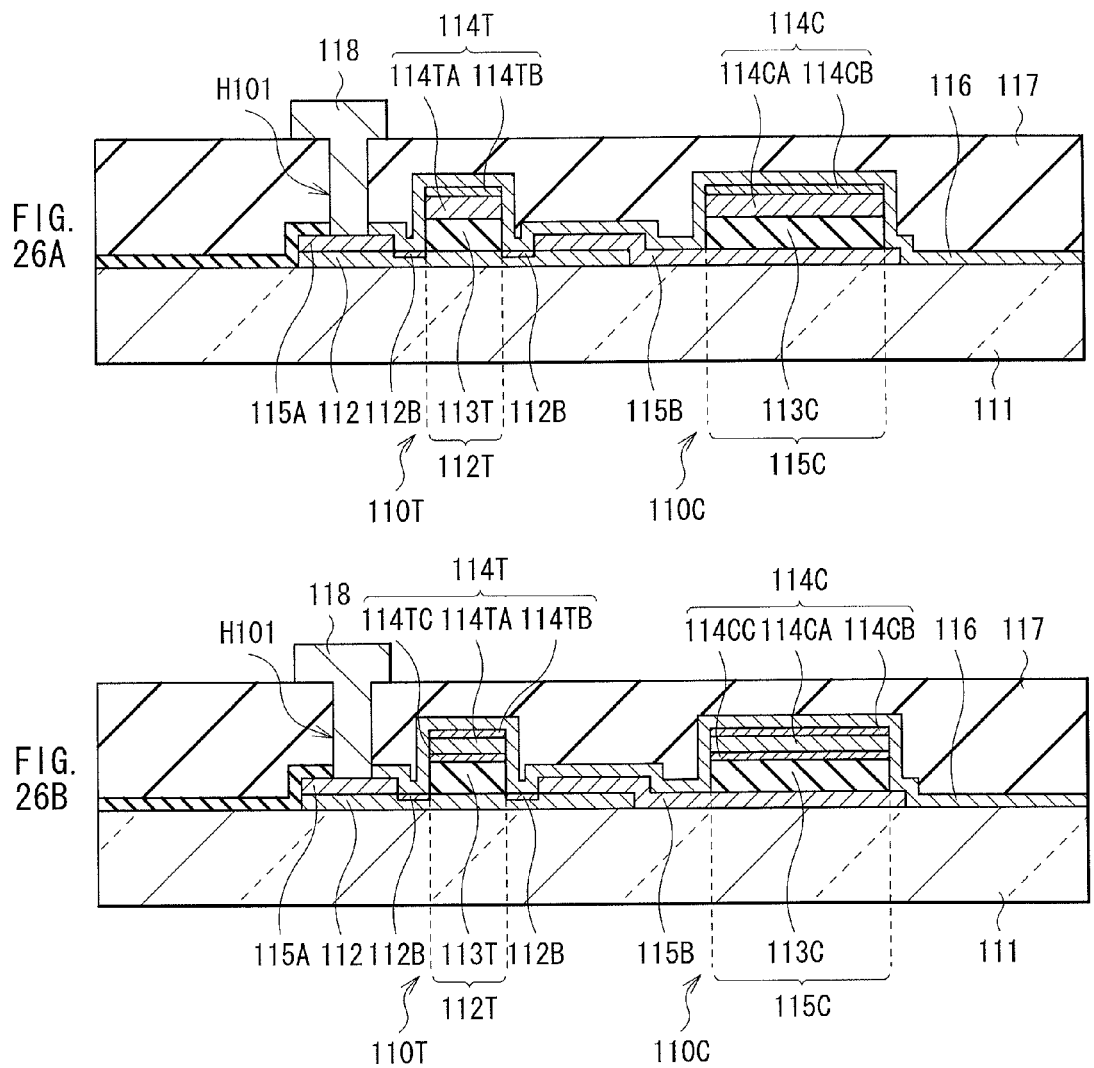
FIG. 26A is a sectional diagram illustrating another example of a gate electrode illustrated in FIG. 25.
FIG. 26B is a sectional diagram illustrating still another example thereof.

The gate electrode 114T controls carrier density in the oxide semiconductor film 112 (the channel region 112T) with use of a gate voltage (Vg) applied to the transistor 110T, and has a function as a wiring supplying potential. The gate electrode 114T is formed of a simple substance of one of, for example, molybdenum (Mo), molybdenum nitride (MoN), titanium (Ti), titanium nitride (TiN), aluminum, silver (Ag), neodymium (Nd), and copper (Cu), or an alloy thereof. The gate electrode 114T may have a stacked structure using a plurality of simple substances or a plurality of alloys. The gate electrode 114T is preferably formed of a low resistance metal such as aluminum alloy containing aluminum and neodymium (Al—Nd), and copper. The gate electrode 114T may be formed by stacking a layer (a barrier layer 114TB) formed of, for example, titanium, titanium nitride, molybdenum, or molybdenum nitride on a layer (a low resistance layer 114TA) formed of such a low resistance metal (FIG. 26A). The low resistance layer 114TA may be sandwiched between two barrier layers (barrier layers 114TB and 114TC) (FIG. 26B). Since the barrier layers 114TB and 114TC are highly resistant to chemical solution such as diluted hydrofluoric acid used in etching, for example, wet etching using the barrier layers 114TB and 114Tc is allowed to be performed at the time of forming the contact hole H101. In addition, the gate electrode 114T may be formed of a transparent conductive film such as ITO. The gate electrode 114T has a thickness of, for example, 10 nm to 500 nm both inclusive.

The etching protection film 115A protects the oxide semiconductor film 112 from etching when the contact hole H101 is formed in the interlayer insulating film 117 and the oxide film 116. The etching protection film 115B faces the etching protection film 115A with the gate insulating film 113T in between, and is widened to the outside of the oxide semiconductor film 112 to configure one (a lower electrode) of electrodes of the retention capacitor 110C. Similarly to the etching protection film 115A, the etching protection film 115B also protects the oxide semiconductor film 112 from etching when a through-hole (not illustrated) connecting a source-drain electrode (not illustrated) that is pared with the source-drain electrode 118 to the oxide semiconductor film 112 is formed. In other words, the pair of etching protection films 115A and 115B prevents damage of the oxide semiconductor film 112 in manufacturing, and thus it becomes possible to improve the electrical characteristics of the transistor 110T. Note that at least a part of each of the etching protection films 115A and 115B is necessary to be in contact with the oxide semiconductor film 112.

The etching protection films 115A and 115B electrically connects the low resistance regions 112B of the oxide semiconductor film 112 to the source-drain electrodes 118 (one of them is not illustrated), and the positions of the surfaces facing each other of the etching protection films 115A and 115B are coincident with the positions of the ends (the ends on the etching protection films 115A and 115B sides) of the low resistance regions 112B. Such etching protection films 115A and 115B are each formed of, for example, a metal material having an etching selectivity different from that of the oxide semiconductor film 112, specifically, is formed of an ITO, a molybdenum film, an aluminum film containing neodymium, or the like. A semiconductor material decreased in resistance, for example, silicon or germanium containing phosphorus, boron, or arsenic as dopant may be used for the etching protection films 115A and 115B. The etching protection films 115A and 115B each have a thickness of, for example, about 100 nm.

Figure 27:
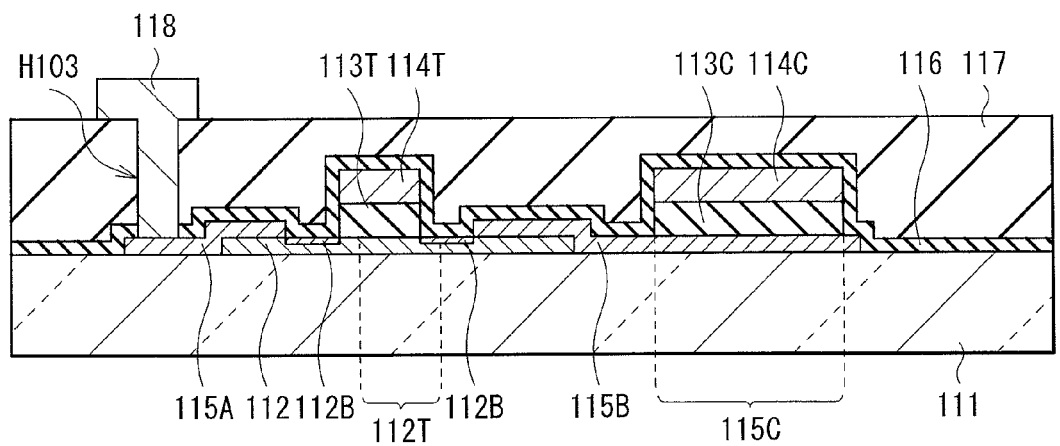
FIG. 27 is a sectional diagram illustrating another example of a position of a contact hole illustrated in FIG. 25.

As illustrated in FIG. 27, the etching protection film 115A is also widened to the outside of the oxide semiconductor film 112, and a contact hole (a contact hole H103) may be provided at a position facing the outside of the oxide semiconductor film 112. Although any of the contact holes H101 and H103 may be provided, preferably, a formation area of the etching protection film 115A is reduced, and the contact hole H101 at a position facing the oxide semiconductor film 112 is provided. This enables size reduction of the transistor 110T.

The oxide film 116 on the etching protection films 115A and 115B is in contact with the oxide semiconductor film 112 between the gate electrode 114T and the etching protection film 115A and between the gate electrode 114T and the etching protection film 115B. The oxide film 116 also covers the retention capacitor 110C. A metal film that is a supply source of a metal to be diffused into the low resistance regions 112B of the oxide semiconductor film 112 is oxidized and remained in manufacturing process described later. The remaining film is the oxide film 116. The oxide film 116 has a thickness of, for example, about 20 nm or less, and is formed of titanium oxide, aluminum oxide, indium oxide, tin oxide, or the like. The oxide film 116 may be formed by stacking these materials. Such an oxide film 116 has a function of suppressing influence of oxygen and moisture that causes change of the electrical characteristics of the oxide semiconductor film 112 in the transistor 110T, that is, a barrier function, in addition to the above-described role in the process. Accordingly, providing the oxide film 116 stabilizes the electrical characteristics of the transistor 110T and the retention capacitor 110C, and further enhances effects of the interlayer insulating film 117.

Figure 28:
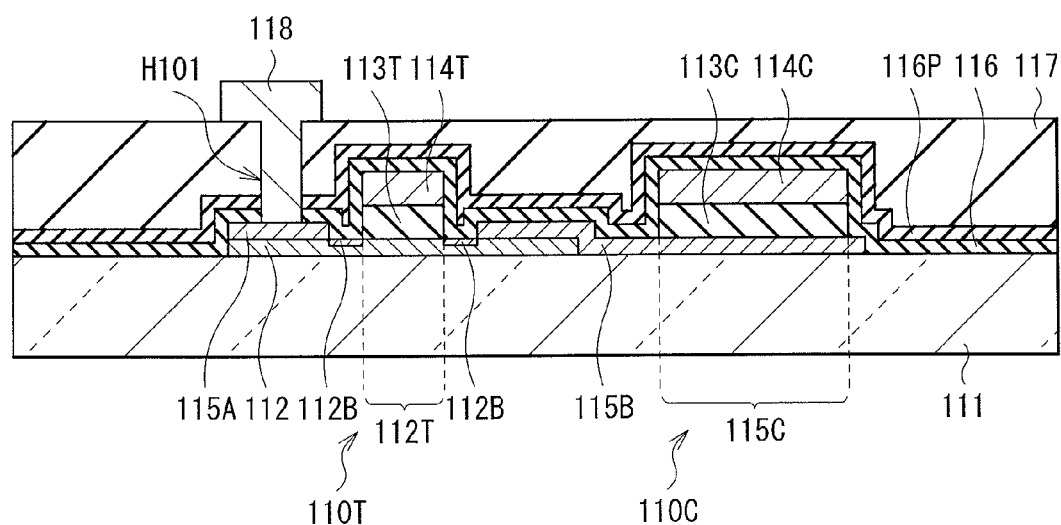
FIG. 28 is a sectional diagram illustrating another example of a transistor illustrated in FIG. 25.

To enhance the barrier function, as illustrated in FIG. 28, a protection film 116P may be stacked on the oxide film 116. The protection film 116P has a thickness of, for example, about 30 nm to 50 nm both inclusive, and is formed of aluminum oxide or silicon nitride. Accordingly, the electrical characteristics of the oxide semiconductor film 112 of the transistor 110T are further stabilized. When the protection film 116P is provided, the contact hole H101 penetrates the protection film 116P.

The interlayer insulating film 117 is provided on the oxide film 116, and is extended to the outside of the transistor 110T to cover the retention capacitor 110C similarly to the oxide film 116. The interlayer insulating film 117 is formed of, for example, an organic material such as acrylic resin, polyimide, and siloxane, or an inorganic material such as a silicon oxide film, a silicon nitride film, a silicon oxynitride film, and aluminum oxide. The interlayer insulating film 117 may be formed by stacking such an organic material and such an inorganic material. The interlayer insulating film 117 containing the organic material is allowed to be easily increased in thickness to about 2 for example. The interlayer insulating film 117 thus increased in thickness sufficiently covers level difference formed after processing of the gate electrode 114T, to ensure insulating property.

The source-drain electrodes 118 are patterned and provided on the interlayer insulating film 117, and are connected to the etching protection films 115A and 115B through the contact holes H101 (through-holes) penetrating the interlayer insulating film 117 and the oxide film 116. The source-drain electrodes 118 are desirably provided so as to avoid a region right above the gate electrode 114T, in order to prevent a parasitic capacity from being formed in a cross region between the gate electrode 114T and the source-drain electrodes 118. Each of the source-drain electrodes 118 has a thickness of, for example, about 500 nm, and is formed of the metal described for the gate electrode 114T or a material similar to that of the transparent conductive film. Each of the source-drain electrodes 118 are also preferably formed of a low resistance metal material such as aluminum and copper, and more preferably, is formed of a stacked film of the low resistance layer and the barrier layer. This is because configuring each of the source-drain electrodes 118 using such a stacked film enables drive with a little wiring delay.

[Retention Capacitor 110C]

The retention capacitor 110C is a capacitor provided, together with the transistor 110T, on the substrate 111, and holding charge in a pixel circuit 150A described later, for example. The retention capacitor 110C has the etching protection film 115B that is shared with the transistor 110T, a capacity insulating film 113C, and an upper electrode 114C in this order from the substrate 111 side. In other words, a lower electrode (one of electrodes) of the retention capacitor 110C is configured of a part (an electrode region 115C) of the etching protection film 115B. Although the detail will be described later, this eliminates application voltage dependency of a capacitance value, and ensures sufficient capacity irrespective of a magnitude of the gate voltage to maintain display property.

The capacity insulating film 113C is formed of the same material to have the same thickness by the same process as those of the gate insulating film 113T, for example. When the capacity insulating film 113C is formed of an inorganic insulating material, the retention capacity 110C having a large capacity is obtainable. In addition, the upper electrode 114C is formed of the same material to have the same thickness by the same process as those of the gate electrode 114T, for example. The upper electrode 114C may have a stacked structure (FIGS. 26A and 26B). The capacity insulating film 113C and the gate insulating film 113T may be formed in the different process, and may be formed of different materials with different thicknesses. The upper electrode 114C and the gate electrode 114T may be formed in different processes, and may be formed of different materials with different film thicknesses.

[Organic EL Device 120]

The organic EL device 120 is provided on the planarizing film 119. The organic EL device 120 has a first electrode 121, a pixel separation film 122, an organic layer 123, and a second electrode 124 in this order from the planarizing film 119, and is sealed by a device protection layer 125. A sealing substrate 127 is bonded to the device protection layer 125 with an adhesive layer 126 that is formed of a thermosetting resin or an ultraviolet curable resin in between. The display 101 may be of a bottom emission type (a bottom surface emission type) extracting light generated in the organic layer 123 from the substrate 111 side, or may be of a top emission type (a top surface emission type) extracting the light from the sealing substrate 127 side.

The planarizing film 119 is provided over the entire display region (a display region 150 in FIG. 28 described later) of the substrate 111 on the source-drain electrodes 118 and the interlayer insulating film 117, and has a contact hole H102. The contact hole H102 is intended to connect the source-drain electrodes 118 of the transistor 110T to the first electrode 121 of the organic EL device 120. The planarizing film 119 is formed of, for example, polyimide or an acrylic resin.

The first electrode 121 is provided on the planarizing film 119 so as to fill the contact hole H102. The first electrode 121 functions as an anode, for example, and is provided for each device. When the display 101 is of the bottom emission type, the first electrode 121 is formed of a transparent conductive film, for example, a single-layer film formed of one of indium tin oxide (ITO) and indium zinc oxide (IZO, InZnO), or a stacked-layer film formed of both thereof. On the other hand, when the display 101 is of the top emission type, the first electrode 121 is formed of a reflective metal, for example, a simple metal of one of aluminum, magnesium (Mg), calcium (Ca), and sodium (Na), a single-layer film formed of an alloy containing one or more thereof, or a multi-layer film formed of stacked simple metals or stacked alloys.

The first electrode 121 may be provided so as to be in contact with the surface (a surface on the organic EL device 120 side) of the source-drain electrodes 118. This enables omission of the planarizing film 119, and reduces the number of processes for manufacturing the display 101.

The pixel separation film 122 is intended to ensure insulating property between the first electrode 121 and the second electrode 124 as well as define an emission region of each device, and has an opening facing the emission region of each device. The pixel separation film 122 is formed of, for example, a photosensitive resin such as polyimide, acrylic resin, and novolak resin.

The organic layer 123 is provided so as to cover the opening of the pixel separation film 122. The organic layer 123 includes an organic electroluminescence layer (an organic EL layer), and emits light in response to application of a drive current. The organic layer 123 has, for example, a hole injection layer, a hole transport layer, the organic EL layer, and an electron transport layer in this order from the substrate 111 (the first electrode 121) side, and emits light by recombination of electrons and holes in the organic EL layer. The material of the organic EL layer is a typical organic material of low molecular or high molecular, and is not particularly limited. For example, organic EL layers emitting red, green, and blue are selectively coated by different colors for each device, or an organic EL layer emitting white light (for example, a layer obtained by stacking the organic EL layers of red, green, and blue) may be provided over the entire surface of the substrate 111. The hole injection layer enhances hole injection efficiency and prevents leakage. The hole transport layer enhances hole transport efficiency to the organic EL layer. The layers other than the organic EL layer, such as the hole injection layer, the hole transport layer, and the electron transport layer may be provided as necessary.

The second electrode 124 functions as, for example, a cathode, and is formed of a metal conductive film. When the display 101 is of the bottom emission type, the second electrode 124 is formed of a reflective metal, for example, a simple metal of one or more of aluminum, magnesium (Mg), calcium (Ca), and sodium (Na), a single-layer film formed of an alloy containing one or more thereof, or a multi-layer film formed of stacked simple metals or stacked alloys. On the other hand, the display 101 is of the top emission type, the second electrode 124 is formed of a transparent conductive film such as ITO and IZO. The second electrode 124 is provided in common to the devices, for example, in a state insulated from the first electrode 121.

The device protection layer 125 may be formed of an insulating material or a conductive material. Examples of the insulating material include amorphous silicon (a-Si), amorphous silicon carbide (a-SiC), amorphous silicon nitride (a-Si$_{(1-x)}$N$_x$), and amorphous carbon (a-C).

The sealing substrate 127 is provided so as to face the substrate 111 with the transistor 110T, the retention capacitor 110C, and the organic EL device 120 in between. The sealing substrate 127 may be formed of a material similar to that of the substrate 111. When the display 101 is of the top emission type, a transparent material is used for the sealing substrate 127, and a color filter or a light shielding film may be provided on the sealing substrate 127 side. When the display 101 is of the bottom emission type, the substrate 111 is formed of a transparent material, and for example, a color filter or a light shielding film is provided on the substrate 111 side.

[Configuration of Peripheral Circuits and Pixel Circuit]

Figure 29:
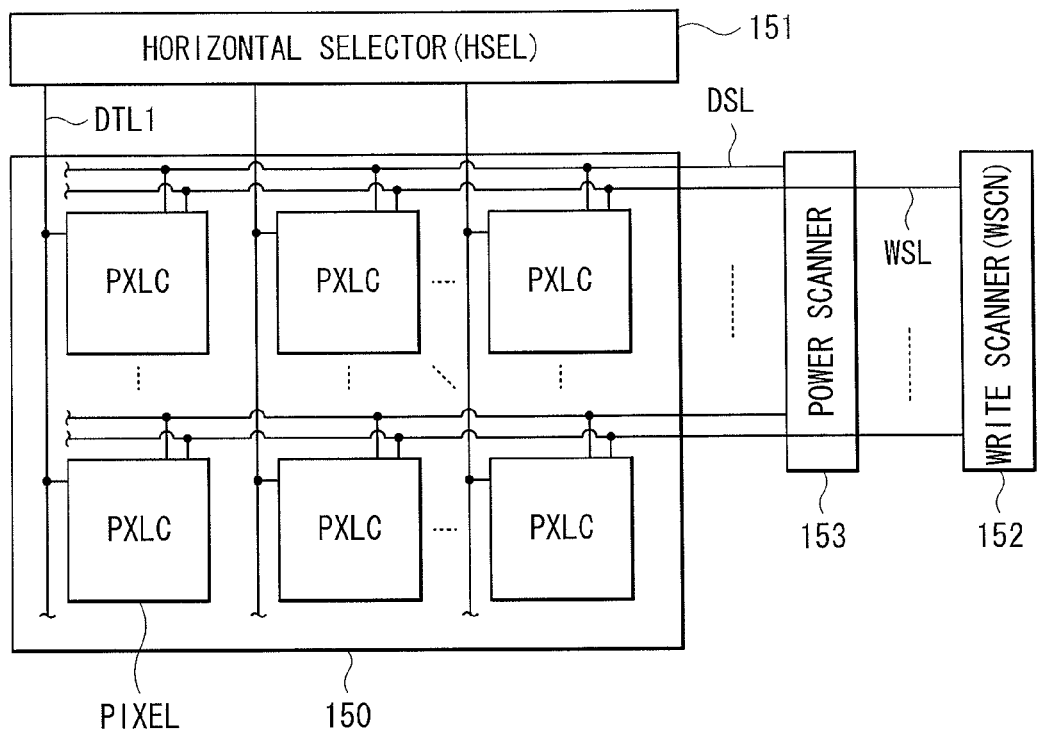
FIG. 29 is a diagram illustrating an overall configuration including peripheral circuits of the display illustrated in FIG. 25.

As illustrated in FIG. 29, the display 101 has a plurality of pixels PXLC each including such an organic EL device 120, and the pixels PXLC are arranged, for example, in a matrix in the display region 150 on the substrate 111. A horizontal selector (HSEL) 151 as a signal line drive circuit, a write scanner (WSCN) 152 as a scan line drive circuit, and a power scanner 153 as a power line drive circuit are provided in periphery of the display region 150.

In the display region 150, a plurality of (the integer n-number of) signal lines DTL1 to DTLn is arranged in a column direction, and a plurality of (the integer m-number of) scan lines WSL1 to WSLm is arranged in a row direction. Each of the pixels PXLC (one of the pixels corresponding to R, G, and B) is provided at an intersection of each of the signal lines DTL and each of the scan lines WSL. Each of the signal lines DTL is electrically connected to the horizontal selector 151, and an image signal is supplied from the horizontal selector 151 to each of the pixels PXLC through each of the signal lines DTL. On the other hand, each of the scan lines WSL is electrically connected to the write scanner 152, and a scan signal (a selection pulse) is supplied from the write scanner 152 to each of the pixels PXLC through each of the scan lines WSL. Each of power lines DSL is connected to a power scanner 153, and a power signal (a control pulse) is supplied from the power scanner 153 to each of the pixels PXLC through each of the power lines DSL.

Figure 30:
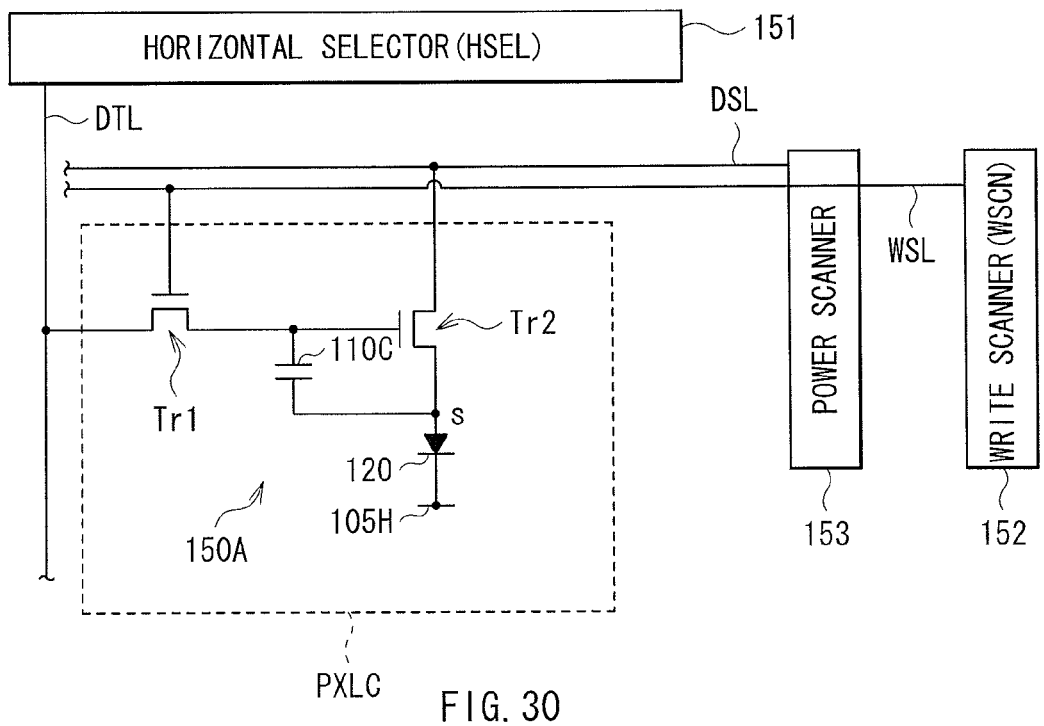
FIG. 30 is a diagram illustrating a circuit configuration of a pixel illustrated in FIG. 29.

FIG. 30 illustrates a specific example of a circuit configuration in the pixel PXLC. Each of the pixels PXLC has the pixel circuit 150A including the organic EL device 120. The pixel circuit 150A is an active drive circuit including a sampling transistor Tr1, a drive transistor Tr2, the retention capacitor 110C, and the organic EL device 120. One or both of the sampling transistor Tr1 and the drive transistor Tr2 correspond to the above-described transistor 110T.

A gate of the sampling transistor Tr1 is connected to a corresponding scan line WSL. One of a source and a drain of the sampling transistor Tr1 is connected to a corresponding signal line DTL, and the other is connected to a gate of the drive transistor Tr2. A drain of the drive transistor Tr2 is connected to a corresponding power line DSL, and a source thereof is connected to an anode of the organic EL device 120. In addition, a cathode of the organic EL device 120 is connected to a ground wiring 105H. Incidentally, the ground wiring 105H is wired commonly to all of the pixels PXLC. The retention capacitor 110C is disposed between the source and the gate of the drive transistor Tr2.

The sampling transistor Tr1 becomes conductive in response to the scan signal (the selection pulse) supplied from the scan line WSL to sample a signal potential of an image signal supplied from the signal line DTL, thereby retaining the sampled signal potential in the retention capacitor 110C. The drive transistor Tr2 is supplied with a current from the power line DSL set at a predetermined first potential (not illustrated), and supplies a drive current to the organic EL device 120 based on the signal potential retained in the retention capacitor 110C. The organic EL device 120 emits light with luminance corresponding to the signal potential of the image signal, by the drive current supplied from the drive transistor Tr2.

In such a circuit configuration, the sampling transistor Tr1 becomes conductive in response to the scan signal (the selection pulse) supplied from the scan line WSL to sample the signal potential of the image signal supplied from the signal DTL, thereby retaining the sampled signal potential in the retention capacitor 110C. Moreover, the current is supplied from the power line DSL set at the above-described first potential to the drive transistor Tr2, and the drive current is supplied to the organic EL device 120 (each of the organic EL devices of red, green, and blue) based on the signal potential retained in the retention capacitor 110C. Then, each of the organic EL devices 120 emits light with luminance corresponding to the signal potential of the image signal by supplied drive current. As a result, image display based on the image signal is performed on the display 101.

The display 101 is allowed to be manufactured in the following way, for example.

[Process of Forming Transistor 110T and Retention Capacitor 110C]

Figure 31A:
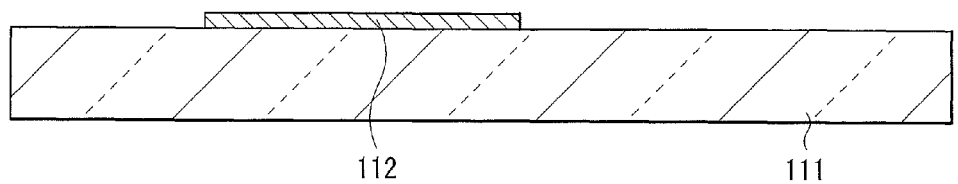
FIGS. 31A to 31C are sectional diagrams illustrating a method of manufacturing the display illustrated in FIG. 25 in a process order.

First, as illustrated in FIG. 31A, the oxide semiconductor film 112 made of the above-described material is formed on the substrate 111. Specifically, an oxide semiconductor material film (not illustrated) with a thickness of, for example, about 50 nm is formed over the entire surface of the substrate 111 by, for example, sputtering. At this time, ceramic having the same composition as that of an oxide semiconductor to be formed is used as a target. In addition, since carrier density in the oxide semiconductor largely depends on oxygen partial pressure at the time of sputtering, the oxygen partial pressure is controlled to provide desired transistor characteristics. When the oxide semiconductor film 112 is formed of the above-described indium tin zinc oxide or the above-described crystalline material, etching selectivity is easily improved in the etching process of each of the etching protection films 115A and 115B and the gate insulating film 113T described later. Subsequently, the formed oxide semiconductor material film is patterned into a desired shape by, for example, photolithography and etching. At this time, the process is preferably performed by wet etching with use of a liquid mixture of phosphoric acid, nitric acid, and acetic acid. The liquid mixture of phosphoric acid, nitric acid, and acetic acid sufficiently increases a selective ratio to the base, and thus process is relatively easily performed.

Figure 31B:
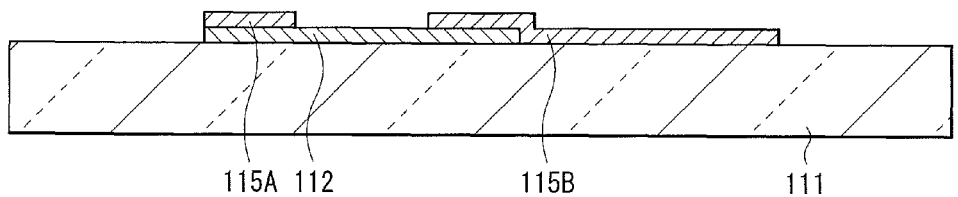

Subsequently, as illustrated in FIG. 31B, the etching protection films 115A and 115B are formed on the oxide semiconductor film 112. Specifically, a film of the above-described metal material or a film of the semiconductor material decreased in resistance is formed on the oxide semiconductor film 112 and the substrate 111, and then the formed film is etched to form the etching protection films 115A and 115B. The etching protection film 115B is extended to the outside of the oxide semiconductor film 112 from on the oxide semiconductor film 112. When each of the etching protection films 115A and 115B is formed of a metal material such as ITO, a molybdenum film, and an aluminum film containing neodymium, and the oxide semiconductor film 112 is formed of indium tin zinc oxide or a crystalline oxide semiconductor material, wet etching with use of a liquid mixture of phosphoric acid, nitric acid, and acetic acid is allowed to be performed. On the other hand, when each of the etching protection films 115A and 115B is formed of a silicon film or a germanium film containing dopant such as phosphorus, boron, and arsenic, dry etching in gas atmosphere containing fluorine or the like is allowed to be performed. In the dry etching, even if the oxide semiconductor film 112 is amorphous, the etching protection films 115A and 115B are formed in a state of remaining the amorphous oxide semiconductor film 112. When the etching protection films 115A and 115B are formed of a metal material that is resistant to etching with use of the liquid mixture of phosphoric acid, nitric acid, and acetic acid, the dry etching is allowed to be used.

Figure 31C:
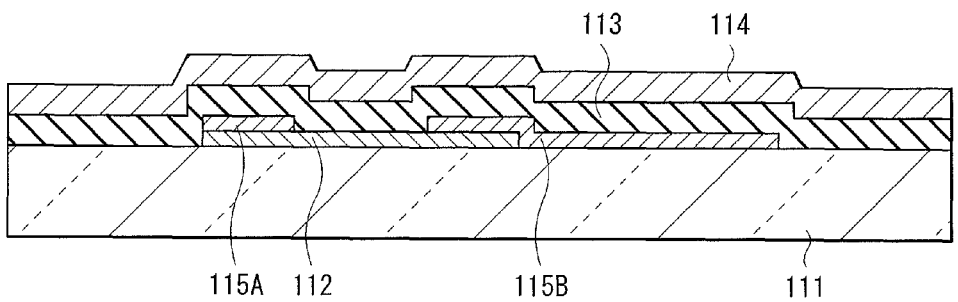

After formation of the etching protection films 115A and 115B, as illustrated in FIG. 31C, the insulating film 113 that is made of a silicon oxide film or an aluminum oxide film and has a thickness of, for example, 200 nm, and the conductive film 114 that is made of a metal material such as molybdenum, titanium, and aluminum and has a thickness of, for example, 500 nm are formed in this order over the entire surface of the substrate 111. The insulating film 113 may be formed by, for example, plasma chemical vapor deposition (CVD). The insulating film 113 made of a silicon oxide film may be formed by reactive sputtering, besides the plasma CVD. In addition, when the insulating film 13 is formed of an aluminum oxide film, atomic layer deposition may be used, besides the reactive sputtering and the CVD. The conductive film 114 may be formed by, for example, sputtering.

After formation of the conductive film 114, the conductive film 114 is patterned by, for example, photolithography and etching to form the gate electrode 114T and the upper electrode 114C in a selective region on the oxide semiconductor film 112. Then, the insulating film 113 is etched with use of the formed gate electrode 114T and the upper electrode 114C as a mask. As a result, the gate insulating film 113T and the capacity insulating film 113C are patterned into substantially the same shape as that of the gate electrode 114T and that of the upper electrode 114C, respectively, in a planar view (FIG. 32A). When the oxide semiconductor film 112 is formed of the above-described crystalline material, the insulating film 113 is easily processed while the extremely-large etching selective ratio is maintained, by using a chemical solution such as hydrofluoric acid in the etching process. The capacity insulating film 113C and the upper electrode 114C of the retention capacitor 110C may be formed with use of a material different from that of the insulating film 113 and that of the conductive film 114 after formation of the gate electrode 114T and the gate insulating film 113T.

Figure 33A:
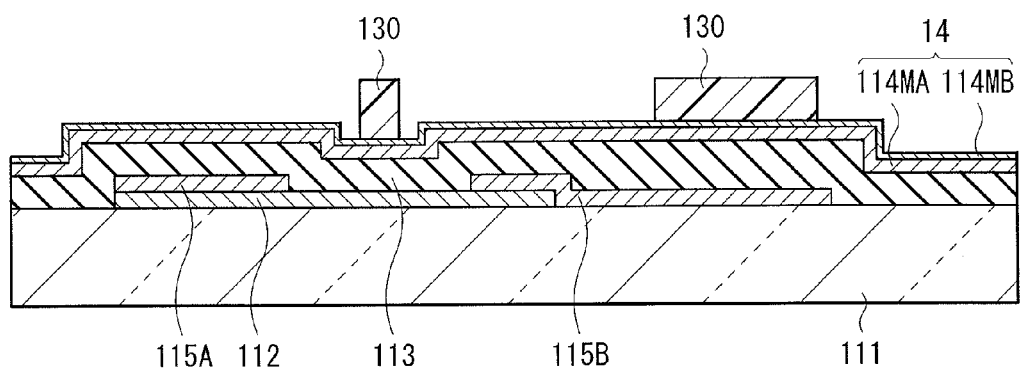
FIGS. 33A to 33C are sectional diagrams illustrating a method of manufacturing the gate electrode illustrated in FIG. 26A in a process order.
Figure 33B:
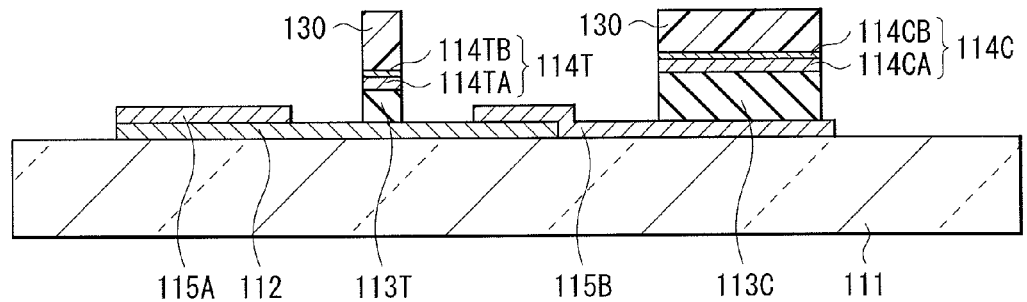
Figure 33C:
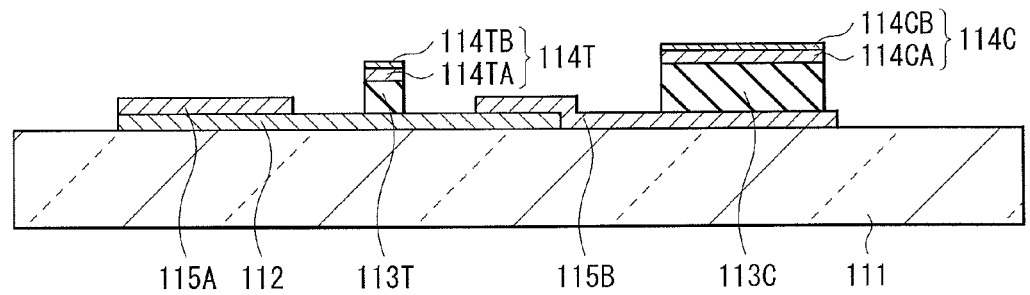

When the gate electrode 114T has a stacked structure including, for example, the low resistance layer 114TA formed of aluminum and the barrier layer 114TB formed of titanium nitride (FIG. 26A), the gate electrode 114T may be formed in the following way. First, as illustrated in FIG. 33A, for example, a conductive film 114MA made of aluminum and a conductive film 114MB made of titanium nitride are formed on the insulating film 113 by sputtering, and then pattern of a resist 130 is formed on the conductive film 114MB through photolithography. Subsequently, after the conductive film 114MB and the conductive film 114MA are subjected to dry etching, the insulating film 113 is also subjected to dry etching (FIG. 33B) to remove the resist 130 (FIG. 33C). As a result, the gate electrode 114T configured of the low resistance layer 114TA and the barrier layer 114TB is formed.

In addition, when the gate electrode 114T is configured of a barrier layer 114TC made of titanium, the low resistance layer 114TA made of aluminum, and the barrier layer 114TB made of molybdenum from the gate insulating film 113T side (FIG. 26B), the gate electrode 114T may be formed in the following way. First, as illustrated in FIG. 34A, a conductive film 114MC made of titanium, the conductive film 114MA made of aluminum, and the conductive film 114MB made of molybdenum are formed on the insulating film 113 by sputtering, and then pattern of the resist 130 is formed on the conductive film 114MB through photolithography. Subsequently, after the conductive film 114MB and the conductive film 114MA are subjected to wet etching with use of a liquid mixture of phosphoric acid, nitric acid, and acetic acid (FIG. 34B), the conductive film 114MC is subjected to dry etching with use of, for example, chlorine gas. In such a way, the gate electrode 114T is formed by using wet etching and dry etching so that the transistor 110T with less defect and high electrical characteristics is allowed to be formed. This is for the following reasons. In aluminum configuring the conductive film 114MA, defect easily occurs due to particle generated at the time of dry etching. In this case, wet etching is used for patterning the conductive film 114MA, thereby preventing generation of the defects. In addition, although the line width of the channel of the transistor largely affects the electrical characteristics, this is precisely controllable by dry etching of the conductive film 114MC.

After etching of the conductive film 114MC, the insulating film 113 is etched (FIG. 34C) and the resist 130 is removed (FIG. 34D) to complete the gate electrode 114T including the low resistance layer 114TA and the barrier layers 114TB and 114TC.

After formation of the gate electrode 114T, the upper electrode 114C, the gate insulating film 113T, and the capacity insulating film 113C, the metal film 116A made of, for example, titanium, aluminum, tin, or indium is formed to have a thickness of, for example, 5 nm or more and 10 nm or less, over the entire surface of the substrate 111 by, for example, sputtering or atomic layer deposition, as illustrated in FIG. 32B. The metal film 116A is formed of a metal that reacts with oxygen at relatively low temperature so as to be in contact with the oxide semiconductor film 112 between the gate electrode 114T (the gate insulating film 113T) and the etching protection film 115A and between the gate electrode 114T and the etching protection film 115B. After formation of the metal film 116A, the protection film 116P (FIG. 28) that is made of an aluminum oxide film and has a thickness of about 50 nm may be formed by, for example, sputtering or atomic layer deposition.

Subsequently, as illustrated in FIG. 32C, heat treatment is carried out at a temperature of, for example, about 200° C. to oxidize the metal film 116A, and thus the oxide film 116 is formed. At this time, in the region of the oxide semiconductor film 112 with which the oxide film 116 is in contact, that is, in the region adjacent to the channel region 112T, the low resistance region 112B is formed in a part on the oxide film 116 side in the thickness direction. Since part of oxygen contained in the oxide semiconductor film 112 is used in the oxidation reaction of the metal film 116A, the oxygen concentration is lowered from the side of the surface (the top surface), which is in contact with the metal film 116A, of the oxide semiconductor film 112, along with progress of oxidation of the metal film 116A. On the other hand, the metal such as aluminum is diffused from the metal film 116A into the oxide semiconductor film 112. The metal elements function as dopant, and the region of the oxide semiconductor film 112 that is located on the top surface side and is in contact with the metal film 116A is decreased in resistance. Consequently, the low resistance region 112B with electric resistance lower than that of the channel region 112T is formed.

As the heat treatment of the metal film 116A, annealing at the temperature of about 200° C. as described above is preferable. At this time, when annealing is performed in oxidized gas atmosphere containing oxygen and the like, it is possible to suppress excess lowering of the oxygen concentration of the low resistance region 112B, and to supply sufficient amount of oxygen to the oxide semiconductor film 112. Consequently, it is possible to eliminate the annealing performed in the subsequent process to simplify the sequence.

The oxide film 116 may be formed by, for example, setting the temperature of the substrate 111 to relatively high at the time of forming the metal film 116A on the substrate 111, instead of the above-described annealing process. For example, when the metal film 116A is formed while the temperature of the substrate 111 is maintained at about 200° C. in the process of FIG. 32B, the predetermined region of the oxide semiconductor film 112 is decreased in resistance without being subjected to heat treatment. In this case, the charier density of the oxide semiconductor film 112 is allowed to be reduced to a level necessary for the transistor.

The metal film 116A is preferably formed to have a thickness of 10 nm or less as described above. This is because when the thickness of the metal film 116A is equal to or less than 10 nm, the metal film 116A is sufficiently oxidized (the oxide film 116 is formed) by the heat treatment. If oxidation of the metal film 116A is insufficient, a process of removing unoxidized regions of the metal film 116A by etching is necessary. This is because if the insufficiently oxidized region of the metal film 116A is remained on the gate electrode 114T, the upper electrode 114C, and the like, a leakage current may occur. When the metal film 116A is sufficiently oxidized and the oxide film 116 is formed, such a removing process is unnecessary, and simplification of the manufacturing process becomes possible. In other words, occurrence of the leakage current is prevented without performing the removing process by etching. Note that when the metal film 116A is formed to have a thickness of 10 nm or less, the thickness of the oxide film 116 that has been subjected to the heat treatment is about 20 nm or less.

As a method of oxidizing the metal film 116A, methods such as oxidation in water-vapor atmosphere and plasma oxidation may be used in addition to the above-described heat treatment. In particular, the plasma oxidation provides the following advantage. The interlayer insulating film 117 is formed by plasma CVD (FIG. 35A described later) after formation of the oxide film 116. At this time, the interlayer insulating film 117 may be formed subsequently (continuously) after the metal film 116A is subjected to the plasma oxidation treatment. Therefore, advantageously, addition of the process is unnecessary. The plasma oxidation is desirably performed by setting the temperature of the substrate 111 to about 200° C. to 400° C. both inclusive and generating plasma in oxygen-containing gas atmosphere such as gas mixture of oxygen and dinitrogen oxide. By such a process, the oxide film 116 having favorable barrier property to the ambient air is allowed to be formed.

After the oxide film 116 is formed, as illustrated in FIG. 35A, the interlayer insulating film 117 is formed over the entire surface of the oxide film 116. When the interlayer insulating film 117 contains an inorganic insulating material, for example, plasma CVD, sputtering, or atomic layer deposition may be used. When the interlayer insulating film 117 contains an organic insulating material, coating such as spin coating and slit coating may be used. The thick interlayer insulating film 117 is easily formed by coating. Subsequently, exposure and development are performed to form the contact hole H101 in a predetermined position of the interlayer insulating film 117. When the interlayer insulating film 117 is formed of photosensitive resin, the exposure and the development may be performed with use of the photosensitive resin.

In the third embodiment, since the etching protection films 115A and 115B are provided, the contact hole H101 penetrating the oxide film 116 is allowed to be formed without damaging the oxide semiconductor film 112 (FIG. 35B). The description thereof will be given below.

Figure 36:
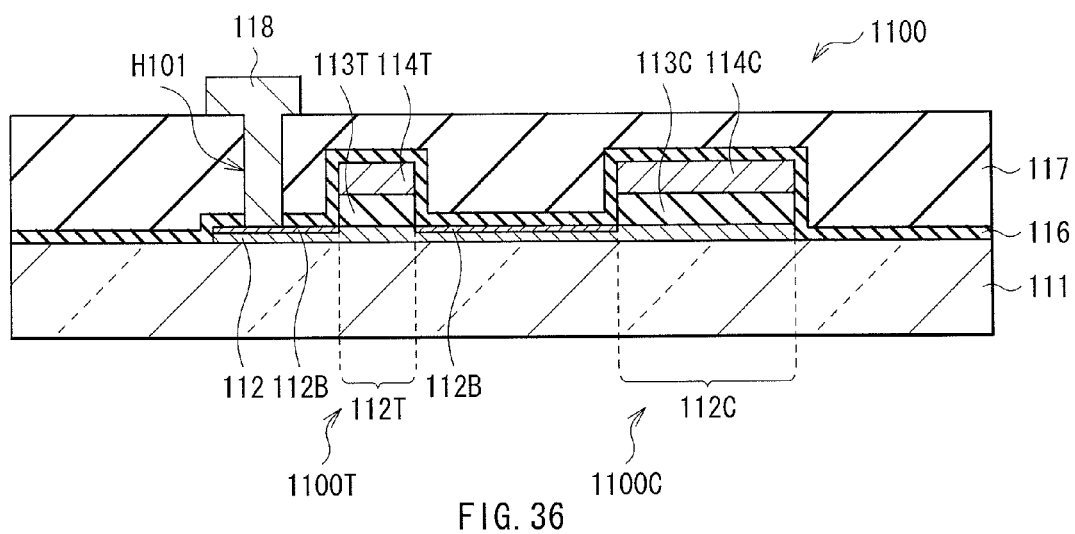
FIG. 36 is a sectional diagram illustrating a main part of a display according to a comparative example 2.

FIG. 36 illustrates a cross-sectional structure of a transistor (a transistor 100T) and a retention capacitor (a retention capacitor 100C) of a display (a display 100) according to a comparative example 2. The transistor 100T does not include an etching protection film, and the pair of source-drain electrodes 118 (one of them is not illustrated) is directly connected to the low resistance regions 112B of the oxide semiconductor film 112.

Figure 37A:
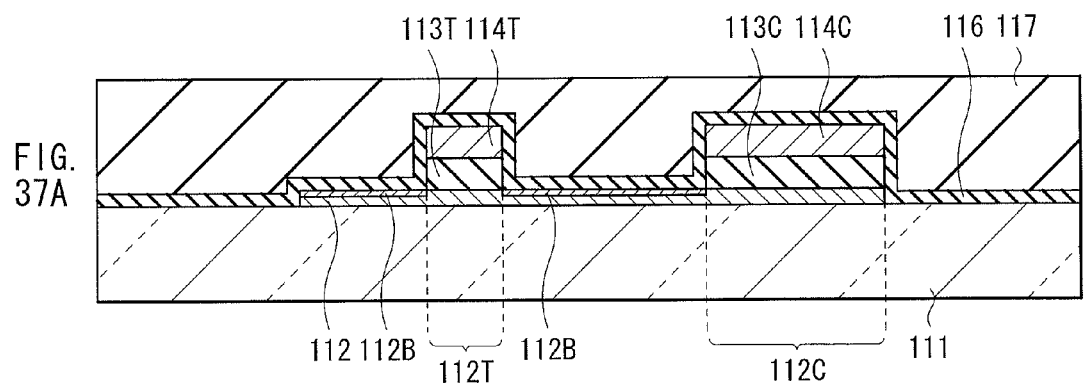
FIGS. 37A and 37B are sectional diagrams illustrating a method of manufacturing the display illustrated in FIG. 36 in a process order.
Figure 37B:
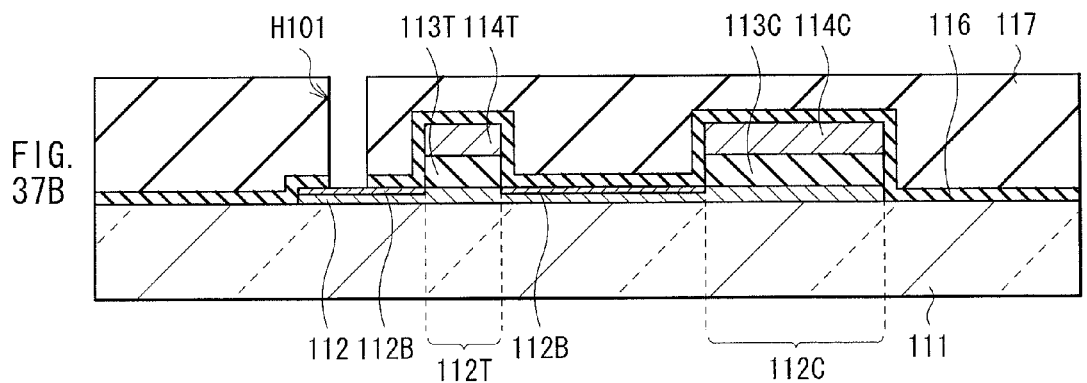

In such a transistor 100T, it is difficult to selectively etch only the oxide film 116 out of the oxide semiconductor film 112 and the oxide film 116 to form the contact hole H101 (FIGS. 37A and 37B). This is because the etching rate of the oxide film 116 is lower than that of the oxide semiconductor film 112.

In contrast, in the transistor 110T, the etching protection films 115A and 115B are provided on the oxide semiconductor film 112. Therefore, the etching rate of the etching protection films 115A and 115B is adjusted to enhance the etching selectivity to the oxide film 116. In other words, the contact hole H101 penetrating the oxide film 116 is easily formed above the etching protection films 115A and 115B. For example, when each of the etching protection films 115A and 115B is a molybdenum film and the oxide film 116 is an aluminum oxide film, only the oxide film 116 is easily removed by using diluted hydrofluoric acid. Accordingly, electrical connection between the source-drain electrodes 118 and the low resistance regions 112B of the oxide semiconductor film 112 (the etching protection film 115A) is ensured without etching the oxide semiconductor film 112.

Moreover, although the protection film 116P is preferably provided on the oxide film 116 as described above, many of the materials used for the protection film 116P with high barrier function are highly resistant to etching. In the transistor 110T, even when the thick protection film 116P with high barrier function is provided, the oxide semiconductor film 112 is allowed to be protected by the etching protection films 115A and 115B.

After formation of the contact hole H101, a conductive film (not illustrated) that is made of the material of the source-drain electrodes 118 described above is formed by, for example, sputtering on the interlayer insulating film 117, and the contact hole H101 is filled with the conductive film. After that, the conductive film is patterned into a predetermined shape by, for example, photolithography and etching. As a result, the pair of source-drain electrodes 118 is formed on the interlayer insulating film 117, and the source-drain electrodes 118 are electrically connected to the etching protection films 115A and 115B through the contact hole H101 (FIG. 35C). Consequently, the transistor 110T and the retention capacitor 110C are formed on the substrate 111.

[Process of Forming Planarizing Film 119]

Subsequently, the planarizing layer 119 made of the above-described material is formed by, for example, spin coating or slit coating so as to cover the interlayer insulating film 117 and the source-drain electrodes 118, and then the contact hole H102 is formed in a part of a region facing the source-drain electrodes 118, of the planarizing film 119.

[Process of Forming Organic EL Device 120]

Subsequently, the organic EL device 120 is formed on the planarizing layer 119. Specifically, the first electrode 121 made of the above-described material is formed by, for example, sputtering so as to fill the contact hole H102 on the planarizing layer 119. Then, the first electrode 121 formed is patterned by photolithography and etching. After that, after formation of the pixel separation film 122 having an opening on the first electrode 121, the organic layer 123 is formed by, for example, vacuum deposition. Subsequently, the second electrode 124 made of the above-described material is formed by, for example, sputtering on the organic layer 123. Then, after the protection layer 125 is formed by, for example, CVD on the second electrode 124, the sealing substrate 127 is bonded to the protection layer 125 with use of the adhesive layer 126. As a result, the display 101 illustrated in FIG. 25 is completed.

In the display 101, for example, when each of the pixels PXLC corresponding to any of R, G, and B is supplied with a drive current corresponding to an image signal of each color, electrons and holes are injected into the organic layer 123 through the first electrode 121 and the second electrode 124. These electrons and holes are recombined in the organic EL layer included in the organic layer 123 to emit light. In this way, in the display 101, for example, a full color image of R, G, and B is displayed. In addition, when potential corresponding to the image signal is applied to one end of the retention capacitor 110C at the time of image display operation, charge corresponding to the image signal is accumulated in the retention capacitor 110C.

In this case, since the etching protection films 115A and 115B are provided on the oxide semiconductor film 112, it is possible to easily form the contact hole H101 penetrating the oxide film 116, and to connect the source-drain electrodes 118 and the etching protection films 115A and 115B. In other words, the oxide semiconductor film 112 is electrically connected to the source-drain electrodes 118 through the etching protection films 115A and 115B without being etched.

In addition, in the display 101, it is possible to eliminate voltage dependency of the retention capacitor 110C and to enhance display quality.

The retention capacitor 100C of the comparative example 2 (FIG. 36) is configured of the oxide semiconductor film 112, the capacity insulating film 113C, and the upper electrode 114C. The section configuring the retention capacitor 100C in the oxide semiconductor film 112 is a capacity region 112C having the resistivity same as that of the channel region 112T. In such a retention capacitor 100C, since the lower electrode is configured of the oxide semiconductor film 112, voltage dependency may occur in the capacity and display quality may be lowered.

In contrast, in the display 101, the lower electrode of the retention capacitor 110C is configured of an electrode region 115C of the etching protection film 115B. Therefore, the capacity of the retention capacitor 110C is constantly sufficiently ensured irrespective of the magnitude of the applied voltage. Consequently, high display quality is achievable in the display 101.

As described above, in the third embodiment, the etching protection films 115A and 115B are provided. Therefore, the oxide semiconductor film 112 is prevented from being damaged in manufacturing, and the electrical characteristics of the transistor 110T are improved. In addition, the voltage dependency of the retention capacitor 110C is eliminated and high display quality is achievable. In other words, it is possible to improve the electrical characteristics of the transistor 110T and to realize stabilization of the capacity of the retention capacitor 110C with small number of processes.

Furthermore, it becomes possible to provide a thick protection film 116P with a high barrier function on the oxide film 116, and thus, the electrical characteristics of the transistor 110T is allowed to be stabilized.

Hereinafter, although modifications of the third embodiment and other embodiments will be described, like numerals are used to designate substantially like components of the third embodiment, and the description thereof will be appropriately omitted.

[Modification 3]

Figure 38:
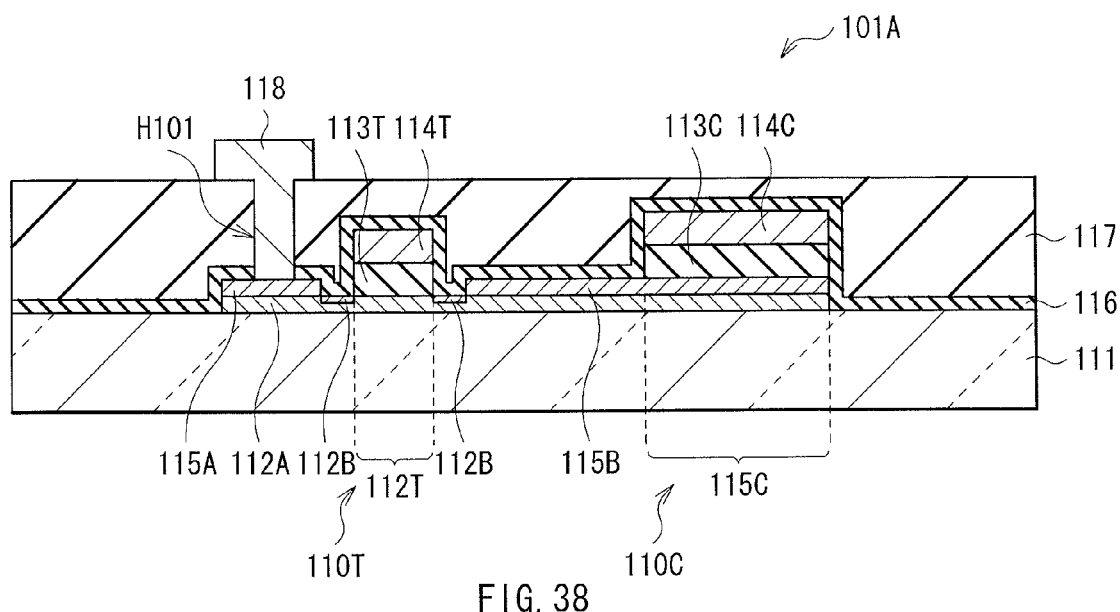
FIG. 38 is a sectional diagram illustrating a structure of a display according to a modification 3.

FIG. 38 illustrates a cross-sectional structure of the transistor 110T and the retention capacitor 110C of a display (a display 101A) according to a modification 3 of the above-described third embodiment. In the display 101A, an oxide semiconductor film (an oxide semiconductor film 112A) of the transistor 110T extends between the retention capacitor 110C and the substrate 111. Except for this point, the display 101A has a similar structure to that of the display 101 of the third embodiment and has similar function and effects.

The oxide semiconductor film 112A is provided so as to be in contact with the entire bottom surface (the counter surface to the substrate 111) of the etching protection film 115B, and each of the positions of the side surfaces of the oxide semiconductor film 112A is coincide with the side surface (a surface opposite to the counter surface) of each of the channel protection films 115A and 115B in a planar view. Such an oxide semiconductor film 112A and such etching protection films 115A and 115B are allowed to be formed in one photolithography process.

Figure 39A:
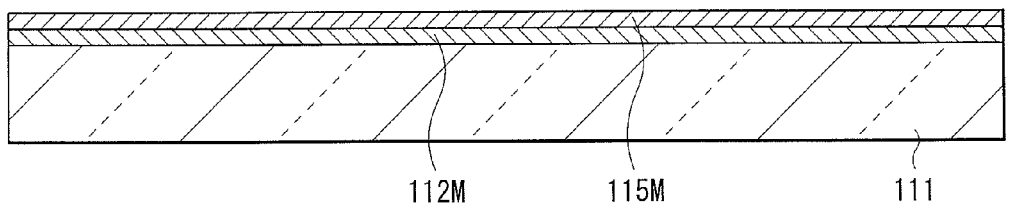
FIGS. 39A and 39B are sectional diagrams illustrating a method of manufacturing the display illustrated in FIG. 38 in a process order.
Figure 39B:
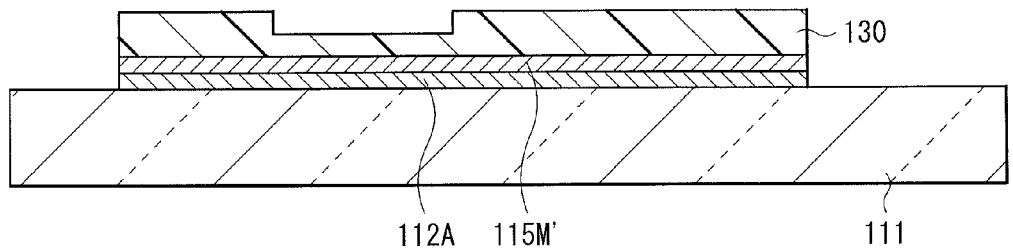

First, as illustrated in FIG. 39A, a semiconductor material film 112M made of a material of the oxide semiconductor film 112A and a protection material film 115M made of the material of the etching protection films 115A and 115B are formed in this order on the entire surface of the substrate 111 by, for example, sputtering. Subsequently, a resist (a resist 130) whose film thickness is varied depending on positions in plane is formed on the protection material film 115M by photolithography using a half tone mask, and then the semiconductor material film 112M is etched to form the oxide semiconductor film 112A (FIG. 39B). At this time, the protection material film 115M is etched together with the semiconductor material film 112M to form a protection material film 115M' that has the same shape as that of the oxide semiconductor film 112A in a planer view. In other words, the positions of the side surfaces of the oxide semiconductor film 112A are coincide with the positions of the side surfaces of the protection material film 115M' (the etching protection films 115A and 115B). The resist 130 on a position facing a region that is to be formed with the channel region 112T and the low resistance region 112B of the oxide semiconductor film 112A is formed to have a thickness smaller than that of the other parts, by half tone mask.

Subsequently, the entire surface of the resist 130 is ashed by oxygen plasma or the like to remove a thin part of the resist 130, and then the exposed part of the protection material film 115M' is etched. As a result, the etching protection films 115A and 115B are formed. In the etching of the protection material film 115M', as described in the third embodiment, for example, wet etching using the liquid mixture of phosphoric acid, nitric acid, and acetic acid or dry etching in gas atmosphere containing fluorine and the like may be used.

Figure 40A:
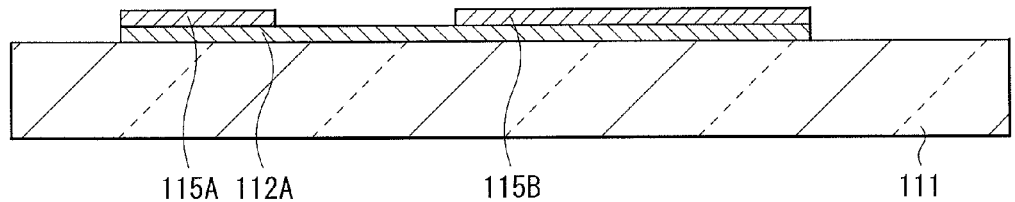
FIGS. 40A and 40B are sectional diagrams illustrating processes following the process of FIG. 39B.
Figure 40B:
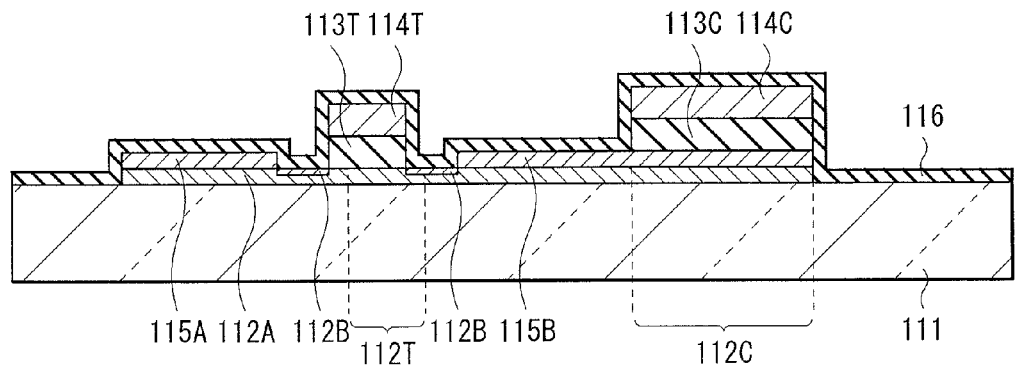

After formation of the etching protection films 115A and 115B, the remaining resist 130 is removed (FIG. 40A), and the gate insulating film 113T, the capacity insulating film 113C, the gate electrode 114T, the upper electrode 114C, and the oxide film 116 are provided on the substrate 111 as well as the low resistance regions 112B are formed in the oxide semiconductor film 112A (FIG. 40B). Subsequently, the interlayer insulating film 117 and the source-drain electrodes 118 are formed in a manner similar to that in the third embodiment, and thus the transistor 110T and the retention capacitor 110C are completed. In such a display 101A, the transistor 110T having high electrical characteristics and the retention capacitor 110C with stable capacity are obtainable without adding the photolithography process.

[Modification 4]

FIGS. 41A to 41C each illustrate a cross-sectional structure of the transistor 110T and the retention capacitor 110C of a display (a display 101B) according to a modification 4 of the third embodiment. The display 101B includes a wiring 131 that electrically connects the low resistance region 112B of the oxide semiconductor film 112 and the etching protection film 115B having the electrode region 115C. Except for this point, the display 101B has a similar structure to that of the display 101 of the third embodiment, and has similar function and effects.

The wiring 131 connect the transistor 110T and the retention capacitor 110C in electrically stable state, and is formed of, for example, a conductive material similar to that of the source-drain electrodes 118. The wiring 131 fills a contact hole (a contact hole H104) penetrating the interlayer insulating film 117 and the oxide film 116, and is in contact with the low resistance region 112B of the oxide semiconductor film 112 and the etching protection film 115B. Although the wiring 131 may be formed in the same layer as the source-drain electrodes 118 by the same process, the wiring 131 may be provided in a different layer from the source-drain electrodes 118 by a different process. As illustrated in FIG. 41A, the source-drain electrode 118 and the etching protection film 115A may be connected to each other through a contact hole H103 provided in a position facing the outside of the oxide semiconductor film 112, or through the contact hole H101 provided in a position facing the oxide semiconductor film 112 as illustrated in FIG. 41B. In addition, as illustrated in FIG. 41C, the position of each of the side surfaces of the oxide semiconductor film 112 and the positions of the side surfaces of the etching protection films 115A and 115B may be aligned. The wiring 131 may configure one of the source-drain electrodes.

Fourth Embodiment

Figure 42:
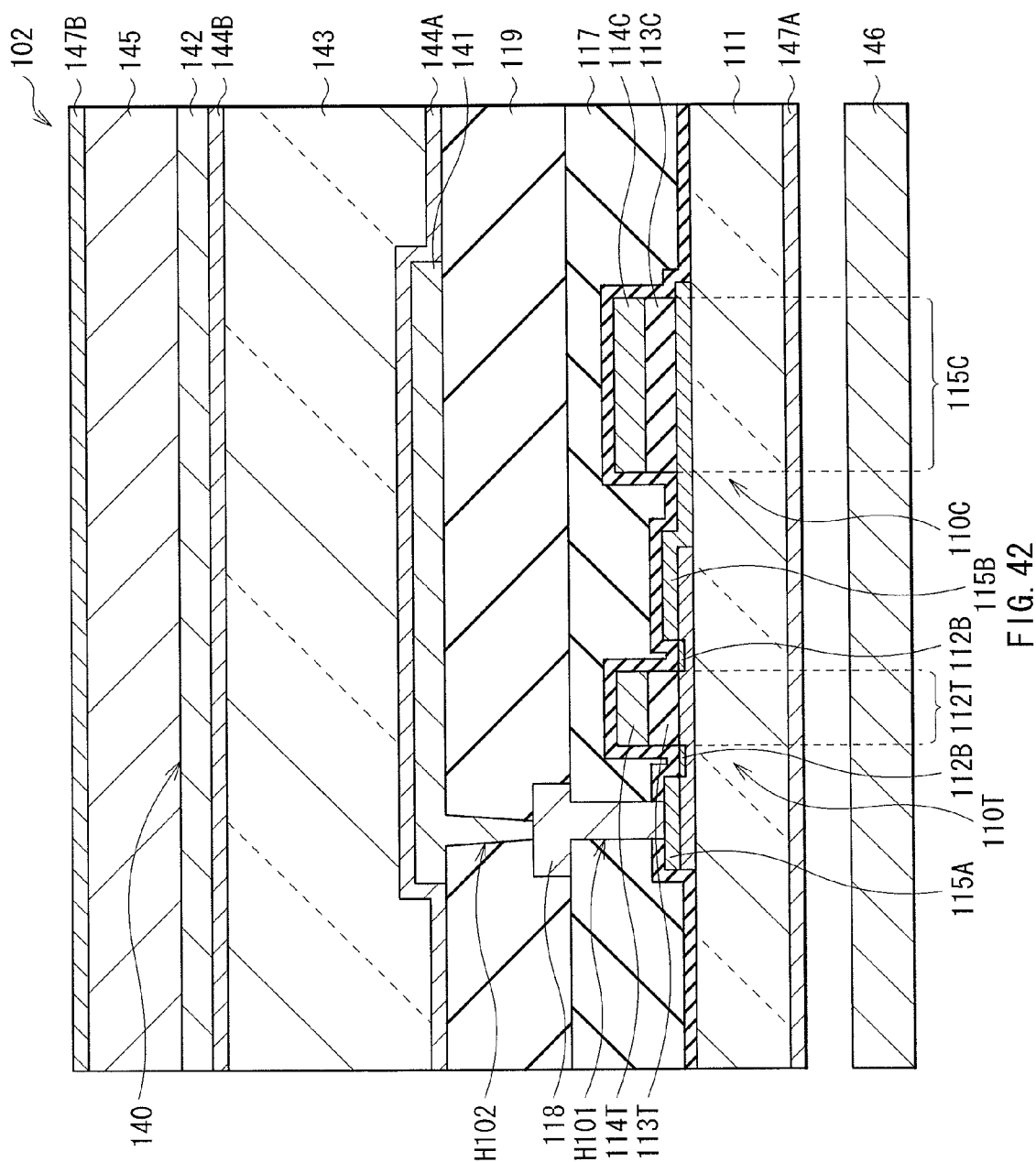
FIG. 42 is a sectional diagram illustrating a structure of a display according to a fourth embodiment of the application.

FIG. 42 illustrates a cross-sectional structure of a display (a display 102) according to a fourth embodiment of the application. The display 102 includes a liquid crystal display device 140 in place of the organic EL device 120 of the third embodiment (the display 101). Except for this point, the display 102 has a similar structure to that of the display 101 of the third embodiment, and has similar function and effects.

The display 102 includes the transistor 110T and the retention capacitor 110C similar to those of the display 101, and the liquid crystal display device 140 is provided in a layer above the transistor 110T and the retention capacitor 110C with the planarizing layer 119 in between.

The liquid crystal display device 140 is configured by, for example, sealing the liquid crystal layer 143 between the pixel electrode 141 and the counter electrode 142, and alignment films 144A and 144B are provided on a surface on the liquid crystal layer 143 side of each of the pixel electrode 141 and the counter electrode 142, respectively. The pixel electrode 141 is provided for each pixel, and is electrically connected to, for example, the source-drain electrodes 118 of the transistor 110T. The counter electrode 142 is provided on the counter substrate 145 as an electrode common to the plurality of pixels, and is maintained at a common potential, for example. The liquid crystal layer 143 is configured of a liquid crystal driven by, for example, vertical alignment (VA) mode, twisted nematic (TN) mode, or in plane switching (IPS) mode.

In addition, a backlight 146 is provided below the substrate 111, a polarization plate 147A is bonded on the backlight 146 side of the substrate 111, and a polarization plate 147B is bonded on the counter substrate 145.

The backlight 146 is a light source irradiating light toward the liquid crystal layer 143, and includes a plurality of light emitting diodes (LEDs), a plurality of cold cathode fluorescent lamps (CCFLs), or the like. Light emission state and light extinction state of the backlight 146 are controlled by a backlight drive section (not illustrated).

The polarization plates 147A and 147B (polarizer or analyzer) are disposed in crossed-Nicols with each other, and this allows illumination light from the backlight 146 to be blocked in a no-voltage applied state (off state), and to pass therethrough in a voltage applied state (on state).

In the display 102, similarly to the display 101 of the third embodiment, the oxide semiconductor film 112 is protected by the etching protection films 115A and 115B. Therefore, also in the forth embodiment, the electrical characteristics of the transistor 110T are allowed to be improved.

Fifth Embodiment

Figure 43:
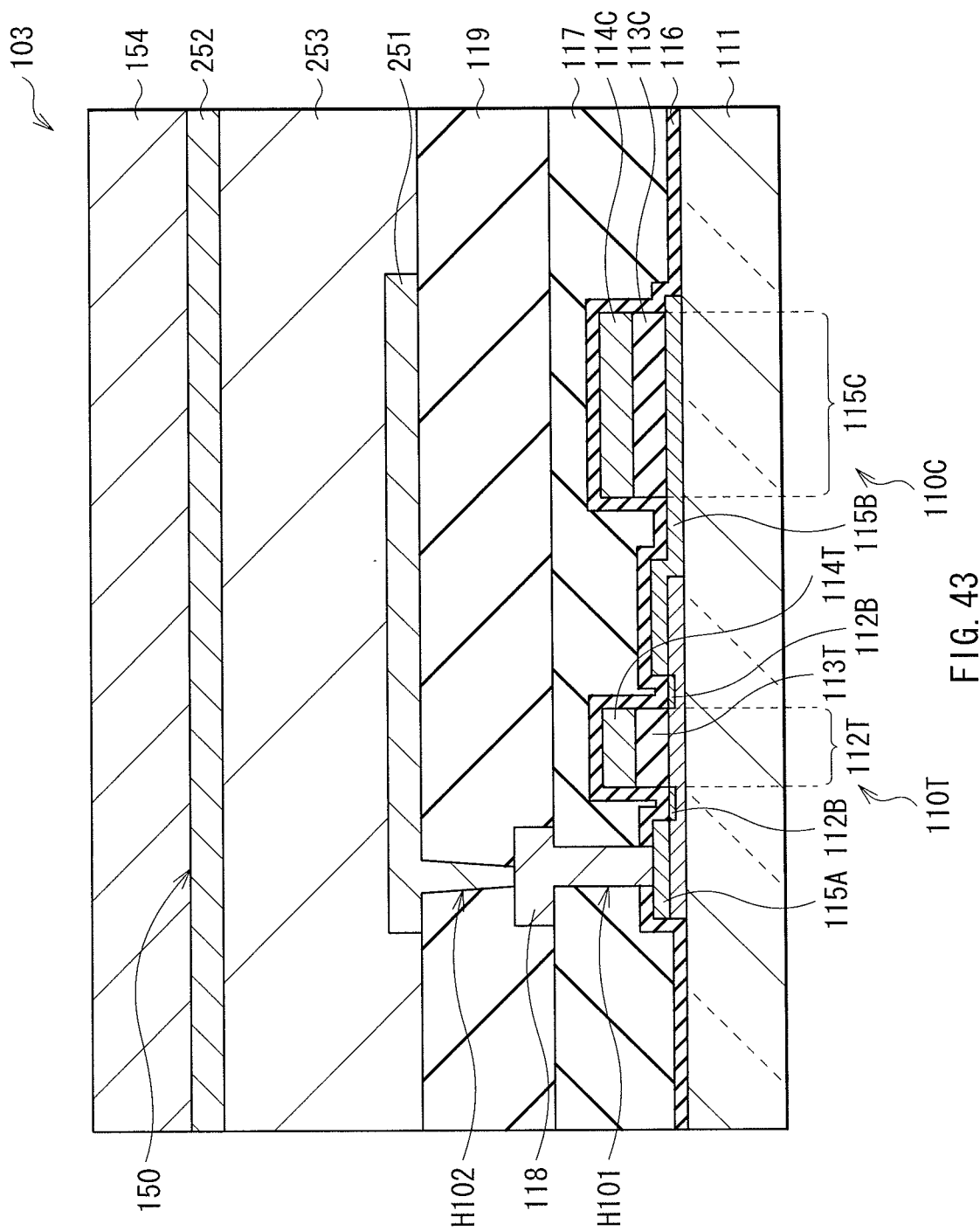
FIG. 43 is a sectional diagram illustrating a structure of a display according to a fifth embodiment of the application.

FIG. 43 illustrates a cross-sectional structure of a display (a display 103) according to a fifth embodiment of the application. The display 103 is a so-called electronic paper, and has an electrophoretic display device 150 in place of the organic EL device 120 of the display 101. Except for this point, the display 103 has a configuration similar to that of the display 101 of the third embodiment, and has similar function and effects.

The display 103 has the transistor 110T and the retention capacitor 110C similar to those of the display 101, and the electrophoretic display device 150 is provided in a layer above the transistor 110T and the retention capacitor 110C with the planarizing film 119 in between.

The electrophoretic display device 150 is configured by, for example, sealing a display layer 253 formed of an electrophoretic display substance between a pixel electrode 251 and a common electrode 252. The pixel electrode 251 is provided for each pixel, and is electrically connected to the source-drain electrode 118 of the transistor 110T, for example. The common electrode 252 is provided on a counter substrate 154 as an electrode common to the plurality of pixels.

In the display 103, similarly to the display 101 of the third embodiment, the oxide semiconductor film 112 is protected by the etching protection films 115A and 115B. Therefore, also in the fifth embodiment, the electrical characteristics of the transistor 110T are allowed to be improved.

APPLICATION EXAMPLES

Hereinafter, application examples of the above-described displays (the displays 1, 1A, 1B, 2, 101, 101A, 101B, 102, and 103) to electronic apparatuses will be described. Examples of the electronic apparatuses include, without limitation, a television, a digital camera, a notebook personal computer, mobile terminal devices such as a mobile phone, and a video camera. In other words, any of the above-described displays is applicable to electronic apparatuses in various fields that display an externally input image signal or an internally generated image signal as an image or a picture.

[Module]

Figure 17:
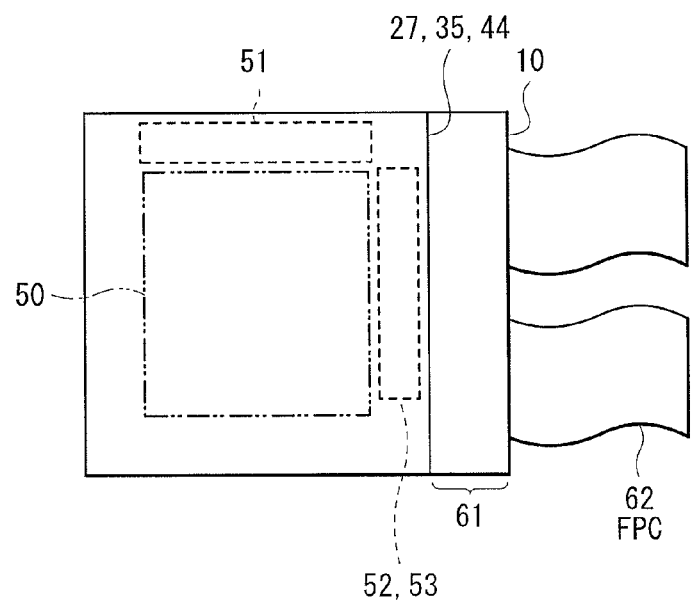

Any of the above-described displays is incorporated in various kinds of electronic apparatuses such as electronic apparatuses according to application examples 1 to 7 described below, as a module illustrated in FIG. 17, for example. In the module, for example, a region 61 that is exposed from the sealing substrate 27 or 127 or the counter substrate 35, 44, 145 or 154 is provided on one side of the substrate 11 or 111, and wirings of the horizontal selector 51 or 151, the write scanner 52 or 152, and the power scanner 53 or 153 are extended to configure an external connection terminal (not illustrated) in the exposed region 61. The external connection terminal may be provided with a flexible printed circuit (FPC) 62 for inputting and outputting signals.

Application Example 1

Figure 18A:
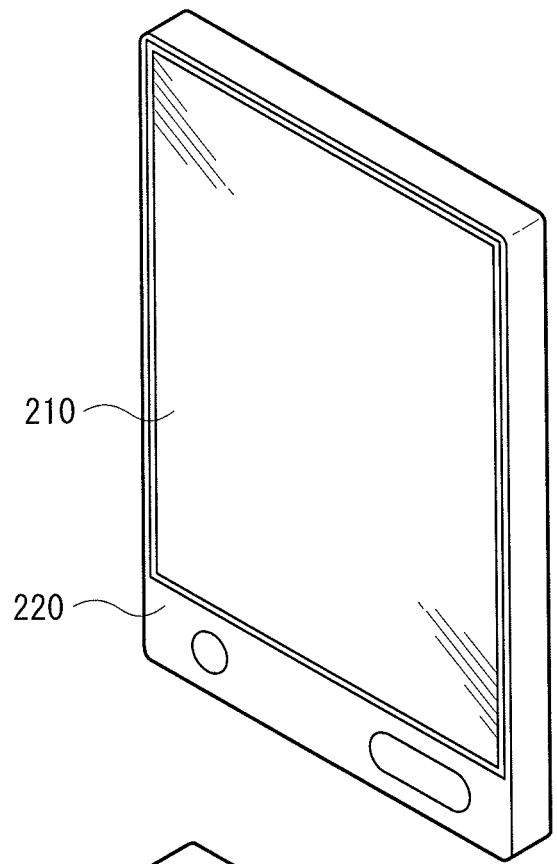
Figure 18B:
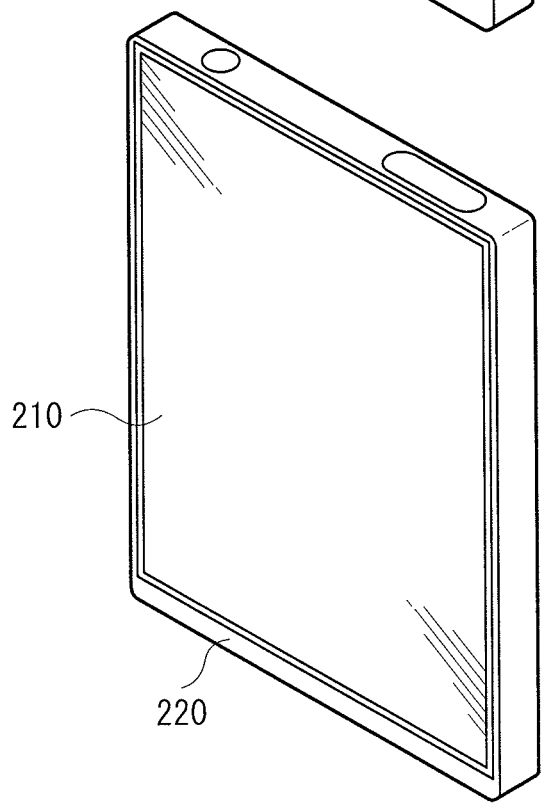

FIGS. 18A and 18B each illustrate an appearance of an electronic book to which any of the displays of the above-described embodiments is applied. The electronic book includes, for example, a display section 210 and a non-display section 220, and the display section 210 is configured of any of the displays of the above-described embodiments.

Application Example 2

Figure 19:
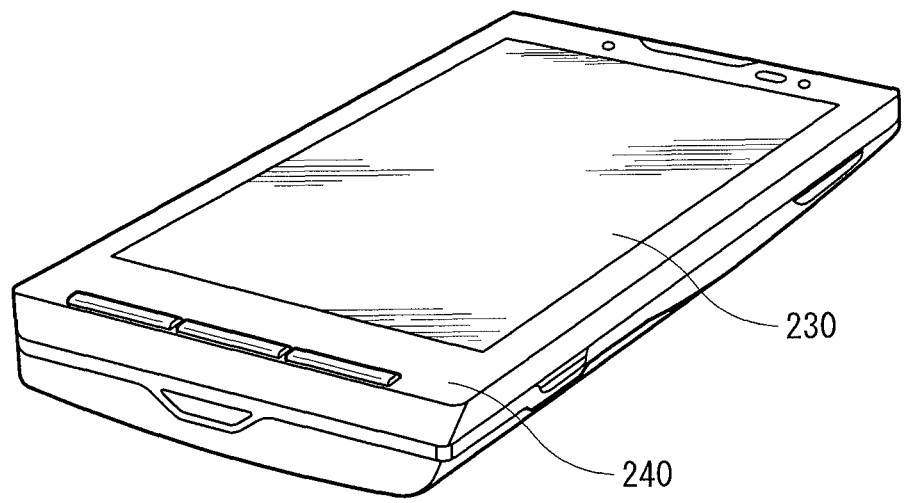
FIG. 19 is a perspective view illustrating an appearance of an application example 2.

FIG. 19 illustrates an appearance of a smartphone to which any of the displays of the above-described embodiments is applied. The smartphone includes, for example, a display section 230 and a non-display section 240, and the display section 230 is configured of any of the displays of the above-described embodiments.

Application Example 3

Figure 20:
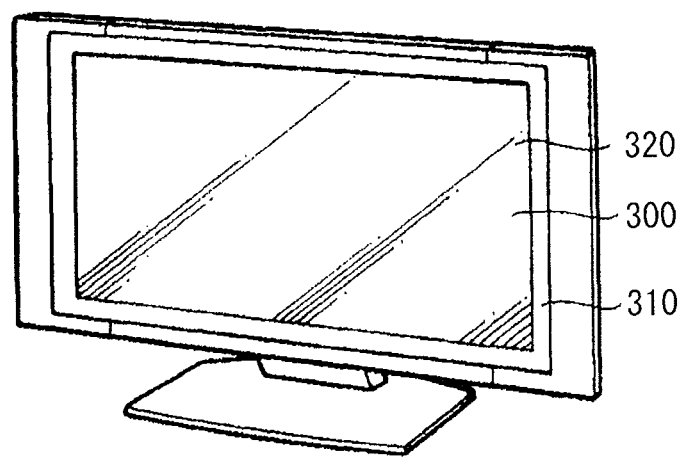
FIG. 20 is a perspective view illustrating an appearance of an application example 3.

FIG. 20 illustrates an appearance of a television to which any of the displays of the above-described embodiments is applied. The television includes, for example, an image display screen section 300 including a front panel 310 and a filter glass 320, and the image display screen section 300 is configured of any of the displays of the above-described embodiments.

Application Example 4

Figure 21A:
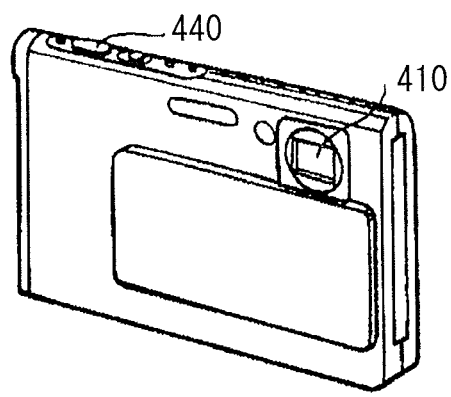
FIG. 21A is a perspective view illustrating an appearance of an application example 4 viewed from a front side thereof.
Figure 21B:
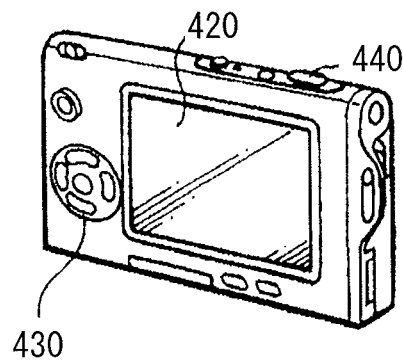
FIG. 21B is a perspective view illustrating the appearance viewed from a back side thereof.

FIGS. 21A and 21B each illustrate an appearance of a digital camera to which any of the displays of the above-described embodiments is applied. The digital camera includes, for example, a light emitting section 410 for generating flash light, a display section 420, a menu switch 430, and a shutter button 440. The display section 420 is configured of any of the displays of the above-described embodiments.

Application Example 5

Figure 22:
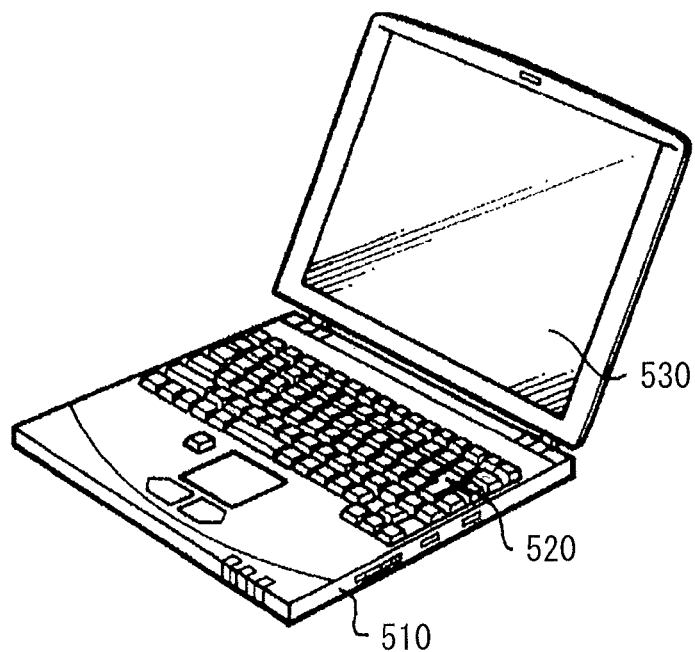
FIG. 22 is a perspective view illustrating an appearance of an application example 5.

FIG. 22 illustrates an appearance of a notebook personal computer to which any of the displays of the above-described embodiments is applied. The notebook personal computer includes, for example, a main body 510, a keyboard 520 for inputting letters and the like, and a display section 530 displaying an image. The display section 530 is configured of any of the displays of the above-described embodiments.

Application Example 6

Figure 23:
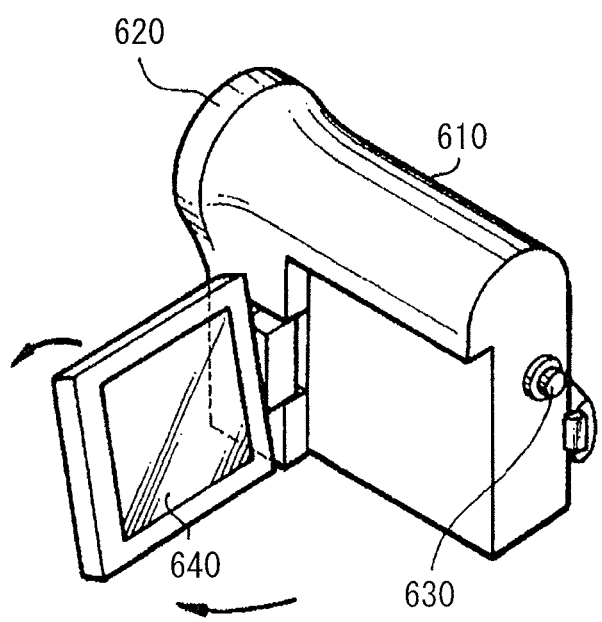
FIG. 23 is a perspective view illustrating an appearance of an application example 6.
Figure 24:
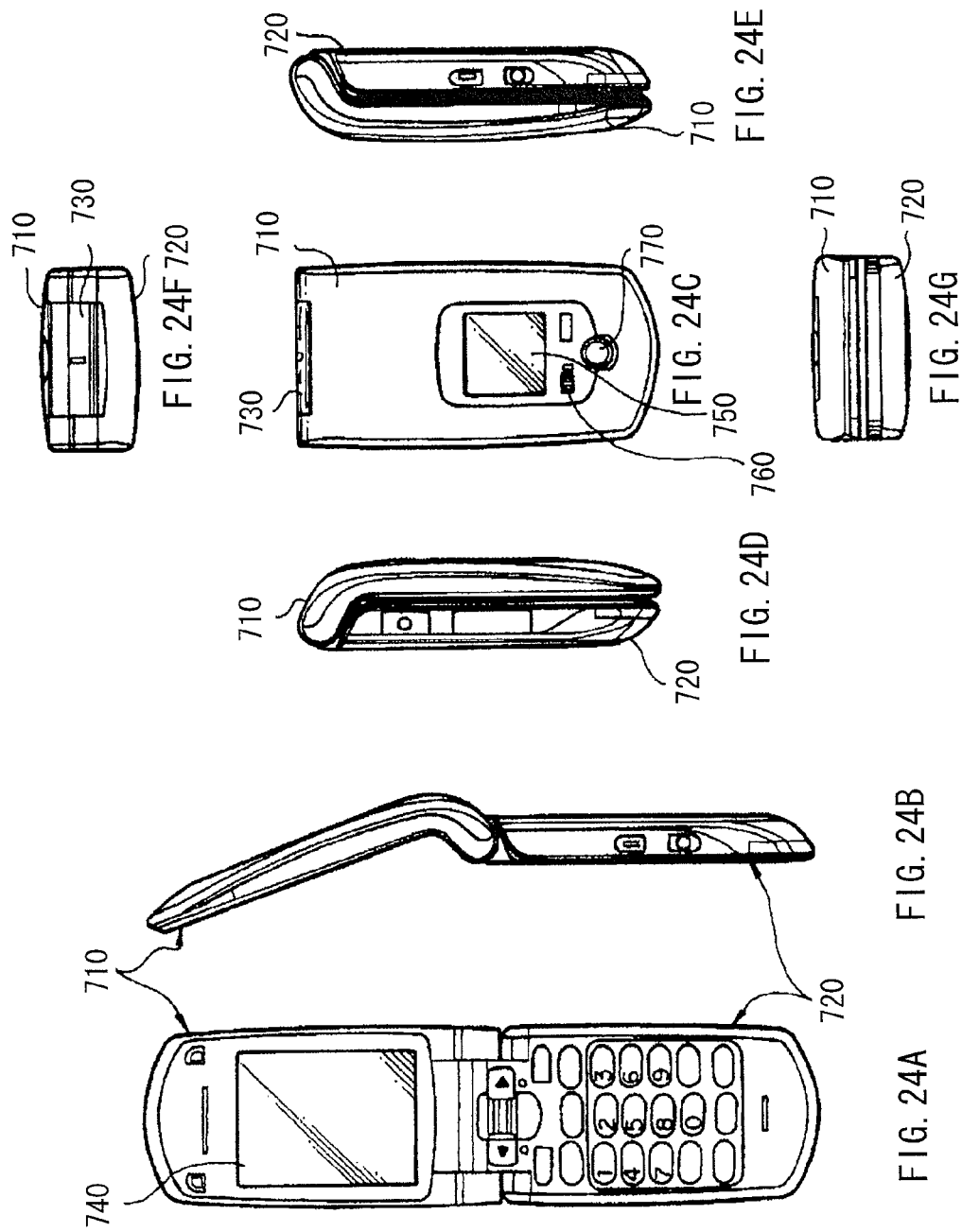
FIG. 24A is a front view of an application example 7 in an open state.
FIG. 24B is a side view thereof.
FIG. 24C is a front view of the application example 7 in a closed state.
FIG. 24D is a left side view.
FIG. 24E is a right side view.
FIG. 24F is a top view.
FIG. 24G is a bottom view.

FIG. 23 illustrates an appearance of a video camera to which any of the displays of the above-described embodiments is applied. The video camera includes, for example, a main body section 610, a lens 620 that is provided on a front side of the main body section 610 and configured to take an image of a subject, a start-stop switch 630 that is used when taking an image, and a display section 640. The display section 640 is configured of any of the displays of the above-described embodiments.

Application Example 7

FIGS. 24A to 24G each illustrate an appearance of a mobile phone to which any of the displays of the above-described embodiments is applied. The mobile phone is configured by connecting, for example, an upper housing 710 and a lower housing 720 with a connecting section (a hinge section) 730, and includes a display 740, a sub display 750, a picture light 760, and a camera 770. Among these components, the display 740 or the sub display 750 is configured of any of the displays of the above-described embodiments.

Hereinbefore, although the application has been described with reference to the embodiments and the modifications, the application is not limited to the embodiments and the like, and various modifications may be made. For example, in the above-described first and second embodiments and the like, the structure including the high resistance film 15 has been described as an example. However, the high resistance film 15 may be removed after formation of the low resistance regions 12B. Incidentally, as described above, the high resistance film 15 is preferably provided because the electrical characteristics of the transistor 10T and the retention capacitor 10C are maintained stably.

Moreover, in the above-described first and second embodiments and the like, the top-gate transistor 10T (or the transistor 70T) including the oxide semiconductor film 12, the gate insulating film 13T, and the gate electrode 14T in this order on the substrate 11 (or the substrate 71) has been described. However, the application is applicable to a bottom-gate transistor including the gate electrode 14T, the gate insulating film 13T, and the oxide semiconductor film 12 in this order on the substrate 11. Incidentally, the application prevents infiltration of moisture more effectively in the case where the oxide semiconductor film 12 is provided closer to the substrate 11, that is, in the case of the top-gate transistor 10T.

Furthermore, in the above-described first and second embodiments and the like, the case where moisture diffusion from the interlayer insulating film 16 into the oxide semiconductor film 12 is caused by annealing process in manufacturing has been described. However, the substrate 11 prevents permeation of moisture also in use.

In addition, in the above-described first and second embodiments and the like, the case where the low resistance region 12B is provided in a part of the thickness direction from the surface (the top surface) of the region other than the channel region 12C of the oxide semiconductor film 12 has been described. However, the low resistance region 12B may be provided in the entire part of the thickness direction from the surface (the top surface) of the oxide semiconductor film 12.

Moreover, the material and the thickness of each of the layers and the film formation method and the film formation condition described in the above-described first and second embodiments and the like are not limited and other material and other thickness or other film formation method and other film formation condition may be used.

Furthermore, in the above-described first and second embodiments and the like, the configuration of each of the organic EL device 20, the liquid crystal display device 30, the electrophoretic display device 40, the transistor 10T, and the retention capacitor 10C has been described specifically. However, all of the layers are not necessarily provided, and other layer may be further provided.

In addition, the application is applicable to a display using other display device such as an inorganic electroluminescence device, besides the organic EL device 20, the liquid crystal display device 30, and the electrophoretic display device 40.

Figure 44:
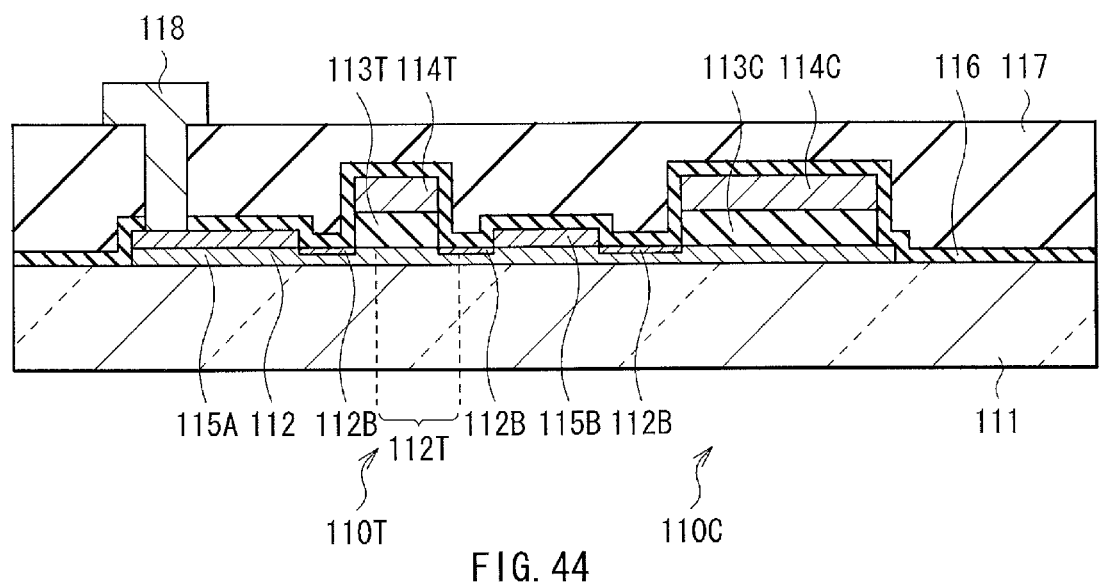
FIG. 44 is a sectional diagram illustrating another example of a retention capacitor illustrated in FIG. 25.

For example, in the above-described third to fifth embodiments and the like, the etching protection film 115B having the electrode region 115C has been described. Alternatively, as illustrated in FIG. 44, the lower electrode of the retention capacitor 110C may be configured of a part of the oxide semiconductor film 112.

In addition, in the above-described third to fifth embodiment and the like, the case where the low resistance region 112B is provided in a part of the thickness direction from the surface (the top surface) of the region adjacent to the channel region 112C has been described. However, the low resistance region 112B may be provided in entire part of the thickness direction from the surface (the top surface) of the oxide semiconductor film 112.

Further, the material and the thickness of each of the layers and the film formation method and the film formation condition described in the above-described third to fifth embodiments are not limited, and other material and other thickness or other film formation method and other film formation condition may be used.

In addition, in the above-described third to fifth embodiments and the like, the configuration of each of the organic EL device 120, the liquid crystal display device 130, the electrophoretic display device 140, the transistor 110T, and the retention capacitor 110C has been described specifically. However, all of the layers are not necessarily provided, and other layer may be further provided. For example, FIGS. 39A and 39B and FIGS. 40A and 40B each illustrate the transistor 110T and the retention capacitor 110C illustrated in FIG. 25. However, the liquid crystal display device 130 or the electrophoretic display device 140 may be provided on the transistor 110T and the retention capacitor 110C illustrated in FIG. 38 (the modification 3) or FIGS. 41A to 41C (the modification 4).

Furthermore, the application is applicable to a display device using other display device such as an inorganic electroluminescence device, besides the organic EL device 120, the liquid crystal display device 130, and the electrophoretic display device 140. In addition, in the third to fifth embodiments and the like, a semiconductor unit having a display device as a functional device, that is, a display has been described. However, the application is applicable to a semiconductor unit having other functional device, for example, a sensor having a photodetection device.

In addition, for example, the configuration of the display has been described specifically in the above-described third to fifth embodiments. However, all of the components are not necessarily provided, and other components may be further provided.

Note that the application may be configured as follows.

(1) A method of manufacturing a transistor including:
forming an oxide semiconductor film and a gate electrode on a substrate, the oxide semiconductor film having a channel region, and the gate electrode facing the channel region; and
forming an insulating film covering the gate electrode and the oxide semiconductor film, wherein
infiltration of moisture from the insulating film into the oxide semiconductor film is suppressed by the substrate.

(2) The method according to (1), wherein the substrate is formed of glass.

(3) The method according to (1) or (2), wherein the oxide semiconductor film is formed to be in contact with the substrate.

(4) The method according to any one of (1) to (3), further including:
forming a metal film in contact with a region of the oxide semiconductor film other than the channel region; and
forming a high resistance film and forming a low resistance region on the oxide semiconductor film, by carrying out a first heat treatment on the metal film.

(5) The method according to (4), further including:
forming source-drain electrodes, and electrically connecting the source-drain electrodes to the low resistance region; and
carrying out a second heat treatment after formation of the source-drain electrodes.

(6) The method according to (5), wherein the second heat treatment is carried out at a temperature of about 300° C. or more.

(7) The method according to (1), wherein the substrate includes a moisture diffusion preventing film on the surface thereof.

(8) The method according to (7), wherein the oxide semiconductor film is formed to be in contact with the diffusion preventing film.

(9) The method according to (7) or (8), wherein the diffusion preventing film is formed on a plate-like member made of a resin material to form the substrate.

(10) The method according to any one of (7) to (9), wherein the diffusion preventing film includes one of a silicon oxide film, a silicon nitride film, and an aluminum oxide film.

(11) A transistor including:
an oxide semiconductor film and a gate electrode on a substrate, the oxide semiconductor film having a channel region, and the gate electrode facing the channel region; and
an insulating film covering the gate electrode and the oxide semiconductor film, wherein
infiltration of moisture from the insulating film into the oxide semiconductor film is suppressed by the substrate.

(12) A display provided with a display device and a transistor driving the display device, the transistor including:
an oxide semiconductor film and a gate electrode on a substrate, the oxide semiconductor film having a channel region, and the gate electrode facing the channel region; and
an insulating film covering the gate electrode and the oxide semiconductor film, wherein
infiltration of moisture from the insulating film into the oxide semiconductor film is suppressed by the substrate.

(13) The display according to (12), wherein a retention capacitor shearing the oxide semiconductor film with the transistor is included.

(14) An electronic apparatus with a display, the display provided with a display device and a transistor driving the display device, the transistor including:
an oxide semiconductor film and a gate electrode on a substrate, the oxide semiconductor film having a channel region, and the gate electrode facing the channel region; and
an insulating film covering the gate electrode and the oxide semiconductor film, wherein
infiltration of moisture from the insulating film into the oxide semiconductor film is suppressed by the substrate.

(15) A transistor including:
a gate electrode;
an oxide semiconductor film having a channel region that faces the gate electrode;
an etching protection film, at least a part of the etching protection film being in contact with the oxide semiconductor film;
an oxide film covering the gate electrode and the etching protection film, the oxide film being in contact with the oxide semiconductor film between the gate electrode and the etching protection film; and
source-drain electrodes electrically connected to the etching protection film through a through-hole of the oxide film.

(16) The transistor according to (15), further including a low resistance region in a part of the oxide semiconductor film, the part being in contact with the oxide film.

(17) The transistor according to (15) or (16), wherein the etching protection film contains one of a molybdenum film, an aluminum film containing neodymium, and indium tin oxide (ITO).

(18) A semiconductor unit provided with a transistor, the transistor including:
a gate electrode;
an oxide semiconductor film having a channel region that faces the gate electrode;
an etching protection film, at least a part of the etching protection film being in contact with the oxide semiconductor film;
an oxide film covering the gate electrode and the etching protection film, the oxide film being in contact with the oxide semiconductor film between the gate electrode and the etching protection film; and
source-drain electrodes electrically connected to the etching protection film through a through-hole of the oxide film.

(19) A display provided with a display device and a transistor driving the display device, the transistor including:
a gate electrode;
an oxide semiconductor film having a channel region that faces the gate electrode;
an etching protection film, at least a part of the etching protection film being in contact with the oxide semiconductor film;
an oxide film covering the gate electrode and the etching protection film, the oxide film being in contact with the oxide semiconductor film between the gate electrode and the etching protection film; and
source-drain electrodes electrically connected to the etching protection film through a through-hole of the oxide film.

(20) A method of manufacturing a semiconductor unit, the method including forming a transistor, the forming the transistor including:
  forming an oxide semiconductor film having a channel region;
  forming an etching protection film in contact with the oxide semiconductor film;
  forming a gate electrode facing the channel region of the oxide semiconductor film;
  forming an oxide film covering the gate electrode and the etching protection film, the oxide film being in contact with the oxide semiconductor film between the gate electrode and the etching protection film; and
  providing a through-hole in the oxide film and electrically connecting source-drain electrodes to the etching protection film through the through-hole.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method of manufacturing a transistor comprising:
  forming an oxide semiconductor film and a gate electrode on a substrate, the oxide semiconductor film having a channel region, and the gate electrode facing the channel region; and
  forming an insulating film covering the gate electrode and the oxide semiconductor film, wherein
  infiltration of moisture from the insulating film into the oxide semiconductor film is suppressed by the substrate.

2. The method according to claim 1, wherein the substrate is formed of glass.

3. The method according to claim 1, wherein the oxide semiconductor film is formed to be in contact with the substrate.

4. The method according to claim 1, further comprising:
  forming a metal film in contact with a region of the oxide semiconductor film other than the channel region; and
  forming a high resistance film and forming a low resistance region on the oxide semiconductor film, by carrying out a first heat treatment on the metal film.

5. The method according to claim 1, further comprising:
  forming source-drain electrodes, and electrically connecting the source-drain electrodes to the low resistance region; and
  carrying out a second heat treatment after formation of the source-drain electrodes.

6. The method according to claim 5, wherein the second heat treatment is carried out at a temperature of about 300° C. or more.

7. The method according to claim 1, wherein the substrate includes a moisture diffusion preventing film on the surface thereof.

8. The method according to claim 7, wherein the oxide semiconductor film is formed to be in contact with the diffusion preventing film.

9. The method according to claim 7, wherein the diffusion preventing film is formed on a plate-like member made of a resin material to form the substrate.

10. The method according to claim 7, wherein the diffusion preventing film includes one of a silicon oxide film, a silicon nitride film, and an aluminum oxide film.

11. A method of manufacturing a semiconductor unit, the method including forming a transistor, the forming the transistor comprising:
  forming an oxide semiconductor film having a channel region;
  forming an etching protection film in contact with the oxide semiconductor film;
  forming a gate electrode facing the channel region of the oxide semiconductor film;
  forming an oxide film covering the gate electrode and the etching protection film, the oxide film being in contact with the oxide semiconductor film between the gate electrode and the etching protection film; and
  providing a through-hole in the oxide semiconductor film and electrically connecting source-drain electrodes to the etching protection film through the through-hole.

* * * * *